United States Patent [19]

Matsugu et al.

[11] Patent Number: 5,340,992
[45] Date of Patent: Aug. 23, 1994

[54] APPARATUS AND METHOD OF DETECTING POSITIONAL RELATIONSHIP USING A WEIGHTED COEFFICIENT

[75] Inventors: Masakazu Matsugu, Machida; Minoru Yoshii, Tokyo; Naoto Abe, Isehara, all of Japan

[73] Assignee: Canon Kabushiki Kaisha, Tokyo, Japan

[21] Appl. No.: 978,524

[22] Filed: Nov. 18, 1992

Related U.S. Application Data

[63] Continuation-in-part of Ser. No. 918,803, Jul. 23, 1992, abandoned, and a continuation-in-part of Ser. No. 875,601, Apr. 28, 1992, said Ser. No. 918,803, is a continuation of Ser. No. 825,774, Jan. 21, 1992, abandoned, which is a continuation of Ser. No. 404,343, Sep. 7, 1989, abandoned, said Ser. No. 875,601, is a continuation of Ser. No. 758,398, Sep. 4, 1991, abandoned, which is a continuation of Ser. No. 625,698, Dec. 12, 1990, abandoned, which is a continuation of Ser. No. 310,625, Feb. 15, 1989, abandoned.

[30] Foreign Application Priority Data

Feb. 16, 1988 [JP] Japan .................. 63-033207
Sep. 9, 1988 [JP] Japan .................. 63-225802
Sep. 9, 1988 [JP] Japan .................. 63-225807
Sep. 9, 1988 [JP] Japan .................. 63-226010
Aug. 14, 1989 [JP] Japan .................. 1-209929

[51] Int. Cl.$^5$ .................. G01N 21/86; G01V 9/04
[52] U.S. Cl. .................. 250/548; 356/401
[58] Field of Search .................. 250/548, 557, 561; 356/399–401; 382/8, 48

[56] References Cited

U.S. PATENT DOCUMENTS

| | | | |
|---|---|---|---|
| 4,641,035 | 2/1987 | Suzuki et al. | 250/548 |
| 4,655,598 | 4/1987 | Murakami et al. | 356/401 |
| 4,668,089 | 5/1987 | Oshida et al. | 250/548 |
| 4,699,515 | 10/1987 | Tanimoto et al. | 356/401 |
| 4,771,180 | 9/1988 | Nomura | 250/548 |
| 4,780,617 | 10/1988 | Unatate et al. | 356/401 |
| 4,790,023 | 12/1988 | Matsui et al. | 382/8 |
| 4,808,002 | 2/1989 | Tojo et al. | 356/401 |
| 4,860,374 | 8/1989 | Murakami et al. | 382/8 |
| 4,894,790 | 1/1990 | Yotsuga et al. | 382/8 |
| 4,958,160 | 9/1990 | Ito et al. | 356/401 |

Primary Examiner—Edward P. Westin
Assistant Examiner—Stephone Allen
Attorney, Agent, or Firm—Fitzpatrick, Cella, Harper & Scinto

[57] ABSTRACT

A device for detecting a relative positional relationship between first and second objects is disclosed. The device includes light source for projecting light to the first and second objects; photodetecting system for detecting light from one of the first and second objects illuminated by the light source system, the photodetecting system having a light receiving surface and producing a signal corresponding to the light intensity at each point on the light receiving surface; and position detecting system for detecting the relative position of the first and second objects, on the basis of signals from the photodetecting system, wherein the position detecting system is arranged to adjust signals corresponding to different points on the light receiving surface of the photodetecting system, by using different weight coefficients and to detect the relative position of the first and second objects on the basis of the adjusted signals.

24 Claims, 49 Drawing Sheets

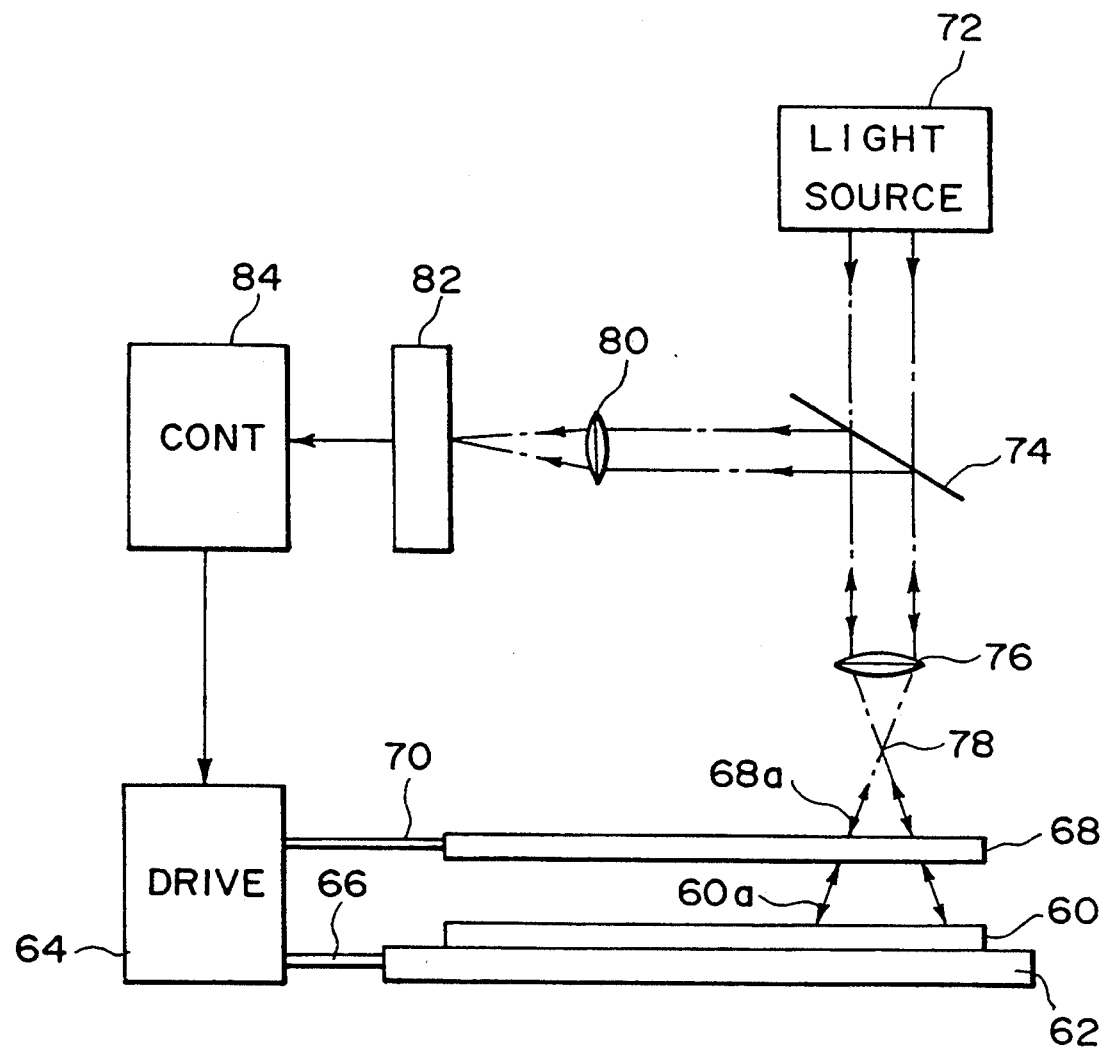
F I G. 1

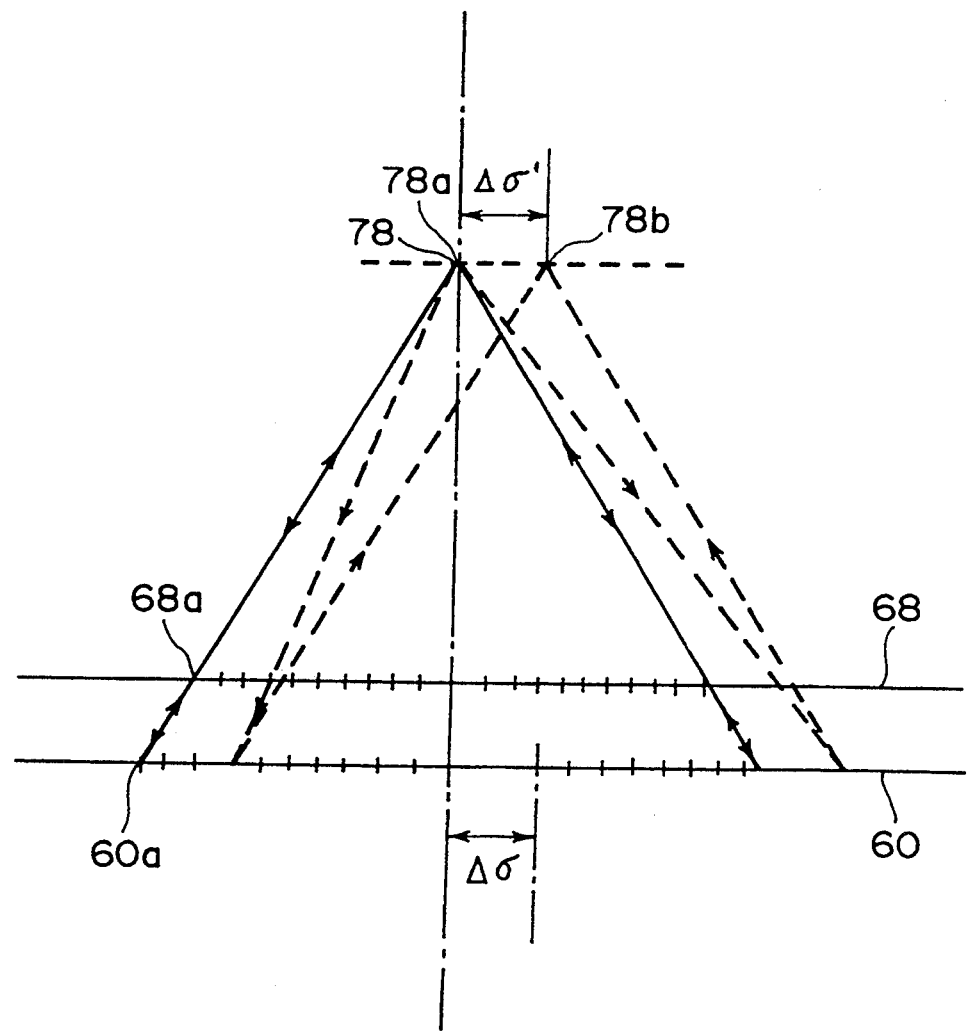
F I G. 2

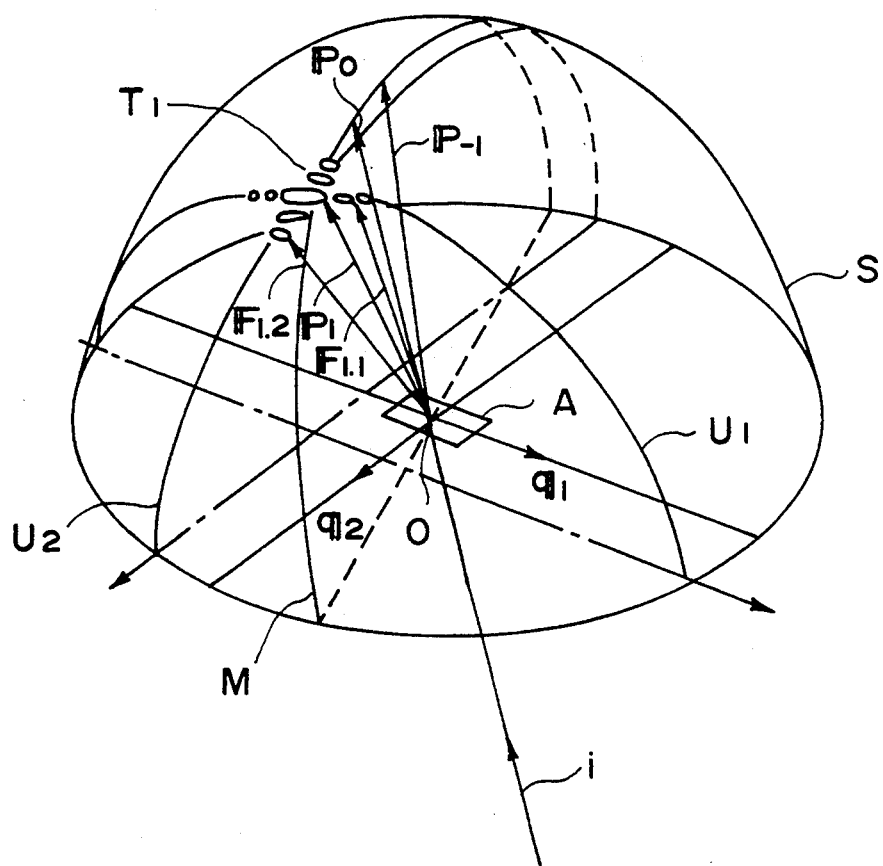
F I G. 4

APERTURE SHAPE

APERTURE SHAPE

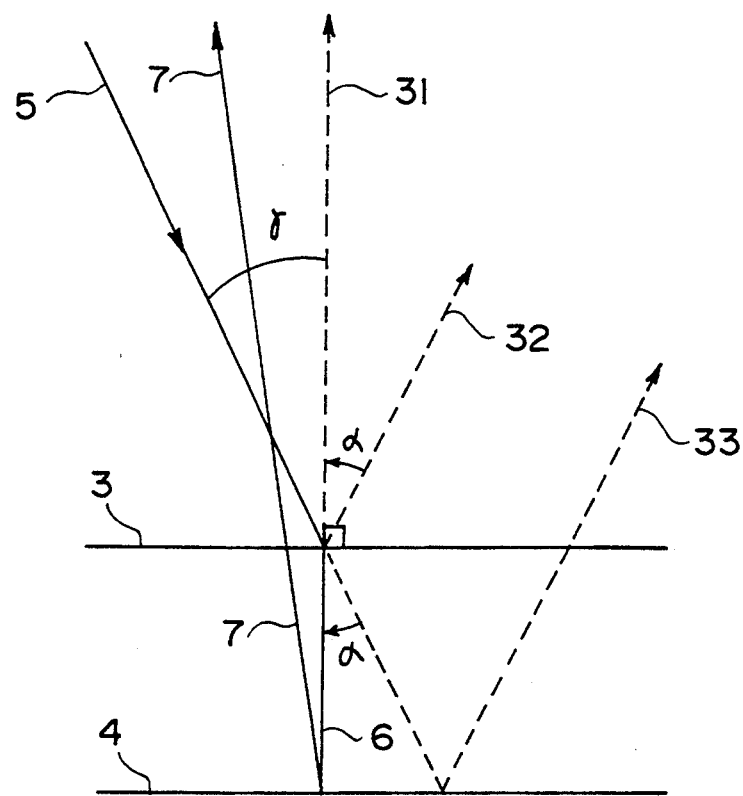
F I G. 9
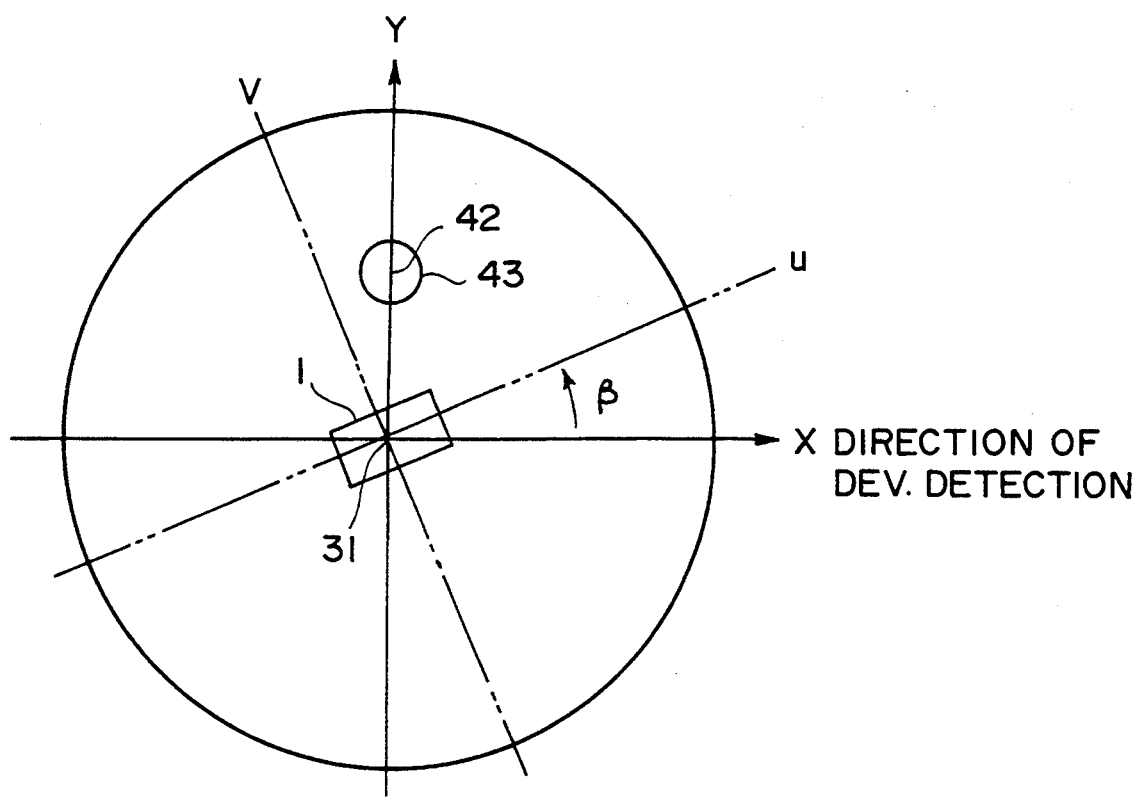
F I G. 10

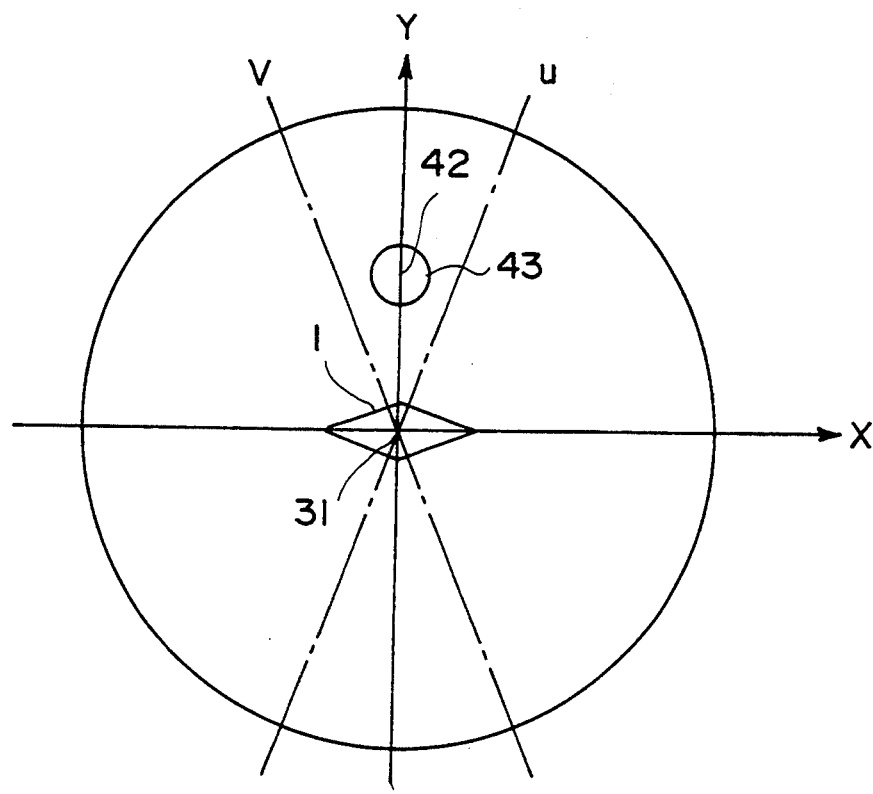
F I G. 11
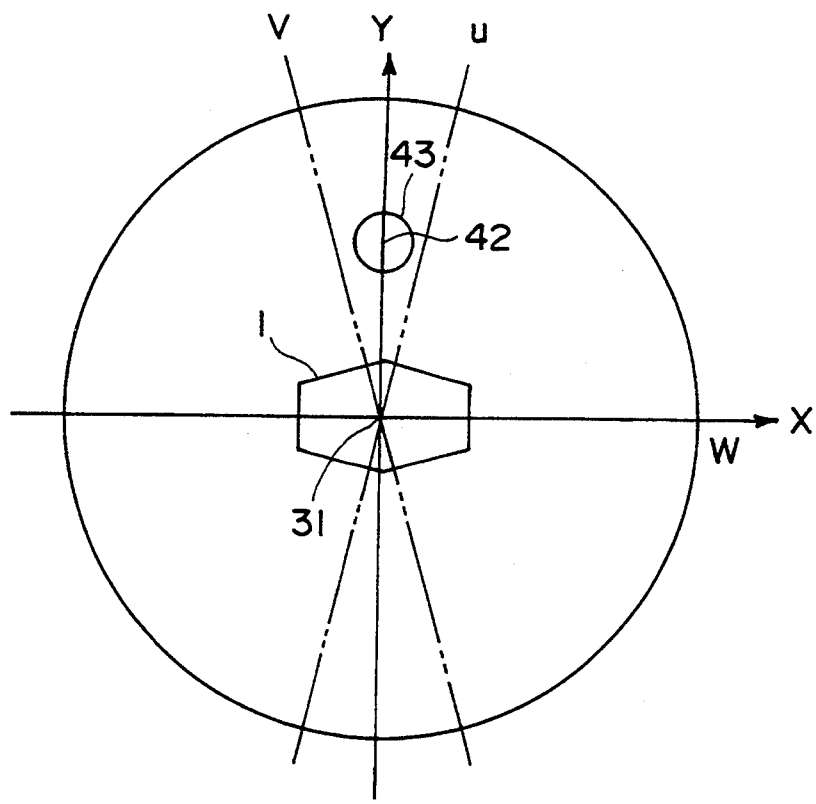
F I G. 12

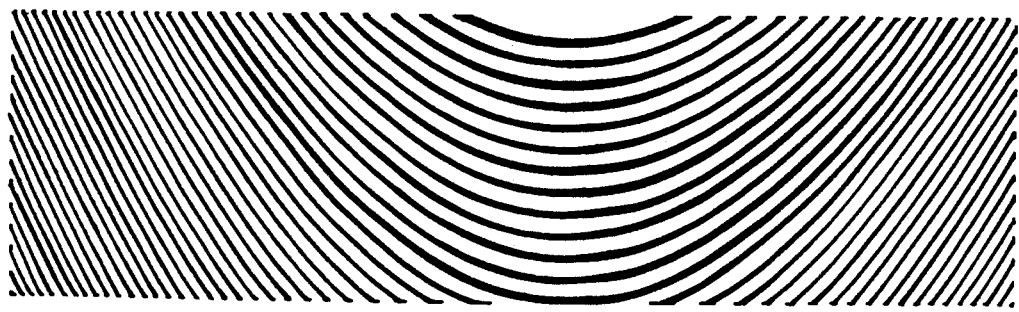
FIG. 15
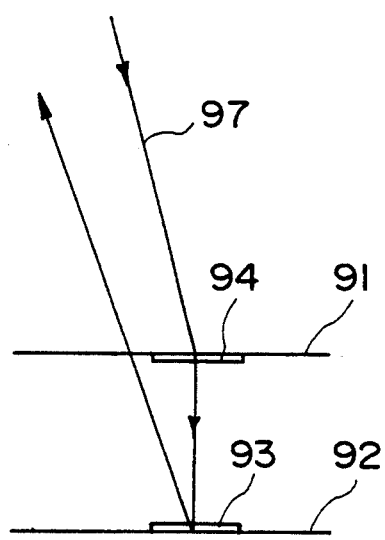
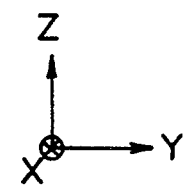
FIG. 16A
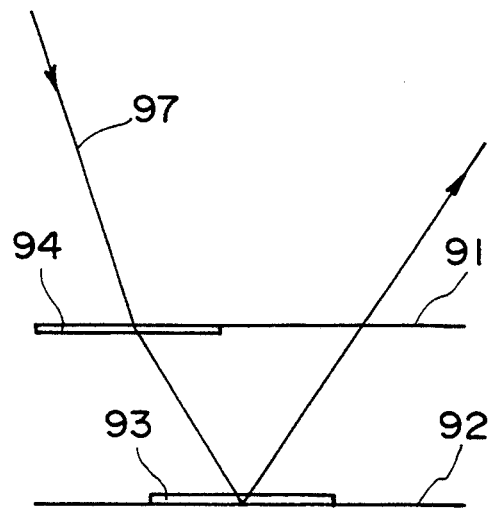
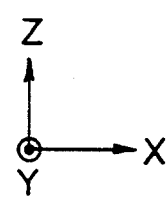
FIG. 16B

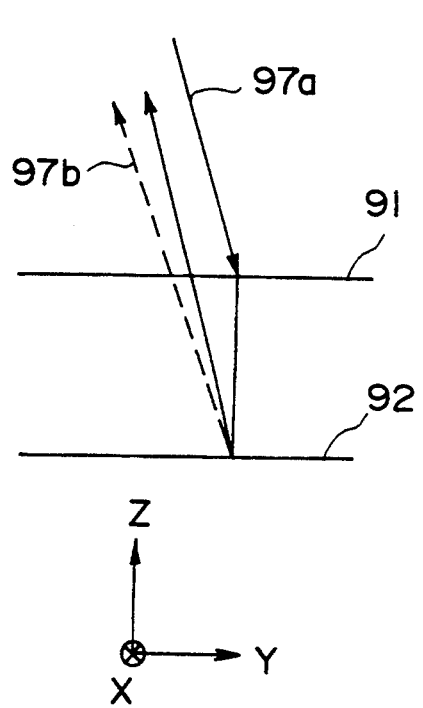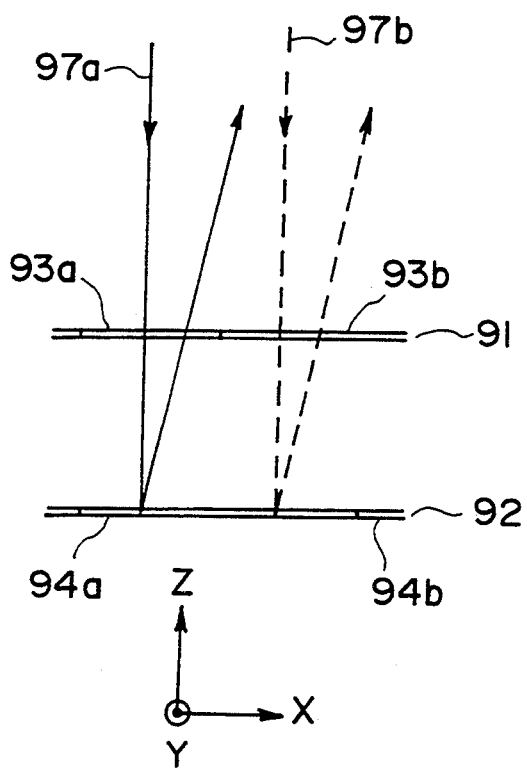
FIG. 18A
FIG. 18B
→ PATH OF SIG. LIGHT
--→ PATH OF REF. LIGHT

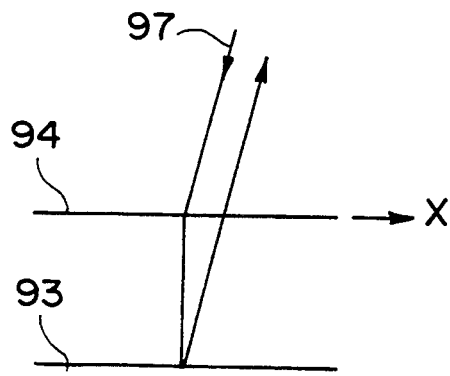
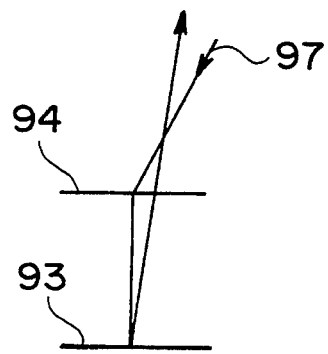
FIG. 19A          FIG. 19B
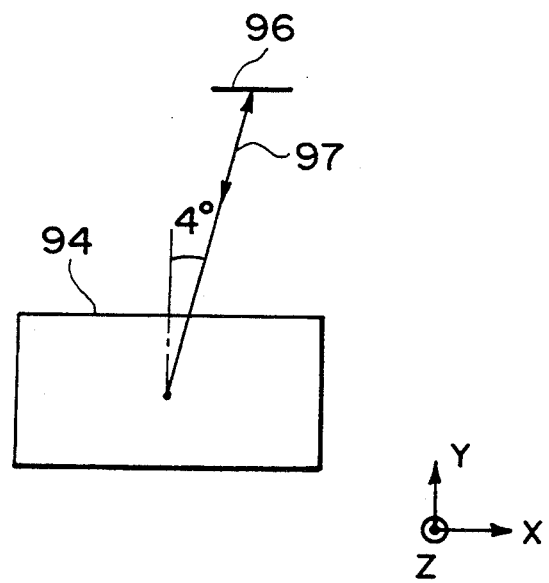
FIG. 19C

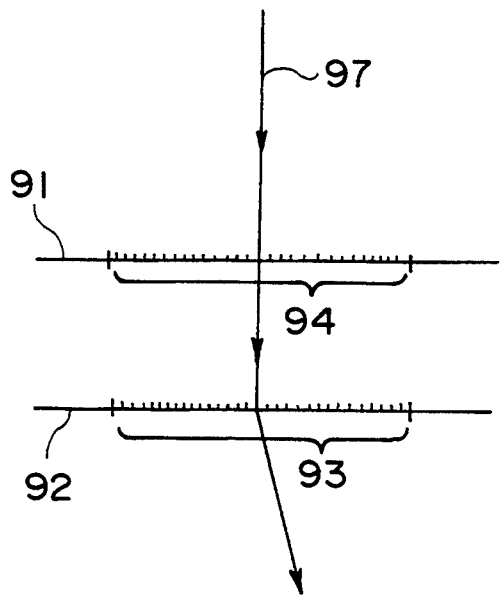 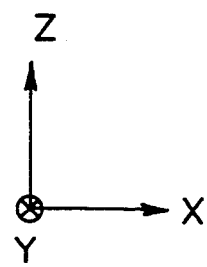
FIG. 21A
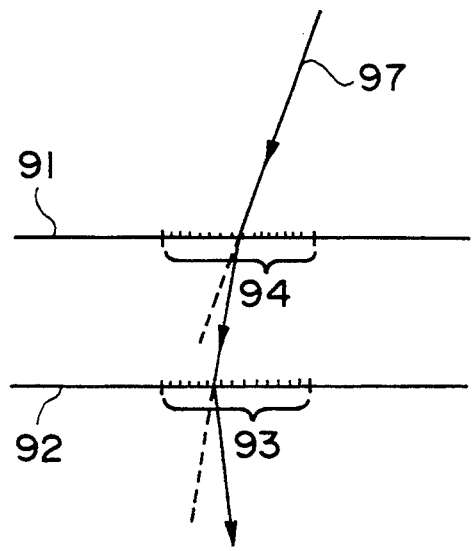 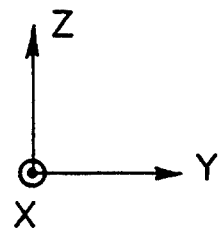
FIG. 21B

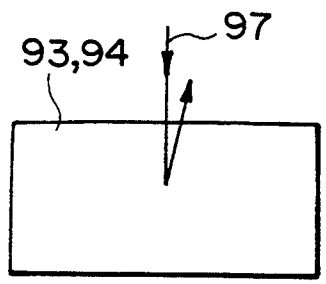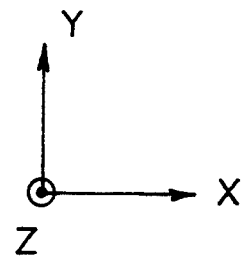
FIG. 21C
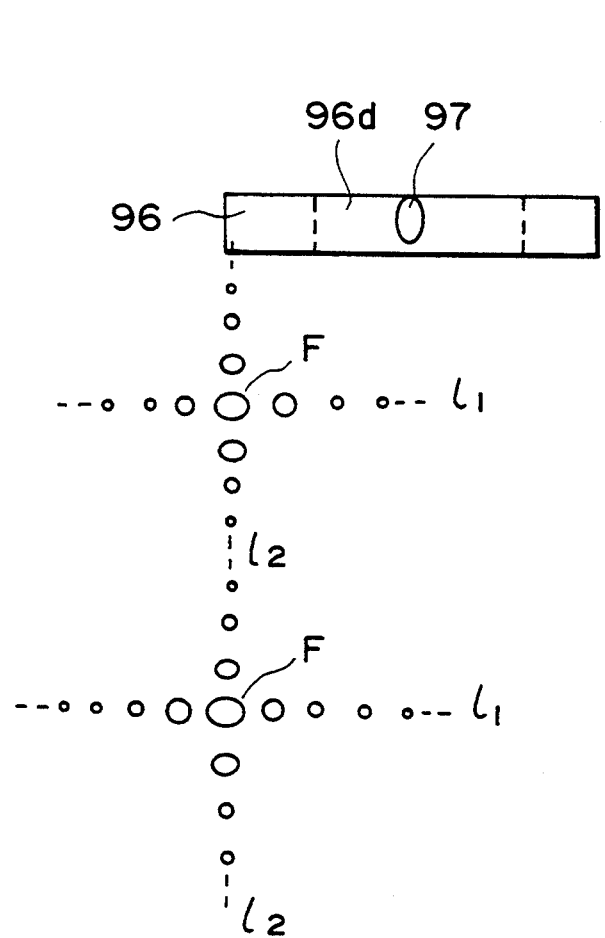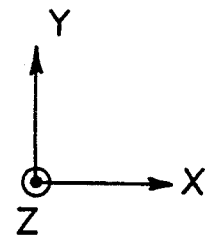
FIG. 21D

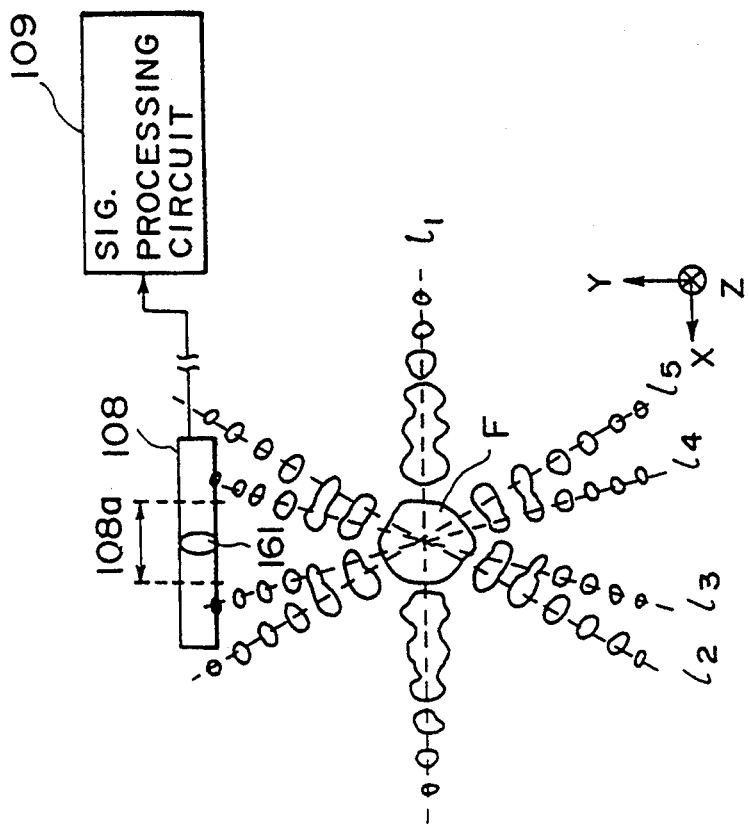
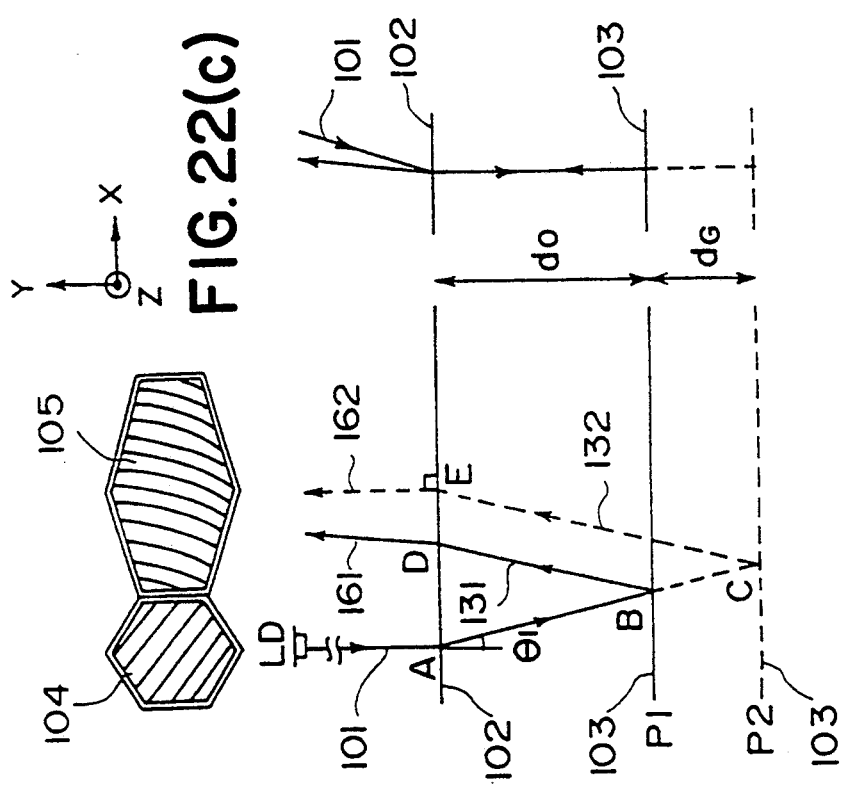

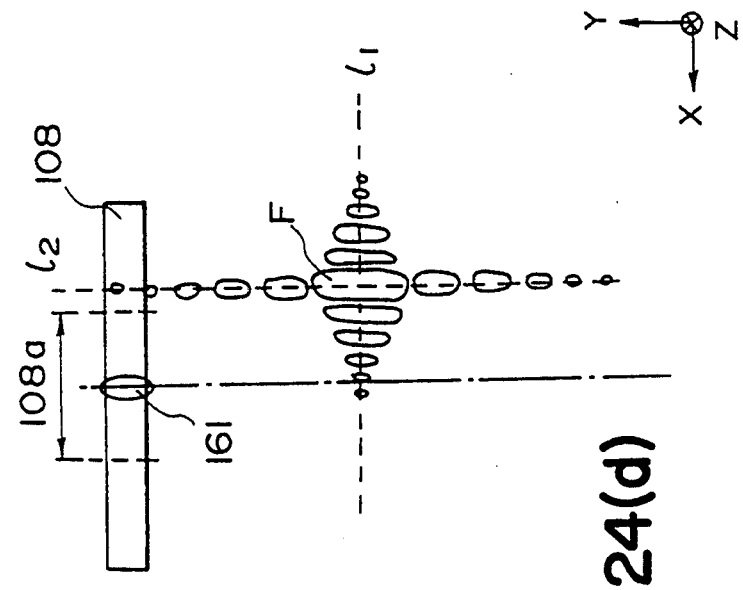
FIG. 24(d)
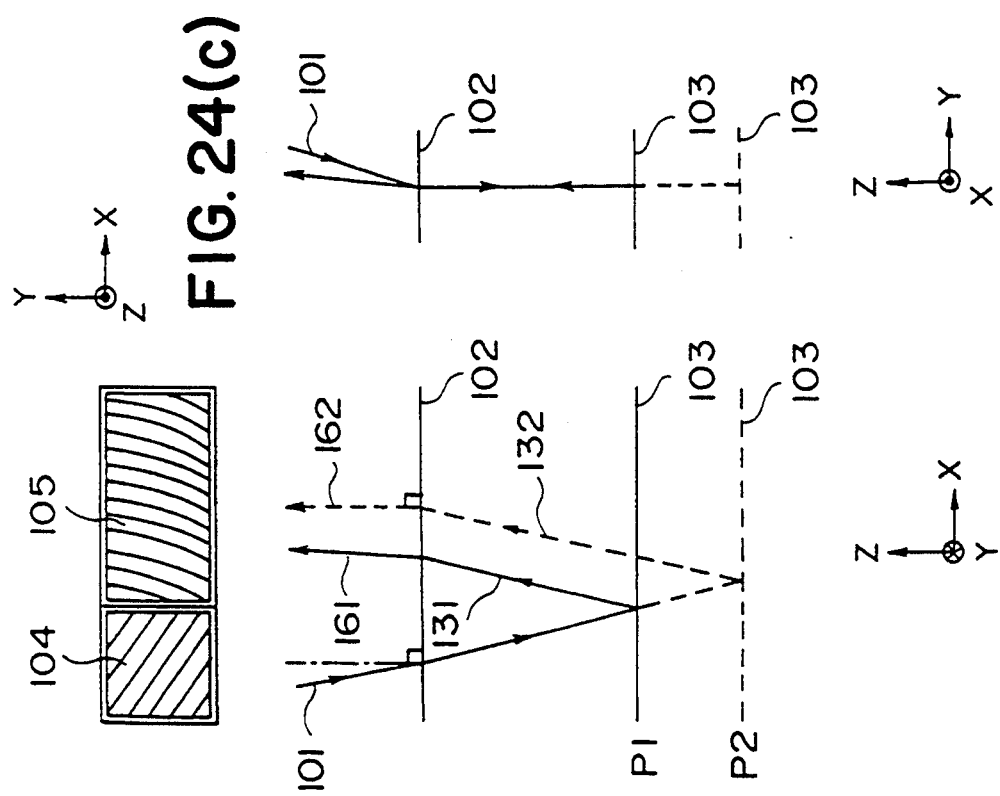
FIG. 24(c)
FIG. 24(b)
FIG. 24(a)

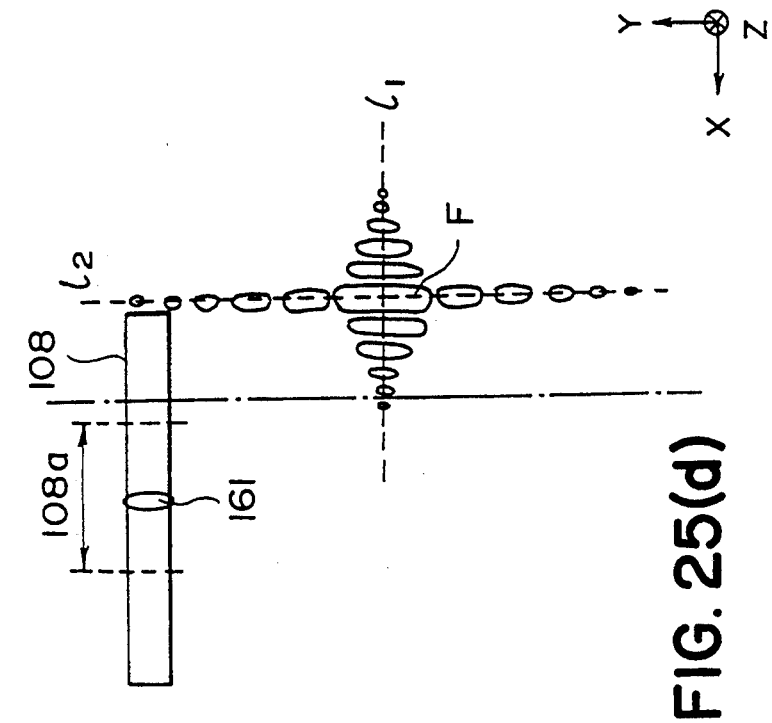
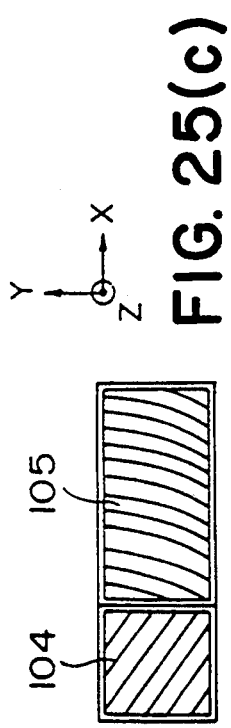
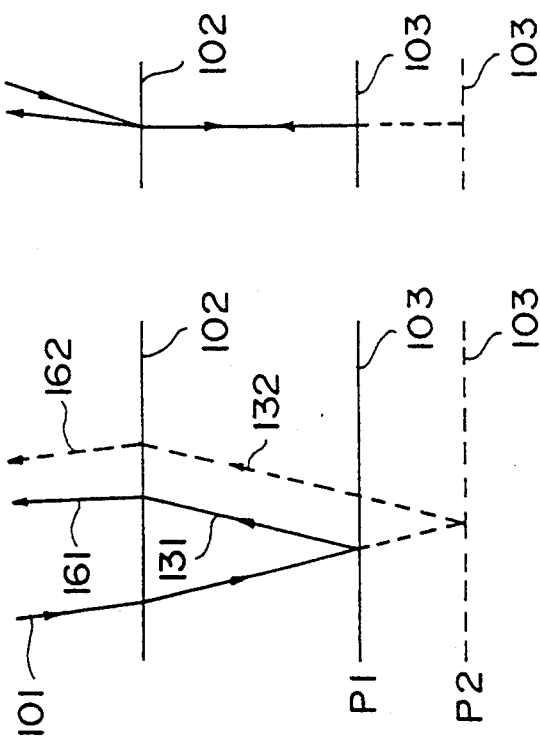
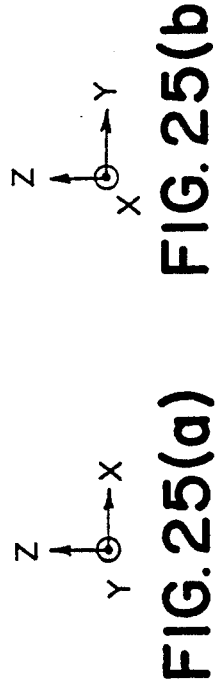
FIG. 25(c)
FIG. 25(d)
FIG. 25(a)
FIG. 25(b)

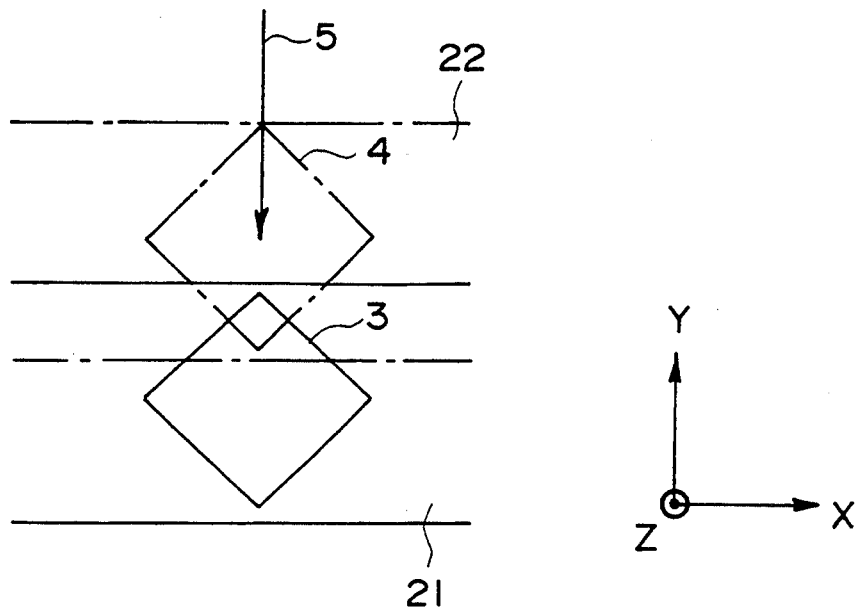
F I G. 26C
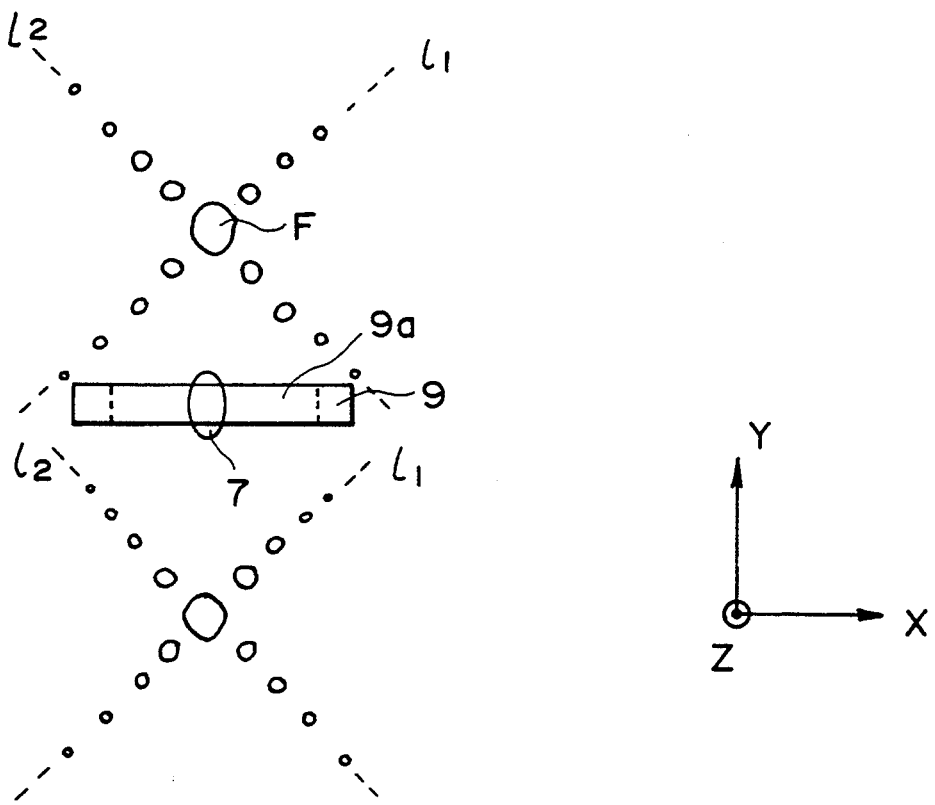
F I G. 26D

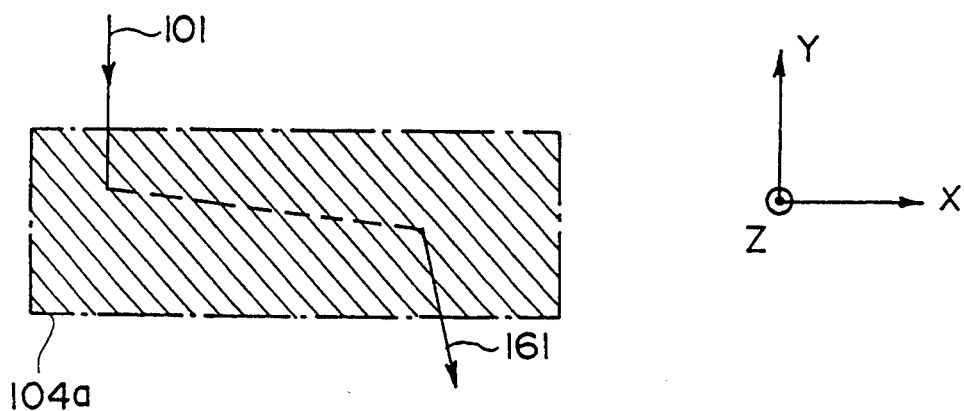
FIG. 27C
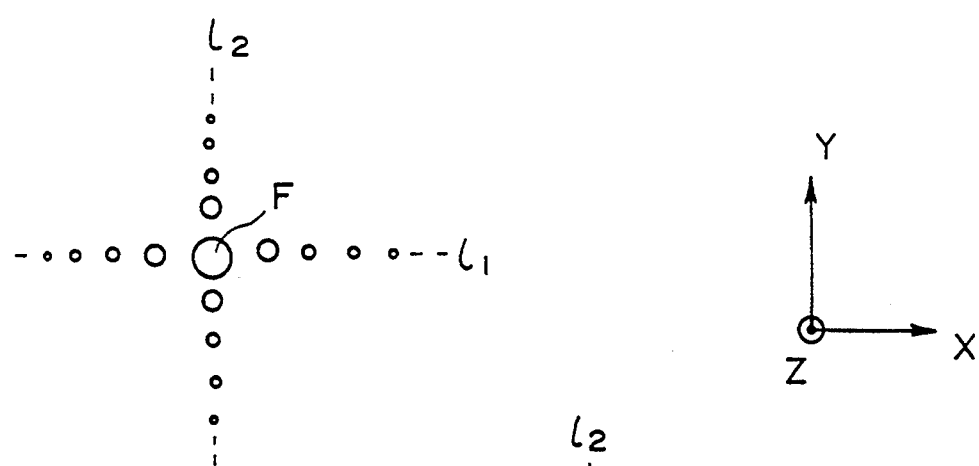
FIG. 27D₁
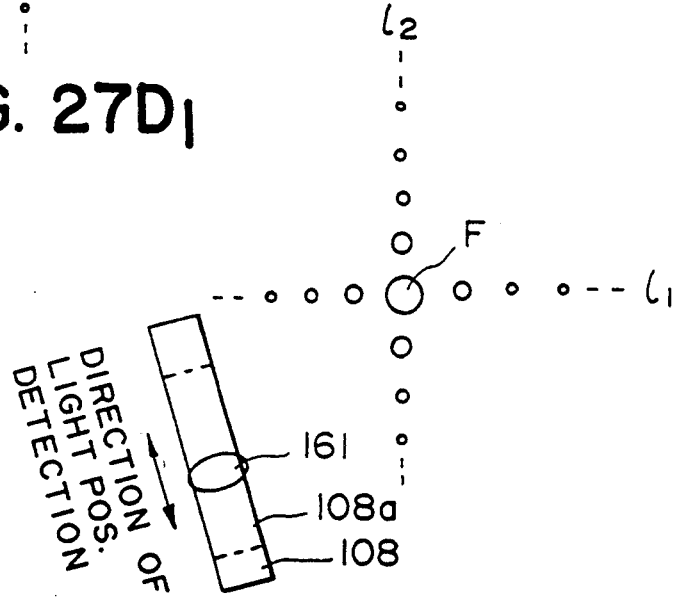
FIG. 27D₂

→ X

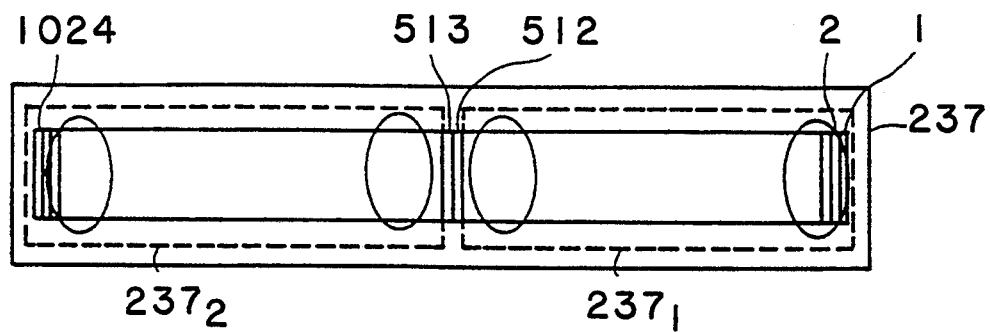
FIG. 38
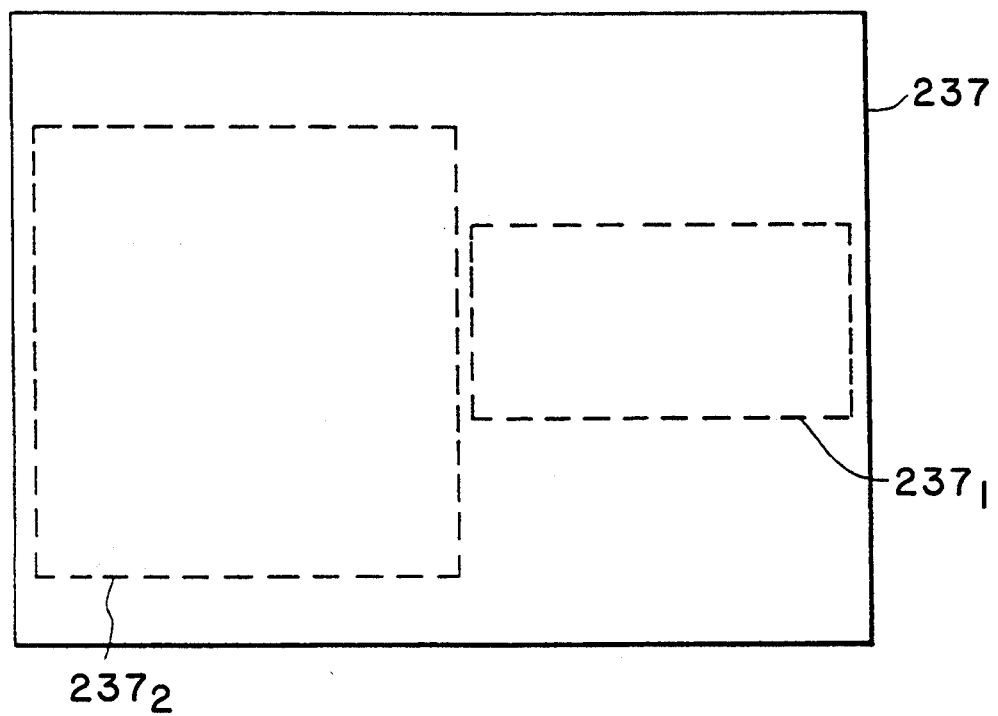
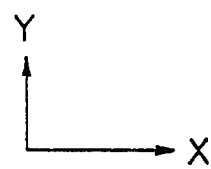
FIG. 39

APPARATUS AND METHOD OF DETECTING POSITIONAL RELATIONSHIP USING A WEIGHTED COEFFICIENT

The subject application is a continuation-in-part of copending application Ser. No. 07/918,803 filed Jul. 23, 1992, now abandoned which is a continuation of prior application Ser. No. 07/825,774 filed Jan. 21, 1992, which application is a continuation of prior application, Ser. No. 07/404,343 filed Sept. 7, 1989, both now abandoned, and of copending application Ser. No. 07/875,601 filed Apr. 28, 1992, which application is a continuation of prior application Ser. No. 07/758,398 filed Sept. 4, 1991, which application is a continuation of prior application Ser. No. 07/625,698 filed Dec. 12, 1990, which application is a continuation of prior application Ser. No. 07/310,625 filed Feb. 15, 1989, all three now abandoned.

FIELD OF THE INVENTION AND RELATED ART

This invention relates generally to an alignment system for correctly positioning an object. More particularly, the invention is concerned with position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor in respect to ensuring improved performance. Particularly, as for alignment systems employed in recent exposure apparatuses, submicron alignment accuracies or more strict accuracies are required in consideration of the demand for higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,037,969 and Japanese Laid-Open Patent Application, Laid-Open No. Sho 56-157033 wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

In the alignment system shown in FIG. 2, for detection of any relative positional deviation, the lights from the zone plates provided on the mask and the wafer are imaged, independently of each other, upon a predetermined plane on which the evaluation is to be made, and any positional error of each imaging point from a reference position is detected.

SUMMARY OF THE INVENTION

The inventors of the subject application have found a specific problem peculiar to such an alignment method. Namely, a diffraction grating such as a Fresnel zone plate is used as an alignment pattern for the position detection, there is produced a Fraunhofer image (side lobe) around a signal light in accordance with the peripheral shape (aperture shape) of the used diffraction grating. There is a high possibility that such a side lobe is mixed into the signal light and is incident on a light receiving sensor provided for the position detection, and therefore, it leads to an error in the detection of a focus point upon the light receiving sensor. If this occurs, the measurement precision is deteriorated disadvantageously.

It is accordingly a primary object of the present invention to provide a position detecting method and apparatus by which the effect of unwanted light can be avoided to ensure signal light processing with a high signal-to-noise ratio, and thereby to ensure high-precision detection of the position of an object.

It is an object of the present invention to provide a position detecting method and apparatus which is arranged to avoid entry of any Fraunhofer diffraction image into a light receiving means provided to detect a light that bears correct positional information concerning an article whose position is to be detected, to thereby ensure high-precision position detection on the basis of detected information.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1 and 2 illustrate a known type position detecting device.

FIGS. 3A, 3B and 4 are schematic representations for explicating Fraunhofer diffraction vectors.

FIG. 9 is an explanatory view, showing the optical action of alignment patterns used in the first embodiment, the action being illustrated as such as viewed in the direction in which the position detection is made.

FIG. 10 is a schematic view showing the relationship between a Fraunhofer diffraction image and an entrance pupil of a light receiving system, as viewed from the above of a mask portion used in the first embodiment.

FIG. 11 is a schematic view showing a Fraunhofer diffraction image, produced in a second embodiment of the present invention.

FIG. 12 is a schematic view showing a Fraunhofer diffraction image produced in a third embodiment of the present invention.

FIG. 15 shows a pattern of a mark which is an example of a grating element provided in a portion of a mask, usable in the fourth embodiment of the present invention.

FIGS. 16A and 16B are schematic representations showing a major portion of a fifth embodiment of the present invention.

FIGS. 18A and 18B are schematic views showing a major portion of a sixth embodiment of the present invention.

FIGS. 19A-19D are schematic views, respectively, for explicating a major portion of a seventh embodiment of the present invention.

FIGS. 21A-21D are schematic representations, respectively, for explicating a major portion of a ninth embodiment of the present invention.

FIG. 22A-22D are explanatory views of a major portion of a tenth embodiment of the present invention.

FIG. 24A-24D are explanatory views of a major portion of a twelfth embodiment of the present invention.

FIG. 25A-25D are explanatory views of a major portion of a thirteenth embodiment of the present invention.

FIGS. 26A-26D are schematic representations, respectively, for explicating a major portion of a fourteenth embodiment of the present invention.

FIGS. 27A-27D are schematic representations, respectively, explicating a major portion of a fifteenth embodiment of the present invention.

FIG. 38 is a schematic representation, illustrating the processing range of a sensor in accordance with another example of data processing, to be made in the seventeenth embodiment.

FIG. 39 is a schematic representation, illustrating the processing range of a sensor in accordance with a further example of data processing to be made in the seventeenth embodiment.

DESCRIPTION OF THE PREFERRED EMBODIMENTS

Briefly, in accordance with one aspect of the present invention, at least one of a first and second objects is provided with one or more diffraction gratings such as, for example, a Fresnel zone plate, a grating element formed by rectilinear patterns of regular intervals, etc. Such a light as having been diffracted, at least twice, by such a diffraction grating is used as a signal light. Signal detecting portion for receiving such a signal light is provided at a specific position to evade an unwanted diffraction light produced by one or more diffraction gratings. Thus, it is possible to avoid or reduce an error in the detected information, whereby high-precision positional error measurement (i.e. detection of the amount of positional deviation, the direction of positional deviation, and the like) is ensured.

More particularly, in some embodiments which will be described below, a light detecting portion is disposed at a site which is outside a plane in which Fraunhofer diffraction vectors lie.

Referring now to FIG. 3, the Fraunhofer diffraction vectors will be explained in detail. The Fraunhofer diffraction vectors are the vectors of a Fraunhofer diffraction image as produced when light is projected upon a diffraction grating having a predetermined aperture shape, the vectors being taken with respect to the direction of emission from the diffraction grating.

Assuming now that a diffraction grating is formed at an aperture having a finite number of vertexes and considering a spherical surface S (hereinafter "observation spherical surface") which has an origin at the center coordinate of the diffraction grating and which has a sufficiently large radius r as compared with the size of the aperture, as the Fraunhofer diffraction vectors, those vectors F which intersect upon the spherical surface with a center line or lines (which will be described later) of a Fraunhofer diffraction light distribution as observed on this spherical surface, are defined.

Figure 3A:
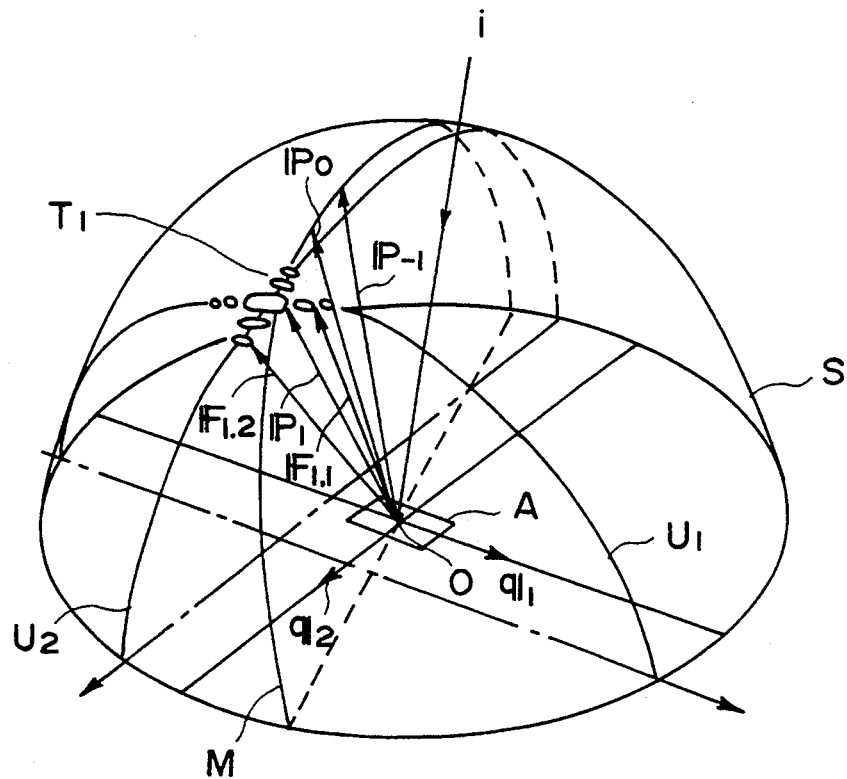

In FIG. 3A, A denotes an aperture (for example, a rectangular aperture): O denotes an origin: i denotes light incident upon the diffraction grating: M denotes a plane in which a chief ray vector of reflectively diffracted light, which may be represented as the orientation of the center of Fraunhofer main lobe that is the center of diffraction lights of different orders, lie; $P_0$ denotes a chief ray vector of a zero-th order diffraction light (reflected light); $\mathbf{p}_1$ is a chief ray vector of a first order diffraction light: $P_{-1}$ denotes a chief ray vector of a negative first order diffraction light. For convenience, only the diffraction lights of the positive and negative first orders are illustrated. $T_1$ denotes such a region where those of distributed patterns of a first order Fraunhofer diffraction image in which intensity concentration occurs are formed. For convenience, only the first order Fraunhofer diffraction image is illustrated. Definition of $q_1$ and $q_2$ will be made later.

FIG. 4 is similar to FIG. 3 but it represents a transmissively diffracted light distribution whose parameters are defined similarly.

Generally, it is expected that the intensity distribution of Fraunhofer diffraction light, which is produced by projecting light upon a diffraction grating formed at an aperture having a finite number of vertexes, is such distribution in which intensity concentration appears in a particular direction or directions (i.e. a distribution having an expansion of side lobe having a center at a so-called Fraunhofer main lobe. In this Specification, such a straight line which passes the center of a Fraunhofer main lobe of a diffraction image and which has a vector in such particular direction, is referred to as a "center line" of the Fraunhofer diffraction image.

For a particular aperture shape, a particular center line or lines of its Fraunhofer diffraction image are determined. Upon the observation spherical surface, the center line is the line of intersection between that spherical surface and a particular plane (which will be described later) as determined unchangeably by the aperture shape. The peak of intensity distribution of the Fraunhofer diffraction light lies on this curved line. Considering a first order reflective Fraunhofer diffraction light and where the aperture is defined by straight sides $a_1, a_2, \ldots$ and $a_m$ ($m < \infty$) of a number m, for a side $a_i$ ($i=1, 2, \ldots, m$) one center line $l_i$ is defined. If such a center line $l_1$ is projected upon a plane of the mark in which the aperture is defined (a tangential plane contacting at the original when the aperture is set in a curved surface), the projected is a straight line which is parallel to a normal to the side $a_i$ as defined within the mark plane. If, however, two sides in each of n sets of the straight sides of the number m are parallel, there are center lines of a number m-n.

Figure 5A:
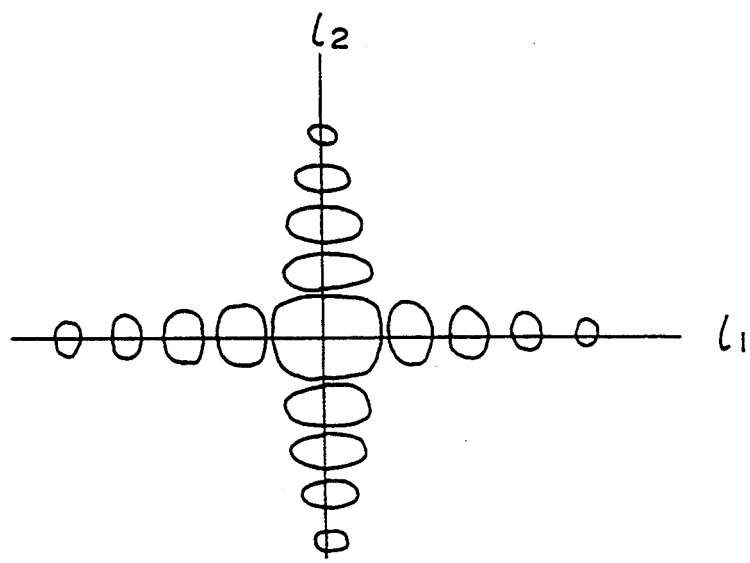
FIGS. 5A, 5B, 6A and 6B are schematic representations for explicating the interrelationship between the aperture shape of a diffraction grating and a Fraunhofer diffraction image.
Figure 5B:

As regards a distribution of Fraunhofer diffraction light of a predetermined order or orders produced by a diffraction grating having a rectangular aperture shape as shown in FIG. 5, there are defined two center lines because, of four normals to the four sides, two normals of each of two sets are parallel to each other. The directions of projection components upon the mark plane of these center lines correspond to the directions of respective normals.

For each diffraction order of the light diffracted by a diffraction grating, there is produced a particular Fraunhofer diffraction pattern. The number and directions of center lines of a Fraunhofer diffraction pattern of each diffraction order are determined not by the diffraction order but by the aperture shape only. However, the position of the center of the Fraunhofer diffraction pattern of each diffraction order is given by the point of intersection, with the observation spherical surface, of a chief ray of the light of a corresponding diffraction order which light is produced as a result of transmissive or reflective diffraction of a chief ray of an incident light.

Figure 3B:
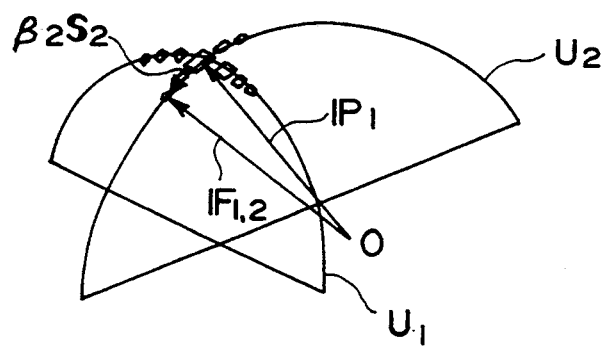

Thus, an i-th order Fraunhofer diffraction vector $\mathbb{F}_{i,j}$ (j=1, 2, .., m) provided by a diffraction grating of such aperture shape as having straight sides of a number m, is given by:

$$\mathbb{F}_{i,j} = \mathbb{P}_i + \beta_j \mathbf{s}_j$$

$$|\mathbb{F}_{i,j}| = r \cdot |\mathbb{P}_i| = r$$

where $\beta_j$ is a real number and r is a radius of the observation spherical surface and it lies on a plane defined by $P_i$ and $s_j$ (as an example, the relationship between $\mathbb{F}_{1,2}$, $s_2$ and $\mathbb{P}_1$ is illustrated in FIG. 3B) wherein $\mathbb{P}_i$ denotes a chief ray vector of first order diffraction light and $s_j$ denotes a unit vector which is parallel to the vector $q_j$ of normal (in the mark plane) defined to the j-th straight side of the aperture by the mark plane projection component and which is given by:

$$s_j = \beta_{j,1} \cdot q_j + \beta_{j,2} \cdot \mathbf{z}$$

( is unit vector of normal to mark plane).

The direction of the vector $\mathbb{P}_i$ differs, depending on whether the diffraction is reflective diffraction or transmissive diffraction. In FIG. 3A, the plane $U_1$ in which the vector $\mathbb{F}_{1,1}$ lies contains vectors $\mathbb{P}_1$ and $s_1$, while the plane $U_2$ in which the vector $\mathbb{F}_{1,2}$ lies contains the vectors $\mathbb{P}_1$ and $s_2$. The lines of intersection of these planes $U_1$ and $U_1$ with the mark plane are parallel to the vectors $q_1$ and $q_2$, respectively.

Similarly, for such an aperture as having straight sides of a number m in which the sides of each of n sets are parallel to each other, the i-th order Fraunhofer diffraction vectors lie in planes of a number m-n, such that planes $U_1$, $U_2$,... and $U_{m-n}$ are defined. The lines of intersections of respective planes with the mark plane are parallel to the vectors $q_1$, $q_2$,... and $q_{m-n}$, respectively.

Figure 6A:
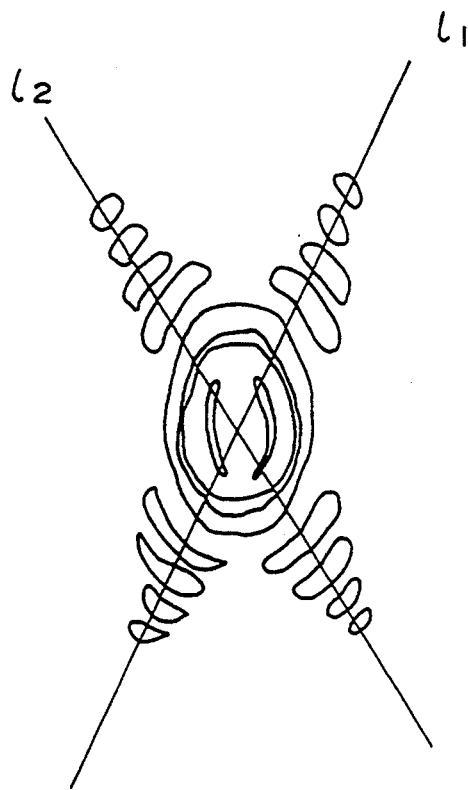
Figure 6B:
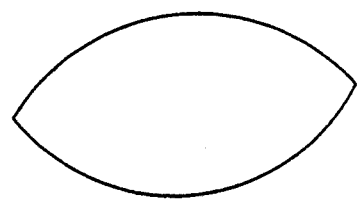

On the other hand, it is expected that, where a diffraction grating is formed in such an aperture as having curved sides and a finite number of vertexes and when light is projected upon this diffraction grating, the intensity distribution of a produced Fraunhofer diffraction light has intensity concentration in a particular direction or directions. If, for example, the aperture has a shape as defined by two arcuations, a produced Fraunhofer diffraction image will be such as illustrated in FIG. 6 (as discussed in "Wave Optics", page 268, Hiroshi Kubota, published by Iwanami Shoten, Japan). In that case, the aperture is shaped by two curved sides and the produced Fraunhofer diffraction image includes intensity concentration in two directions.

For an arbitrary aperture having a finite number of vertexes, the direction of such intensity concentration can be detected from a pattern which is obtainable by Fourier conversion of the aperture shape. Therefore, if the directions in which the intensity concentration occurs can be determined in preparation by calculation of a Fourier conversion image of the aperture, selection may be made to them in accordance with the priority of higher degree of intensity concentration, to determine vectors corresponding to $s_j$ in the aforementioned equation and the Fraunhofer diffraction vectors may be determined in accordance with these equations.

Some embodied forms of the present invention will now be explained.

Figure 7:
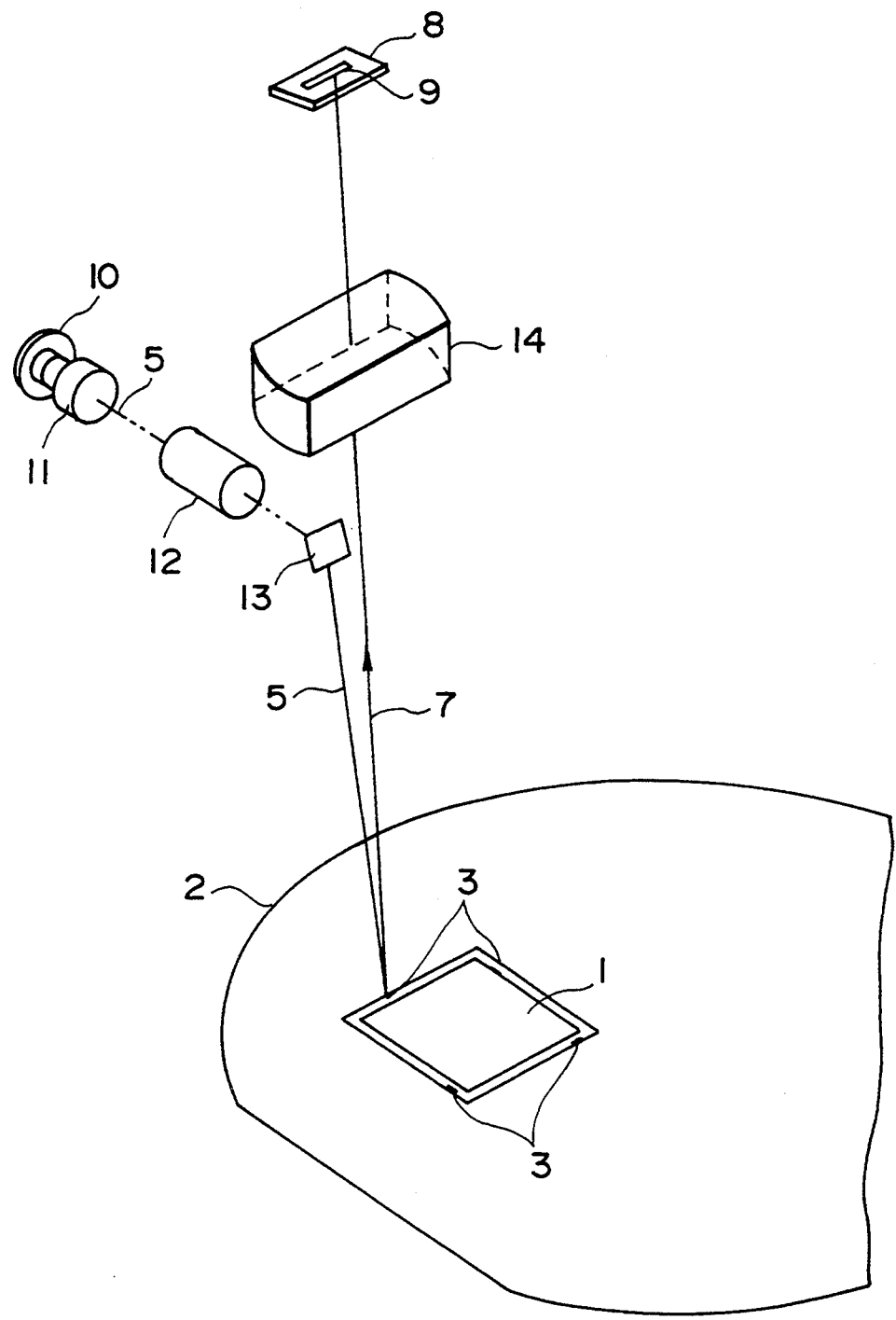
FIG. 7 is a schematic view showing a major portion of a first embodiment of the present invention.

FIG. 7 is a schematic view of a first embodiment of the present invention, wherein the invention is applied to an alignment system in a semiconductor device manufacturing exposure apparatus. FIG. 8 is an enlarged view of a portion of the FIG. 7 embodiment.

In this embodiment, light emanating from a light source 10 passes through a collimator lens 11 and then is projected by a light projecting lens system 12 so that, after being reflected by a reflecting mirror 13, the light is projected at an incline upon a first physical optic element 3 (grating lens or an element effective to convert the wave surface of light) having an oblong peripheral configuration which is provided in a portion of a first object 1 (in this embodiment, a mask having a pattern to be transferred onto a wafer). The first physical optic element 3 may comprise an amplitude type or phase type zone plate, for example.

The first physical optic element 3 has a light collecting function so that the light emanating therefrom is focused at a point of a predetermined distance from the first physical optic element 3. The light divergently advancing from that point is projected upon a second physical optic element 4 (grating lens) which is provided in a portion of a second object 2 (in this example, a wafer onto which a pattern is to be transferred) disposed at a predetermined distance from the focus point. The second physical optic element 4 may comprise a phase type or amplitude type zone plate, for example. Like the first physical optic element 3, the second physical optic element 4 has a light collecting function. The light emanating from the second physical optic element 4 passes through the first physical optic element 3 and, then, it is converged by a condensing lens 14 upon a detection surface 9 of a detector 8. Thus, the optical arrangement of this embodiment provides what can be called a "convex-convex system" including two elements each having a convex lens function.

Namely, in this embodiment, a point of convergence (diffraction image) is formed by the first physical optic element and the light emanating from such a first diffraction image is converged by the second physical optic element, such that the diffraction image is re-imaged.

Figure 8A:
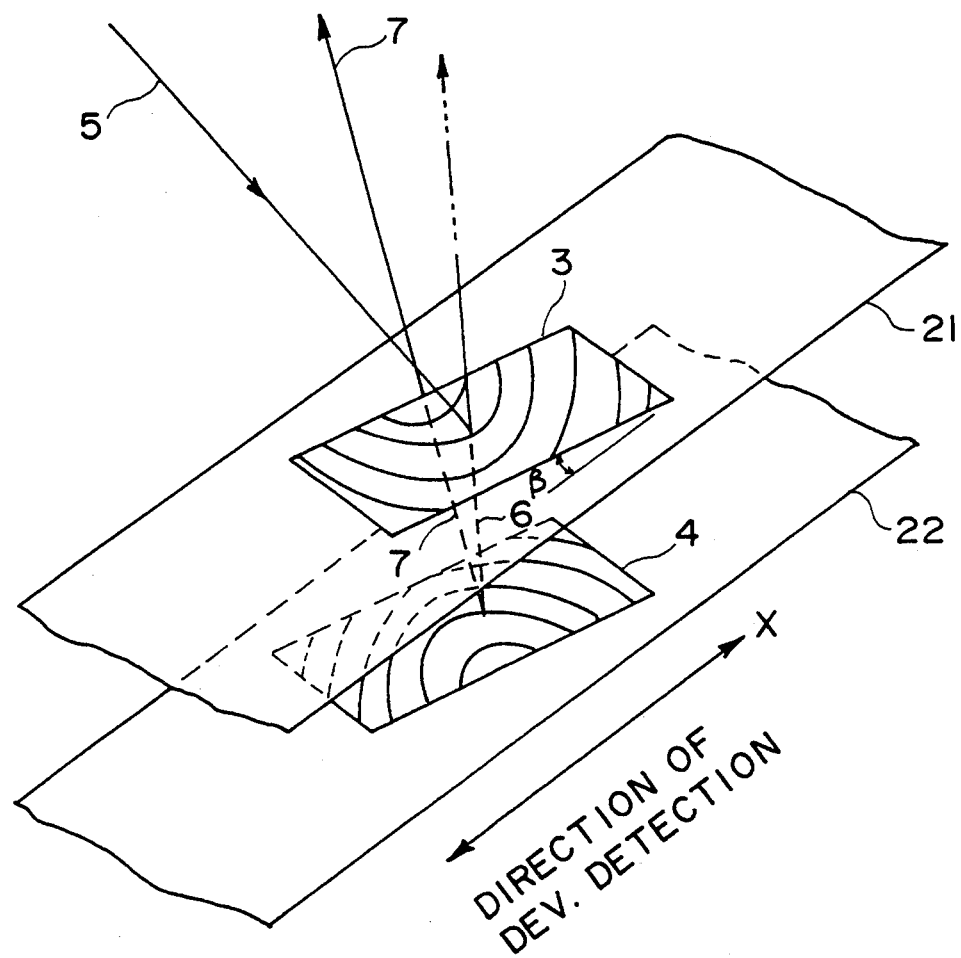
FIG. 8A is a schematic view showing optical paths defined in the neighborhood of a first and second objects, when the first embodiment is used.

Referring to FIG. 8A, the first and second objects 1 and 2 with respect to which any relative positional deviation therebetween is to be evaluated, are provided with first and second physical optic elements 3 and 4 each having an oblong peripheral configuration. Each of the first and second physical optic elements 3 and 4 are provided inclinedly with an angle $\beta$ with respect to a corresponding scribe line 21 or 22. Light 5 is projected upon the first physical optic element 3 and is diffracted thereby. The diffraction light 6 emanating from the first physical optic element 3 is projected upon the second physical optic element 4 and is diffracted again by it. The diffraction light 7 emanating from the second physical optic element 4 passes through the first physical optic element 3 and, then, it is converged upon the detection surface 9 of a detector 8 which may comprise a CCD sensor, a position sensor or otherwise.

If, at this time, there is a relative positional deviation $\Delta\sigma$ between the first and second objects, there occurs a shift $\Delta\delta$ of the center of gravity of light incident upon the detection surface 9, of an amount corresponding to the positional deviation $\Delta\sigma$.

More specifically, if the mask and the wafer displaces relatively to each other, there occurs misalignment between axes of the first and second physical optic elements 3 and 4. In that occasion, the position of incidence upon the physical optic element 4 of the chief ray of the light emanating from the grating lens 3 changes with the relative displacement of the mask and the wafer, such that the angle of emission of the light from the element 4 changes accordingly. As a result, the position of convergence of the light upon the detection surface 5 (sensor) shifts by a certain amount which is proportional to the amount of relative displacement of the mask and the wafer.

If a mask 1 and a wafer 2 is deviated from each other by $\Delta\sigma$ in a horizontal direction and where the distance to the wafer 2 from the point of convergence of the light diffracted by a physical optic element 3 of the mask 2 is denoted by a and the distance from the wafer 2 to the point of convergence of the light diffracted by the physical optic element 4 of the wafer 2 is denoted by b, then the amount of shift ($\Delta\delta$) of the center of gravity of the light on the detection surface 9 is given by:

$$\Delta\delta = \Delta\sigma \times (b/a+1) \quad (a)$$

Namely, the shift $\Delta\delta$ has been enlarged by a magnification $\beta=(b/a+1)$.

Thus, by detecting $\Delta\delta$, it is possible to detect the relative deviation of the mask and the wafer in accordance with equation (a).

In this example, the position on the detecting surface 9 of the center of gravity of light as assumed when the mask and wafer have no positional error may be used as a reference, and the deviation $\Delta\delta$ of the light upon the detecting surface 9 is detected to thereby determine the relative positional deviation $\Delta\sigma$ of the mask and wafer 1 and 2.

The reference position described above can be predetermined. For example, where the first and second objects are a mask and a wafer to be used within a proximity type exposure apparatus 3 and 4, respectively, first the mask having the first physical optic element 3 is held fixed at a suitable position. Then, the wafer having the second physical optic element 4 is placed and roughly aligned with respect to the mask by using suitable means. Thereafter, light is projected upon the first and second physical optic elements, and the position of the center of gravity of light upon the detecting surface 9 in that state is detected. Subsequently, while retaining that state, a pattern of the mask is transferred onto the wafer with suitable radiation energy. The thus transferred pattern is observed by use of a microscope or otherwise, and any pattern overlay error is measured. On the basis of the measured error, the wafer is moved so that it is accurately aligned with the mask. Light is again projected upon the first and second physical optic elements of the thus aligned mask and wafer, and the position of the center of gravity of the light upon the detecting surface 9, as defined at that time, is determined as the reference position.

In this embodiment, such a shift $\Delta\delta$ of the center of gravity of the light 7 incident upon the detection surface 9 is detected to thereby detect the relative positional deviation $\Delta\sigma$ between the first and second objects 1 and 2.

The term "center of gravity of light" means such a point that, when in the cross-section of the light a position vector of each point in the section is multiplied by a value determined as a function of the light intensity of that point and the thus obtained products are integrated over the entire section, the integrated value has a "zero vector".

Figure 8B:
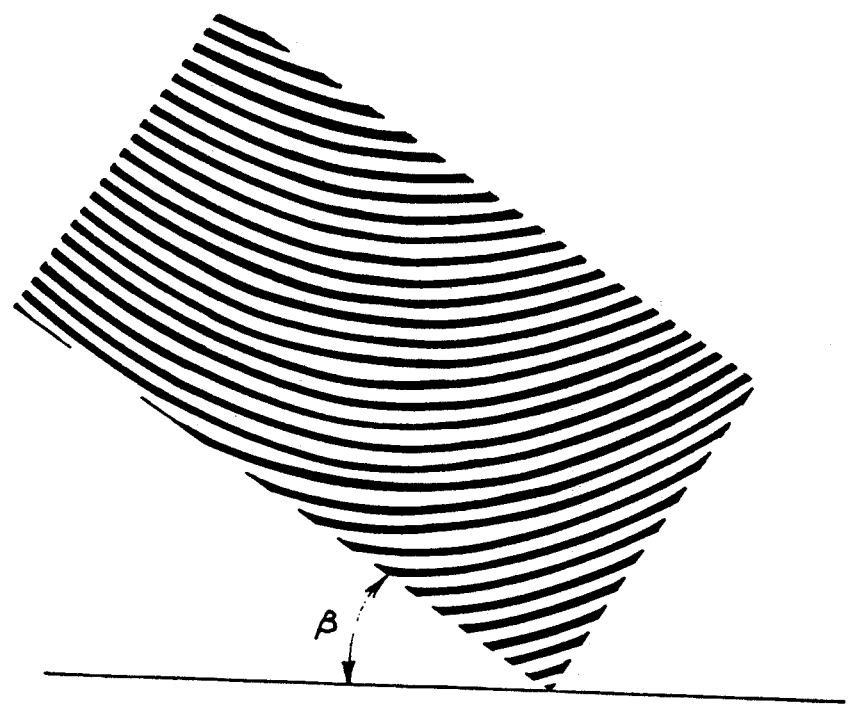
FIG. 8B shows a pattern of a mark which is an example of a first physical optic element usable in the present invention.

FIG. 8B shows an example of a grating lens usable as the first physical optic element 3.

In the embodiment described above, the alignment of two objects is made by detecting the center of gravity. However, the invention is not limited thereto but is effective also to any other type of alignment using diffraction light.

FIG. 9 is an explanatory view for explicating light other than the signal light, as formed in the structure of FIG. 8A, and shows the grating element 3 and a portion around it as viewed in the direction with respect to which the positional deviation is to be detected. Denoted in FIG. 9 at 5 is a projected light and at 7 is a emanating diffraction light.

Axis 31 denotes the direction of a reflected first order diffraction light caused by the grating lens element 3. Reference numerals 32 and 33 denote the directions of what can be called "zero-th order diffraction lights" provided by the projected light 5 but not having been influenced by the diffraction effect of any one of the grating lens elements 3 and 4. Where the grating lens elements 3 and 4 have no positional deviation, all the lights 5, 7, 31, 32 and 33 are contained in the same plane which plane is orthogonal to the direction X with respect to which any positional error is to be detected. It is easily understood that if a particular positional error (not equal to zero) exists, namely, when the second object 4 is deviated, the angle of the light 7 to be received changes but the other lights do not show any change.

The effect of lights 32 and 33 upon the photodetector 8 side can be avoided by providing a large angle $\gamma$ of incidence of the light projecting path to the grating lens 3.

On the other hand, as regards the direction of the light 31, if the direction a of the first order diffraction light transmitted by the grating element 3 is determined with respect to the zero-th order diffraction light, the direction of the light 31 which is a reflected light is determined with the same angle $\alpha$. As a result, where the lights 5 and 7 in the signal light path are set as shown in FIG. 9, the light 31 which is an unwanted light (main lobe) is necessarily in a direction close to the light 7.

Generally, the light intensity at the center spot of first order diffraction light reflected by a mask changes, depending on the material of the mask, the wavelength of a projected light, the angle of incidence and the state of plane of polarization. Where a pattern is formed by gold or chromium and where a semiconductor laser in the near infrared region is irradiated for about 10-20 degrees the intensity is of an order of $10^{-1}-10^{-2}$ of the incident light quantity.

Where first order diffraction light passing through a mask and first order diffraction light reflected by a wafer as well as light transmitted at the zero-th order through the mask are used, the light intensity of the signal light is of an order of $10^{-3}$ $10^{-5}$ of the light intensity of a projected light. Therefore, it is desirable to set the path of light reception not only to exclude the center light (first order main lobe) of the first order diffraction image formed by reflected at the mask, but also to exclude the side lobe having high intensity of an order of $10^{-1}-10^{-2}$ of the center intensity.

Generally, however, there is produced a Fraunhofer image as determined by the outer frame of the grating lens 3, with the light 31 acting as a chief ray. Where the grating lens is defined by an aperture of oblong shape having two sides parallel to the direction in which any positional error is to be detected, a produced corresponding pattern of diffraction light includes an intensity peak within the plane of FIG. 9. As a result, if the structure is such that the grating lenses 3 and 4 have an axis of symmetry in a plane perpendicular to the error detecting direction and if each grating lens has a lens function and has a peripheral configuration of oblong shape and where the positional error is to be detected in respect to a direction along a side of the oblong shape, a portion of side lobe light of an intensity of an order of $10^{-2}$ $10^{-3}$ of the center intensity overlaps upon the path for light reception. Such a superposed component acts as a noise to the signal light and leads to a factor for reduction in precision.

In this embodiment, in consideration of this, the center of the photodetector 8 is set to satisfy that it is included in such plane which include the path of the light 5 to be incident upon the grating element 3 (FIG. 8A) and which is orthogonal to the surface of the element 3 and that the center of the detector is disposed in a space defined between planes each extending through the center of the grating element 3 and extending a side of the aperture shape of the element 3. The optical arrangement is set so that along the effective light receiving zone of the detector 8 the received light is displaceable. With this structure, the described problems can be solved.

Namely, such a structure is used in which the main lobe and its side lobe caused by the grating lens (hereinafter these two lobes will be referred to as "unwanted diffraction light") are not directed to the photodetector 8.

The features of the present embodiment will be explained in more detail, taken in conjunction with FIGS. 8A and 8B as well as FIG. 10 showing the state of lights as the mask is observed from an arbitrary plane above and parallel to the mask 1 surface. In this case, diffraction light 31 advances in the direction of a normal to the first object, i.e., it advances just upwardly.

In this embodiment, each of the grating lens elements 3 and 4 provided on the mask and the wafer has an oblong peripheral shape. The error detecting direction, i.e., the direction in which any positional error is to be detected is in the X-axis direction. Each of the grating lenses 3 and 4 has a cylindrical power in the X direction. Each side of the oblong configuration has an angle of inclination $\beta$ to the direction which is perpendicular to or parallel to the X axis, to allow exclusion of Fraunhofer diffraction image, as will be descried later.

At this time, as a main change in the action of light, in the structure of FIG. 8, the well-known Fraunhofer diffraction image rotates by $\beta$ while taking an axis 31 (FIG. 10) as a rotational axis.

More specifically, of the Fraunhofer diffraction image caused by a grating lens on a mask 1, those portions emanating in a direction close to the light to be received are aligned with the axes u and v. This provides a coordinate system which is rotated by $\beta$ to the direction X of deviation detection. As a result, the axis v having been superposed upon the Y axis rotationally shifts by $\beta$, relative to an entrance pupil 43 which is the projection component upon this section of the photodetector 8 which is in the neighborhood of the center 42 of the light to be received. This is effective to prevent the Fraunhofer diffraction image from entering into the entrance pupil 43. Namely, the direction of a straight line portion of a mark is inclined relative to the photodetecting portion to thereby shift a plane in which the Fraunhofer diffraction vectors are contained.

As an alternative, use of a slightly deformed parallelogram will attain substantially the same results.

FIGS. 11 and 12 shows second and third embodiments of the present invention, each representing a Fraunhofer diffraction image as viewed from the above. In the second embodiment shown in FIG. 11, a grating lens element provided in a portion of a mask has a lozenge shape, wherein one of two lines each connecting two opposed vertexes is selected as the direction of deviation detection, while the other is selected as the direction in which the path of light reception is set.

Generally, in the direction connecting two vertexes, a formed Fraunhofer diffraction image does not have a portion of high intensity. As a result, in this example, the effect of unwanted light upon the entrance pupil 43 can be made small.

Figure 13:
FIG. 13 shows a pattern of a mark which is an example of a grating element provided in a portion of a mask, usable in the third embodiment of the present invention.

In the third embodiment shown in FIG. 12, a grating element provided in a portion of a mask has a hexagonal shape. FIG. 13 shows an example of a pattern usable as such a grating element. Of a Fraunhofer diffraction image produced at this time, those portions as having higher intensity are produced in three directions of axes u, v and w. However, also in this occasion, by setting the path of light reception in the Y-axis direction as illustrated in which opposed vertexes are connected, it is possible to exclude the effect of unwanted light.

It will be understood that, with an outer configuration provided by coupling two or more lozenge shapes or hexagonal shapes in the X-axis direction, for example, similar advantageous results are obtainable. While, in the foregoing, the peripheral shape of a grating lens has been described as those having vertexes, similar advantageous effects are attainable with an outer configuration defined by a curved line or lines.

In some embodiments described below, a photodetecting portion is displaced out of a plane in which Fraunhofer diffraction vectors are contained.

Figure 14:
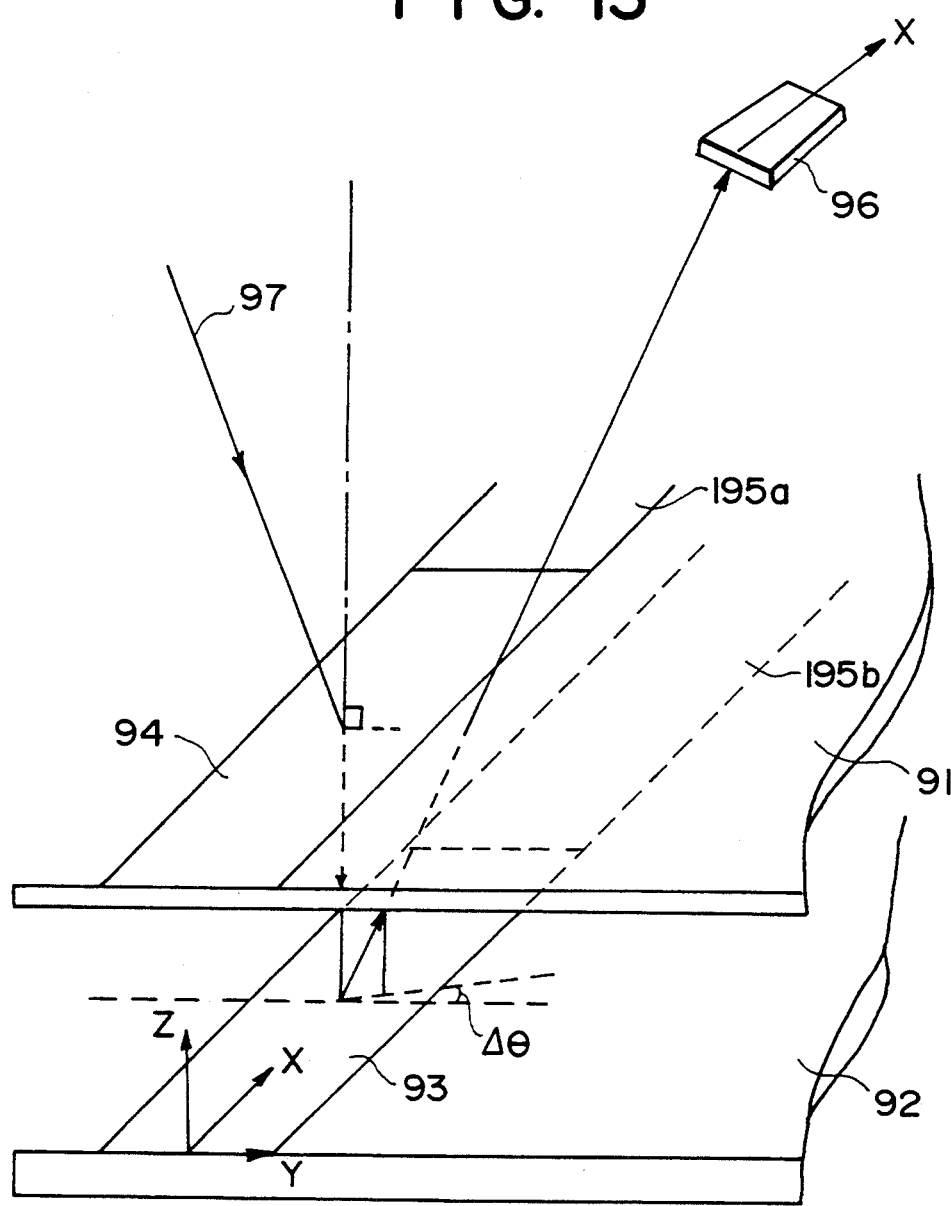
FIG. 14 is a schematic view showing a major portion of a fourth embodiment of the present invention.

FIG. 14 is a schematic view showing a major portion of a fourth embodiment of the present invention. Denoted in FIG. 14 at 91 is a first object which is a mask, for example. Denoted at 92 is a second object which is a wafer, for example, that is to be aligned with the mask 91. Denoted at 94 and 93 are first and second alignment marks, respectively, which are provided in portions of the mask 91 surface and the wafer 92 surface, respectively. Each of the first and second alignment marks 94 and 93 may comprise a grating lens such as a Fresnel zone plate, for example. These alignment marks are provided on scribe lines 195a and 195b formed on the mask 91 surface and the wafer 92 surface, respectively. Denoted at 97 is an alignment light having been emitted from a light source (not shown) included in an alignment head (also not shown) and having been collimated into a predetermined beam diameter.

In this embodiment, examples that can be used as a light source are: a light source such as a semiconductor laser, a He-Ne laser, an Ar laser or otherwise that can emit a coherent light; and a light source such as a light emitting diode or otherwise that can emit an incoherent light. Sensor (photoreceptor) 96 functions as a first detecting means and is adapted to receive the alignment light 97. The sensor may comprise a one-dimensional CCD sensor, for example.

In this embodiment, the alignment light 97 is incident upon the first alignment mark 94 at a predetermined angle. The incident light is transmissively diffracted and then is reflectively diffracted by the second alignment mark 93 on the wafer 92 surface. The reflectively diffracted light is finally incident upon the sensor 96 surface. The sensor 96 is operable to detect the position of the center of gravity of the alignment light projected on its surface. By using output signals of the sensor 96, the relative position of the mask 1 and the wafer 2 in a direction parallel to scribe lines 95a and 95b (i.e. in the x direction) is determined.

Description will now be made of the first and second alignment marks 94 and 93 used in this embodiment.

The alignment marks 93 and 94 are provided by Fresnel zone plates (or grating lenses) having different focal lengths. Each mark has a size of 280 microns in the lengthwise direction of the scribe line and 70 microns in the widthwise direction (y direction) of the scribe line.

In this embodiment, the alignment light 97 is incident on the mask 91 at an angle of incidence of 10 degrees, with the projection component upon the mask 91 surface being perpendicular to the scribe line direction (x direction). The alignment light 97 incident on the mask 91 with a predetermined angle is influenced by the lens function of the grating lens 94 so that it is transformed into a convergent or divergent light which is emitted from the mask 91 so that its chief ray has a predetermined angle with respect to the normal of the mask 91.

The alignment light 97 having been transmissively diffracted by the first alignment mark 94 is focused at a point on the wafer 92 surface which is at a distance of 238.0 microns vertically below the wafer surface 92. The alignment mark 94, in this case, has a focal length of 268 microns. Also, the mask 91 and the wafer 92 are spaced by a distance 30 microns.

The light transmissively diffracted by the alignment mark 94 is influenced by a concave or convex lens function of the second alignment mark 93 on the wafer 92 surface, and is collected on the sensor 96 surface (first detecting means). On this sensor 96 surface, at this time, the light is incident with any relative positional deviation (i.e. any misalignment of the axes) of the marks 94 and 93 being magnified, with a result of corresponding shift of the position of the center of gravity of the incident light.

The present embodiment is so set that, when the mask 91 and the wafer 92 have no relative positional deviation (i.e. when the alignment marks 94 and 93 on the mask 91 and the wafer 92 just provide a coaxial system), the chief ray of the alignment light emitting from the wafer 92 has an angle of emission of 5 degrees, the projection component of the emitted light on the wafer 92 surface extending in a direction of 4 deg. with respect to the widthwise direction (y direction) of the scribe line to thereby exclude or evade Fraunhofer diffraction image from the mask and wafer. Additionally, the emitted light is focused on the sensor 96 surface whose center coordinate is disposed at a site (0.98, 4.2 and 18.7) (unit: mm) with respect to the center coordinate of the mask 91 surface. Namely, the photodetecting portion for receiving the emitted light is disposed out of a plane in which Fraunhofer diffraction vectors are contained.

Further, the direction of array of the sensing elements of the sensor 96 in its effective light receiving region is set in the x direction, and the effective light receiving region has a length of 4.8 mm in the x direction. The position of incidence of the alignment light upon this effective light receiving region displaces with the positional deviation between the mask and the wafer.

An example of a pattern usable in the present embodiment as a grating lens is illustrated in FIG. 15. The pattern exemplified in FIG. 15 has the same lens function both in the x direction and the y direction. Also it has a function for deflecting the advancing direction of the light, in the y direction and at a predetermined angle.

As an example, first and second alignment marks 94 and 93 (grating lens) usable in this embodiment can be prepared in the following manner:

First, the marks 94 for a mask is designed so that, when a parallel light of a predetermined beam diameter is incident thereupon at a predetermined angle, the light is collected at a predetermined position. Usually, a pattern of a grating lens may be that of an interference fringe which can be formed on a lens surface in an occasion where mutually coherent light sources are disposed at a light source position (object point) and the position of an image point. Assumingly, a coordinate system is defined on a mask 91 surface, such as shown in FIG. 14. The origin is at the middle of the width of the scribe line, the x axis is in the direction of the scribe line, the y axis is in the widthwise direction and the z axis is in the direction of the normal of the mask 91 surface. Equations regarding a group of curved lines of such a grating lens by which a parallel light, having been incident thereon with an angle $\alpha$ with respect to the normal of the mask surface 91 and with the projection component being perpendicular to the scribe line direction, is imaged after being transmissively diffracted by the mark of the mask, at the position of a converging point $(x_1, Y_1, z_1)$, can be expressed in the following manner, with the position of each grating line being denoted by x and y:

$$y \sin\alpha + P1(x,y) - P2 = m\lambda/2 \qquad (1)$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle a and passing through the origin on the mask surface 91 and then impinging upon a convergent point $(x_1, Y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, Y_1, z_1)$.

According to equation (1), the light passing a point y on the mask 91 surface does not shift at the imaging point in the y direction.

On the other hand, a grating lens to be provided on a wafer 92 is designed so as to collect, at a predetermined position (on the sensor surface), a spherical wave emanating from a predetermined point light source. Where the gap between a mask 91 and a wafer 92 at the time of exposure (pattern transfer) is denoted by g, then such a point light source can be expressed by:

$$(x_1, y_1, z_1 - g)$$

wherein y is a variable.

Assuming now that the mask 91 and the wafer 92 are to be aligned with respect to the x-axis or y-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x-x_2)^2 + (y-y_2)^2 + z_2^2} - \sqrt{(x-x_1)^2 + (y-y_1)^2 + (z_1-g)^2} = \sqrt{x_2^2 + y_2^2 + z_2^2} - \sqrt{x_1^2 + y_1^2 + z_1^2} \quad (2)$$

Equation (2) is such an equation that satisfies a condition under which, assuming that the wafer surface is "$z = -g$" and that the chief ray is such a ray that passes the origin on the mask surface and a point $(0, 0, -g)$ on the wafer surface and additionally a point $(x_2, y_2, z_2)$ on the sensor surface, the difference in length between the path of the chief ray and the path of a ray passing the grating $(x, y, -g)$ on the wafer surface becomes equal to a multiple, by an integral nunsher, of a half wavelength.

In a particular example, patterns were designed with specifications in accordance with equations (1) and (2) that $x_2 = -980.0$ micron; $y_2 = 4200.0$ micron; $z_2 = 18700.0$ micron; $x_1 = 0.0$ micron; $y_1 = 0.0$ micron; $z_1 = -184.72$ micron; $m = 1$ and $\alpha = 17.5$ degrees.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 91, and that the line and space ratio of rectangular grating is 1:1 in the case of the grating lens on the wafer 92.

As a specific example, a grating lens on a mask 91 was formed by transferring, onto an organic thin film of polyimide, a grating lens pattern of a reticle prepared by use of electron beam exposure technique.

On the other hand, a mark on a wafer 92 was formed by preparing on a mask a pattern to be printed on a wafer and then by transferring the pattern by use of a lithographic process.

Description will now be made of the relationship between a signal light (alignment light) to be incident on a sensor (detecting means) which may comprise an accumulation type one-dimensional CCD sensor, for example.

In this embodiment, the signal light (for alignment) emanates from the wafer surface at angle of 5 degrees in the Y-Z plane, with respect to the normal of the wafer surface and with the projection component, upon the wafer surface, being at an angle of 3 degrees in the X-Z plane. The spatial disposition of the sensor 96 is so set that, upon completion of alignment, a light is incident on the sensor substantially at the middle position.

In the present invention, in order to avoid that the Fraunhofer diffraction pattern as determined by the aperture shape of the alignment mark is superposed upon the alignment signal light, on the sensor surface, to deteriorate the signal-to-noise ratio or that the signal light intensity distribution changes as a result of interference to cause shift of the position of the center of effective light quantity, the design of the alignment mark pattern and the disposition of the sensor are determined to assure that, even when the mask and the wafer have no relative positional deviation, the light rays (alignment light) directed from the alignment mark to the sensor is deflected to the outside of the plane in which the alignment light has been first incident.

As regards the size of the sensor 96, it is 1 mm in width and 6 mm in length. Each picture element (pixel) has a size of $25 \times 500$ microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by $\times 100$. Therefore, a positional deviation of 0.01 micron between the mask and the wafer results in an effective displacement of the center of gravity on the sensor surface through 1 micron. The sensor system can measure such a displacement with a resolution of 0.2 micron.

FIGS. 16A and 16B are schematic views showing a major portion of a fifth embodiment of the present invention. More specifically, FIGS. 16A and 16B are sections taken on a y-z plane and an x-z plane, respectively, showing the path of alignment light where an x axis is laid in the direction of a scribe line while a z axis is laid in the direction of a normal to a mask surface.

In this embodiment, an alignment light 97 emanating from a semiconductor laser in an alignment head (not shown) and passed through a light projection system in the head is incident at an incline upon a first alignment mark 94 provided on the mask surface 91.

By this alignment mark (physical optic lens element) 94 on the mask 91 surface, the alignment light 97 is deflected out of the plane along which it has been incident on the mask. In this example, the light is deflected in the x direction as viewed in the drawings. Thereafter, the light path is deflected again by a second alignment mark (physical optic lens element) 93 on a wafer 92 surface by a predetermined angle toward the alignment head.

Namely, in this embodiment, the alignment of the physical optic lens element 94 on the mask 91 surface and the physical optic lens element 93 on the wafer 92 surface is completed with these physical optic lens elements being relatively shifted in the direction of the scribe line. In the y-z plane of FIG. 16A, the angle of incidence of the alignment light upon the mask surface is 8 degrees; the angle of incidence upon the wafer surface of a chief ray of first order diffraction light is 0 degree (namely, perpendicular incidence); and the angle of emission of first order diffraction light from the wafer surface is 17.5 degrees. In the x-z plane of FIG. 16B, the angle of incidence of the alignment light upon the mask surface is 5 degrees: the angle of incidence upon the wafer 92 surface of the chief ray of the first order diffraction light is 7 degrees; the angle of emission of the first order reflective diffraction light from the wafer 91, in the x-z plane, is 7 degrees (the physical optic lens element 93 on the wafer 92 surface has no deflecting function in the y-z plane); and the angle of emission of that first order transmissive diffraction light from the mask 91 surface is also 7 degrees.

In the fifth embodiment, each of the physical optic elements of the mask and the wafer comprises a grating lens element effective to image an object point upon a predetermined position, like those of the first embodiment. The power arrangement of the grating lens system is determined so as to provide a magnification sensitivity of $\times 100$ as in the first embodiment, the alignment light being imaged upon a sensor within the alignment head as the mask-to-wafer gap is set to 30 microns. The specifications of the size of each mark as well as the power arrangement of the grating lens system are the same as in the first embodiment.

In this embodiment, each of the grating lenses 94 and 93 of the mask 91 and the wafer 92 has a deflecting function for deflecting a received light out of the plane along which the light has been incident. This provides the following advantageous results.

First, it is assured that a Fraunhofer diffraction pattern directly reflectively diffracted by the grating lens of the mask back to the alignment head does not impinge upon the sensor within the alignment head. Thus, it is ensured to prevent reception of even a portion of the direct reflective diffraction light from the mask surface by the sensor, which light has the highest intensity of the unwanted diffraction lights coming back to a portion adjacent the sensor. Therefore, it is possible to avoid pickup of such noise light which leads to a factor of error in the detection of the position of center of gravity of the alignment signal light.

Figure 17:
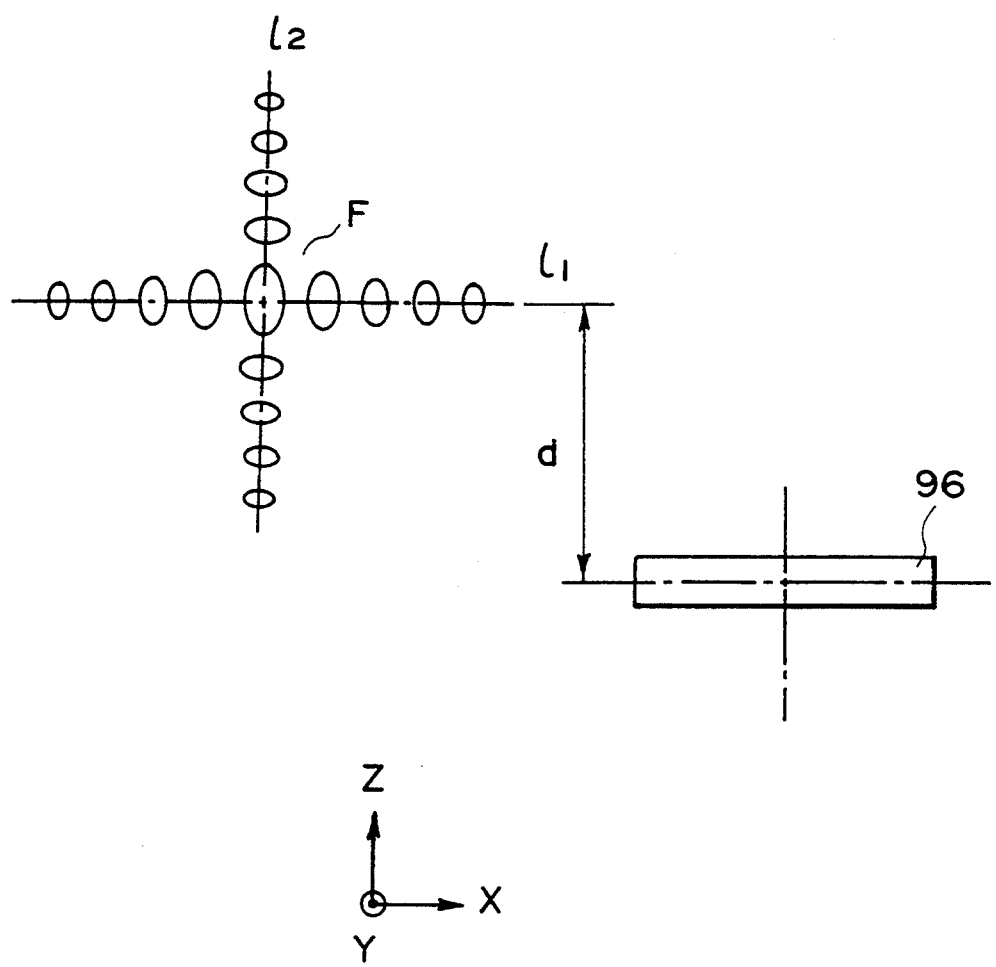
FIG. 17 is an explanatory view for explicating the relationship between a used sensor and a diffraction light, in the fifth embodiment of the present invention.

FIG. 17 is a schematic representation, illustrating the position of the sensor in the alignment head of the fifth embodiment as well as the distribution of direct reflective diffraction light from the mask surface coming back to this alignment head. The direct reflective diffraction light from the mask surface provides a Fraunhofer diffraction pattern F. Since the grating lens on the mask surface has a rectangular aperture shape accommodated in the scribe line, the Fraunhofer diffraction pattern F in the alignment head includes a component having a distribution parallel to the direction in which the displacement of the center of gravity of light upon a one-dimensional sensor 96 corresponding to a positional deviation between the mask and the wafer is to be detected, and another component having distribution parallel to a direction which is perpendicular to the displacement detecting direction.

Since in this embodiment any positional error in the direction of the scribe line is to be detected, in the x-z plane the angle of incidence of the alignment signal light upon the grating lens of the mask differs from the angle of emission of the same from the grating lens of the wafer. Therefore, even if there is formed a diffraction pattern having a component distributed in parallel to the line direction of the one-dimensional sensor, such a diffraction pattern is not received by the sensor 96.

More specifically, in the x-z section of FIG. 17, the position of the center of an unwanted Fraunhofer diffraction pattern F is relatively deviated from the position of center of the sensor 96 by a distance d in the z direction. The distance d is determined by the angle of incidence of the alignment light in the x-z plane, the angle of emission of the same toward the alignment head as well as the position of the sensor in the head.

It is desirable in the present embodiment to use such a grating lens element as having no lens function in a direction perpendicular to the scribe line so as to surely avoid that, when there is a positional deviation in a direction perpendicular to the scribe line, the returning alignment light misses the one-dimensional sensor.

A second effect is that the deflecting function of the grating lens of the mask effective to transmissively emit a received alignment light at an angle in the y-z plane different from the angle of incidence of the received light, easily assures that the light reflectively diffracted from the wafer surface does not pass through the grating lens of the mask but pass through the mask surface.

In the fourth embodiment described hereinbefore and in the present (fifth) embodiment, the alignment signal light passes the mask twice and is reflected once by the wafer surface. However, it is influenced by the lens function only when it is first transmissively diffracted by the mask surface and when it is reflectively diffracted by the wafer surface.

Namely, on the second-time passage of the light through the mask, only a zero-th diffraction light component is utilized even if the light passes the grating lens portion. In other words, what is detected as the signal light in respect to the detection of the position of center of gravity upon the sensor is such a light having passed through the grating lens of the mask by first order diffractive transmission, having been reflected by the grating lens of the wafer by first order reflective diffraction and having passed through the grating lens of the mask by zero-th order transmission (transmission through the mask surface).

Where the optical path is set so that the light passes the grating lens of the mask by zero-th order transmission, the intensity distribution of the light upon the sensor surface is modulated because the zero-th diffraction efficiency is not uniform over the grating lens but is varying spatially. This is because the pitch of the grating lens is not uniform spatially but is modulated spatially in accordance with equations (1) and (2) as discussed with reference to the first embodiment (generally, the diffraction efficiency changes with the pitch (diffraction angle)).

In order that the alignment light is not influenced by the grating lens function upon the second-time passage thereof through the mask, the mask and wafer grating lens elements are set so as to deflect the alignment light outwardly of a plane of incidence which contains the path of incident light and a normal to the mask surface.

FIGS. 18A and 18B are schematic representations showing a major portion of a sixth embodiment of the present invention. More specifically, FIG. 18A is a y-z section in a coordinate system as depicted in FIG. 14, and FIG. 18B is an x-z section. In these Figures, solid lines depict an alignment signal light, while broken lines depict a reference light.

In this embodiment, an alignment light 97a and a reference light 97b are incident upon a first alignment mark 93a on the mask 91 surface and a first reference mark 93b on the mask 91 surface, respectively, each at a predetermined angle. The alignment light and the reference light are transmissively diffracted by these marks and then they are reflectively diffracted by a second alignment mark 94a and a second reference mark 94b, respectively, both of which are provided in a portion of a wafer 92 surface. The reflectively diffracted alignment light and reference light are directed to and received by respective sensors 96a and 96b, which are not shown in these drawings. Each of these sensors 96a and 96b is serviceable to detect the position of the center of gravity of the received alignment light 97a or the received reference light 97b and, by using output signals from these sensors, the mask 91 and the wafer 92 can be brought into alignment with respect to the direction of a scribed line (x direction).

In this embodiment, the pattern designing for the alignment mark 93a and the reference mark 93b is made in accordance with designing equation (1), and the pattern designing for the alignment mark 94a is made in accordance with designing equation (2). The reference mark 94b comprises a straight-line grating and has no lens function.

In this embodiment, the advancing directions of both of the signal light and the reference light are deflected by the physical optic elements 94a and 94b of the wafer by a predetermined angle $\theta$ (=5 degrees) as viewed in the x-z section. Thus, upon completion of the mask-to-wafer alignment, as viewed in the x-z section there is a lateral shift or deviation between the central axis of the sensor within an alignment head and the central axis of the grating lens system of the mask and wafer. Also, at this time, a Fraunhofer diffraction pattern from the alignment mark within a scribe line on the mask surface, for example, is formed, like that shown in FIG. 17, wherein a Fraunhofer diffraction pattern F corresponding to the aperture shape of the mark is separated from the signal light 97a and the reference light 97b, in a section containing the sensor surface in the alignment head such that only the signal light and the reference light impinge upon the sensor.

In accordance with the present embodiment, a first and second alignment marks and a first and second reference marks are provided in portions of a first and second objects, respectively, and by using lights influenced by these marks the relative position of the first object (e.g. mask) and the second object (e.g. wafer) is made. Even if the position of the center of gravity of the alignment light displaces due to any inclination of the wafer surface as a whole or due to any local surface inclination of the same resulting from unevenness in the resist coating, distortion or flexure caused during an exposure process, or otherwise, detecting the relative position of the centers of gravities of the reference signal light and the alignment signal light (namely, detecting the interval between the gravity centers of these lights in the x direction, for example) can easily cancel such an inclination of the wafer surface. As a result, it is possible to correctly detect a positional deviation without being affected by such a wafer surface inclination.

If the relative position of the alignment head to the mask changes for some reason to cause shift of the position of the center of gravity of the alignment signal light upon the sensor, this can be easily compensated for by detecting the relative position of the gravity centers of the reference light and the alignment light. Thus, it is possible to correctly detect a relative positional deviation of the mask and the wafer without being affected by a positional error of the alignment head.

As described, the concept of the present invention is conveniently applicable to an occasion where the position detection is made by using two types of lights.

Figure 19D:
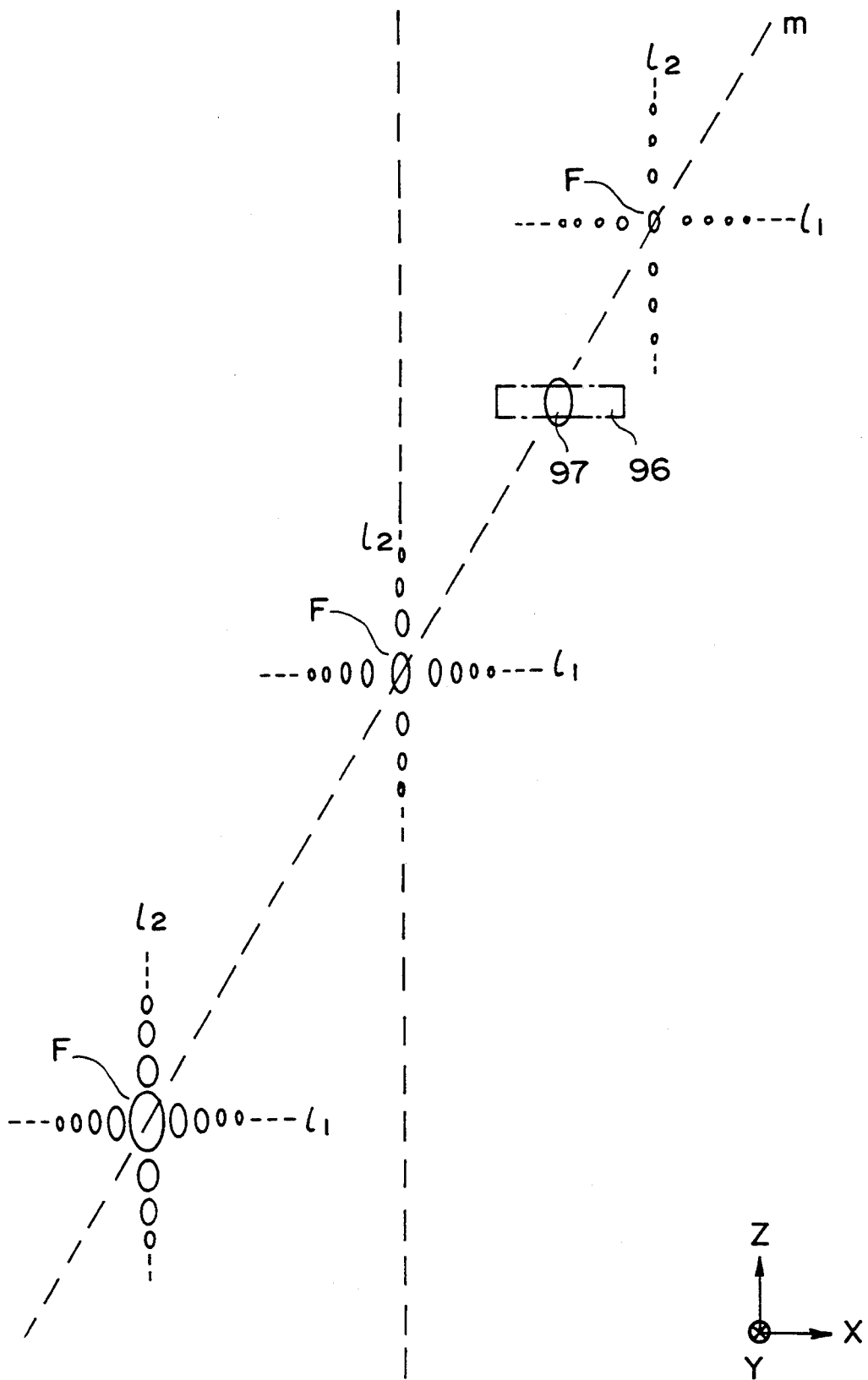

FIGS. 19A–19D are schematic representations, illustrating a major portion of a seventh embodiment of the present invention. More specifically, FIG. 19A is an x-z section of marks 94 and 93, FIG. 19B is a y-z section, FIG. 19C is a plan view in the direction of z-axis, and FIG. 19D is an illustration showing the relationship between a sensor 96 and diffraction patterns in a plane containing the sensor 96 surface.

In this embodiment, the angle of incidence and the angle of emission of an alignment light 97 upon and from a grating lens 94 are 17.5 degrees and zero degree, respectively; the angle of emission of the alignment light 97 from another grating lens 93 is 13 degrees: and a projection component upon the x-y plane of the light emanating from the grating lens 93 and a projection component on the same plane of the light entering the grating lens 94 each defines an angle of 4 degrees with respect to the y axis. In this case, where a mask and a wafer have no relative positional deviation, the path of light emanating from the grating lens 93 lies in a plane which contains the path of incidence of the alignment light 97 upon the grating lens 94 as well as a normal to the mask surface.

The grating lens 94 has an aperture shape of rectangular configuration having sides parallel to the x and y axes, respectively. The projection component of incident light on the mask surface is inclined, as described, with respect to these sides of the aperture. As a result, in the plane containing the sensor 96 surface the line m (FIG. 19D) connecting the centers of main lobes of unwanted diffraction patterns of different diffraction orders is rotationally shifted and thus inclined with respect to the z axis. In FIG. 19D, the illustrated patterns are, in the order from the below, a Fraunhofer diffraction image formed by zero-th order diffraction by the grating lens 94, a Fraunhofer diffraction image of the first order diffraction by the lens 94 and a Fraunhofer diffraction image of second order diffraction by the lens 94. In each Fraunhofer diffraction image, there is a Fraunhofer side lobe distributed along two lines $l_1$ and $l_2$ determined by the shape of the aperture. The position of the sensor 96 is determined in the state of optical paths as described so as to step aside from the main lobes of diffraction lights of different orders as illustrated in FIG. 19D and, as a result of which, it is possible to avoid reception of side lobes.

Figure 20A:
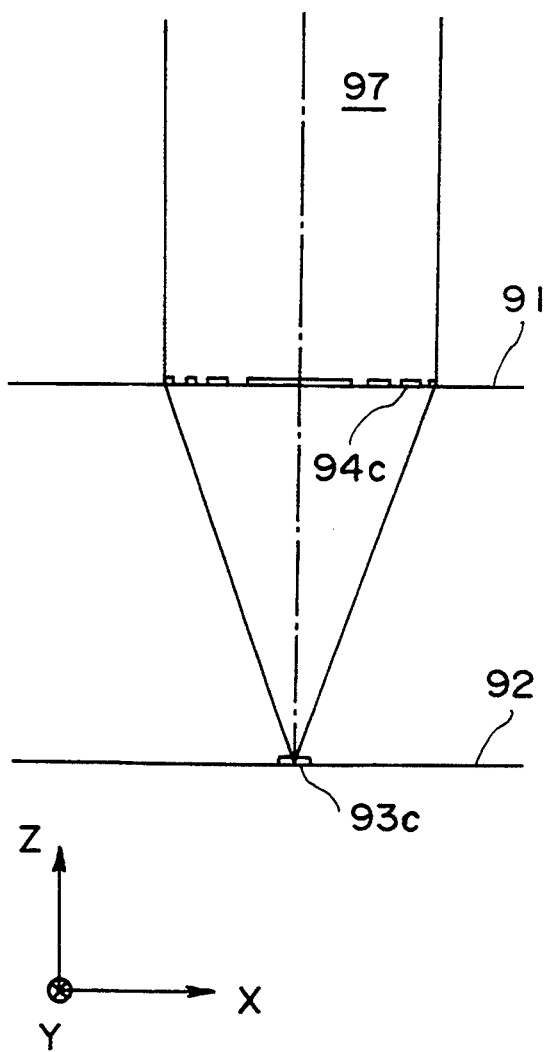
FIGS. 20A-20D are schematic representations, respectively, for explicating a major portion of an eighth embodiment of the present invention.
Figure 20B:
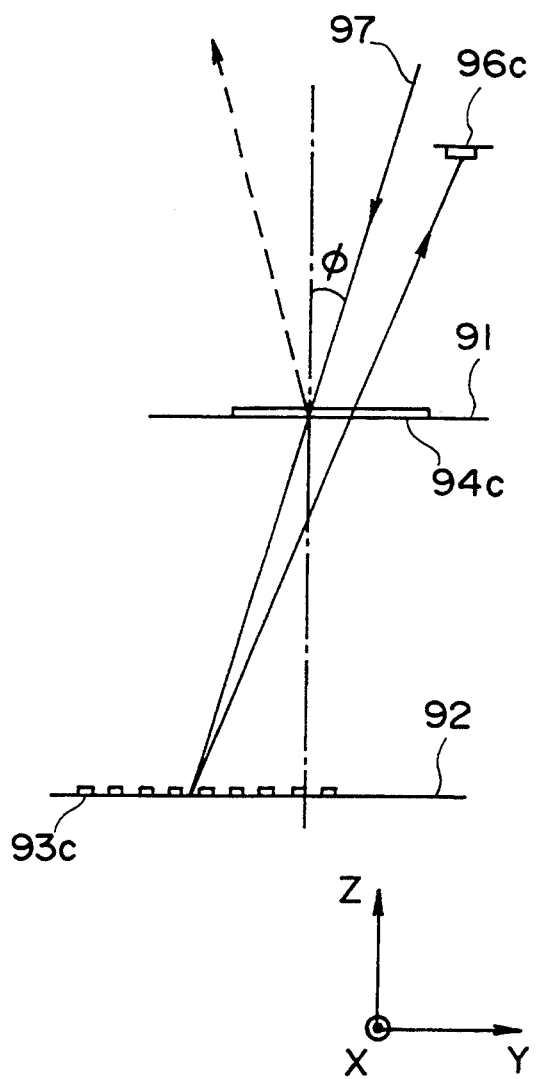
Figure 20C:
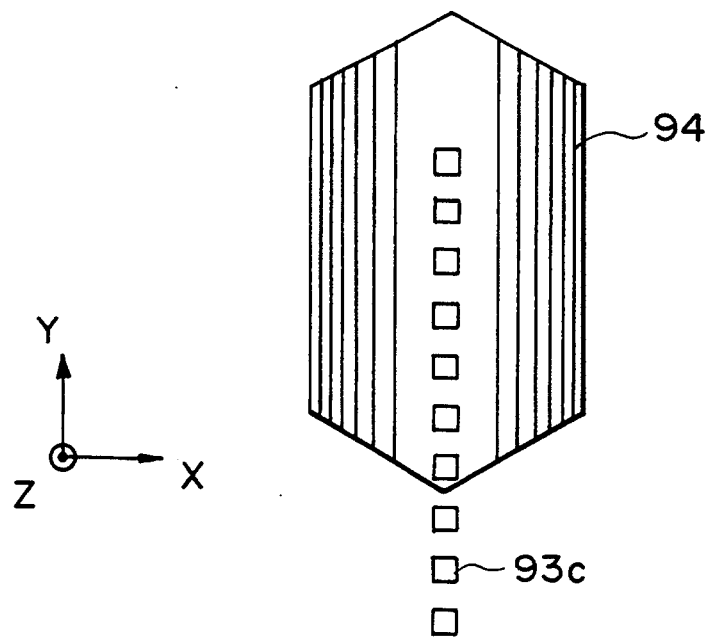
Figure 20D:
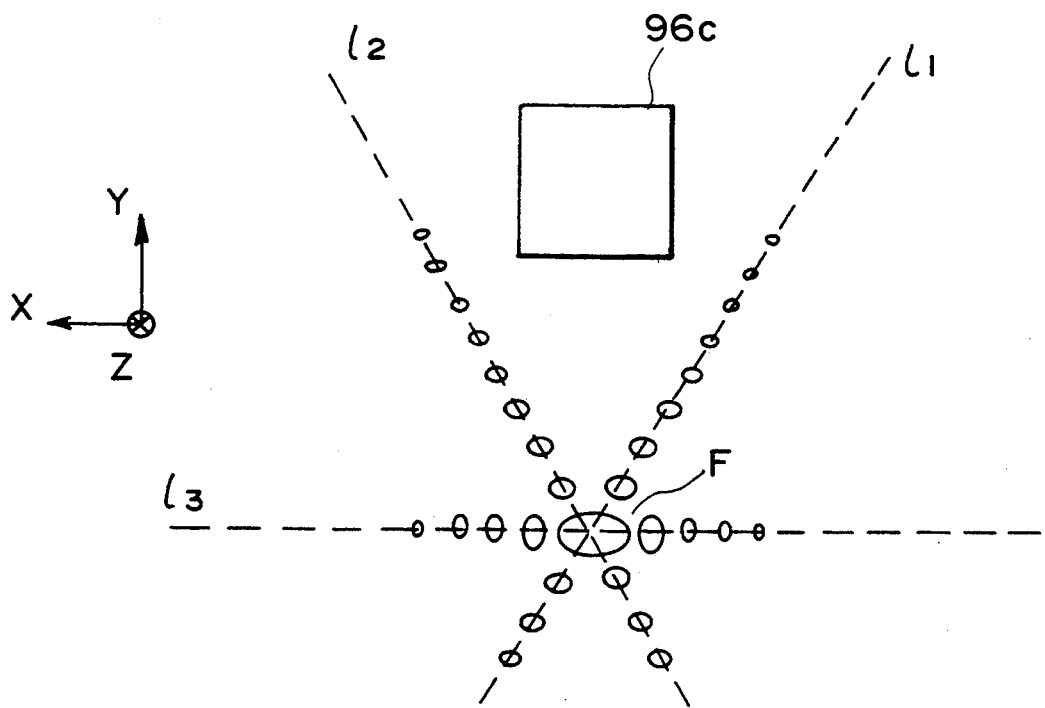

FIGS. 20A–20D are schematic representations, explicating a major portion of an eighth embodiment of the present invention. More specifically, FIG. 20A is an x-z section of alignment patterns 94c and 93c, FIG. 20B is a y-z section, FIG. 20C is a plan view in the direction of a z axis, and FIG. 20D is an illustration showing the relationship between a sensor 96c and a diffraction pattern in the plane containing the sensor 96c surface.

In this embodiment, an alignment mark 94c provided on a mask 91 is a cylindrical grating lens (linear zone plate) having a lens function only in the x direction and having a focal length in the x-z plane which is substantially equal to a set interval between the mask 91 and a wafer 92. The wafer 92 is provided with an alignment mark 93c which comprises a diffraction grating provided by rectangular gratings arrayed at regular intervals in the y direction (FIG. 20C). The direction in which the linear zone plate 94c has a power (lens function), i.e. the x direction in this example, is the direction of alignment detection. A parallel light is projected upon the linear zone plate 94c along a plane containing a normal to the mask 91 surface at the center of the alignment mark as well as containing a direction perpendicular to the direction of alignment detection, and at a certain angle $\phi$ to that normal. By the zone plate, the incident light is focused as a linear image upon the wafer 92 surface. Sensor 96c is disposed at a site to receive diffraction light of a predetermined order or orders emanating from the diffraction grating 93c as it is irradiated with the linearly focused light from the zone plate 94c. In this example, the sensor 96c is positioned so that its center lies in the y-z plane, containing the center of the grating lens 94c, to assure reception of diffraction light advancing in a predetermined direction in the y-z plane. If the diffraction grating 93c and the grating lens 94c are relatively shifted in the x direction, the intensity of diffraction light produced by the diffraction grating 93c decreases, with a result of reduced light quantity detected by the sensor 96c. Thus, by scanning the diffraction grating 93c with the linearly focused light and by detecting or monitoring changes in the light quantity by using the sensor 96c, it is possible to detect relative positional deviation of the mask and the wafer in the x direction.

In that occasion, zero-th order reflective diffraction light is emitted from the grating lens 94c in a direction as depicted by broken line in FIG. 20B, and about this, there is produced a Fraunhofer diffraction image which can be viewed in the plane containing the sensor 96c surface, as illustrated in FIG. 20D. If a portion of the side lobe of the diffraction image enters the sensor 96c, it produces a change in light quantity as received by the sensor 96 and, therefore, adversely affects the precision of positional error detection which relies on detection of light quantity. In the present embodiment, in consideration thereof, the alignment mark 94c is shaped into a hexagonal, like the FIG. 11 embodiment, to assure that the side lobe is distributed as illustrated in FIG. 20D. Thus, it is ensured that substantially no unwanted diffraction light is received by the sensor 96c. However, the mark configuration is not limited to the illustrated. Any other forms is usable. For example, the one as used in a foregoing embodiment may be used. Further, while using a rectangular-shaped mark, the direction of light reception or the direction of projection of light upon a mark may be adjusted, in the manner described hereinbefore, for example.

In the foregoing examples, a diffraction grating provided on a second object side is of a reflective diffraction type. If, however, the second object has a light transmissibility, the diffraction grating to be provided on such a second object may be of transmissive diffraction type. FIGS. 21A–21D show such an embodiment. More specifically, FIG. 21A is an x-z section of alignment patterns 94 and 93, FIG. 21B is a y-z section, FIG. 21C is a plan view in the direction of a z axis, and FIG. 21D is an illustration showing the relationship between a sensor 96 and diffraction light as viewed in the plane containing the sensor 96 surface, all in accordance with a ninth embodiment of the present invention.

In this embodiment, each of grating lenses 93 and 94 has a rectangular shape, and an alignment light 97 is projected in a direction which is perpendicular to one side (x-direction side, in this example) of the rectangular aperture. The light transmissively diffracted by the grating lenses 94 and 93 and thus influenced by the lens functions of them is directed to and received by a signal detecting region 96d of the sensor 96 surface as an alignment light. On the basis of the position of incidence of the alignment light upon the sensor 96 surface, any relative positional deviation of the first and second objects 91 and 92 in a direction perpendicular to the opposing direction of these objects can be detected. In that case, the light is emitted from the grating lens 94 in a direction which is inclined with respect to a side of the rectangular aperture extending in the x direction. The positional relationship between the sensor 96 which is provided to receive such an emerging light and a Fraunhofer diffraction image F (noise) produced by the grating lens 94, is such as represented in FIG. 21D. The illustrated Fraunhofer diffraction images are, in an order from the below, a diffraction image formed by zero-th order diffraction light from the grating lens 94 and a diffraction image formed by first order diffraction light therefrom. In this embodiment, as in the FIG. 14 embodiment, the direction of emission of the alignment light is inclined so that the position of the sensor 96 receiving the alignment light is stepped aside from the side lobe. In the illustration of FIG. 21D, a portion of the side lobe of the first order diffraction light reaches the sensor 96. However, the advantageous results of the present invention are attainable in that case by shifting, from the received side lobe portion, a zone for use in the actual deviation detection (i.e. signal detecting zone) of the sensor 96 at the stage of signal processing, for example.

While in the foregoing embodiments, description has been made of a method and apparatus for detecting a relative positional deviation between first and second objects (mask and wafer) in a direction perpendicular to the direction in which these objects are opposed to each other, the concept of the present invention is applicable also to a measuring method and apparatus for measuring the positional relationship between first and second objects in the direction in which these objects are opposed (namely, for measurement of the interval between these objects).

Some embodiments for such interval measurement will be described below.

FIG. 22 is a schematic representation, explicating a major portion of a tenth embodiment of the present invention. Part (a) of FIG. 22 is an x-z section, part (b) is a y-z section, part (c) is a plan view in a z direction, and part (d) is an illustration showing the relationship between a light receiving means and diffraction light in a plane containing the light receiving means.

Denoted in FIG. 22 at 101 is a light from a semiconductor laser LD. He-Ne laser or otherwise may be used in place of the semiconductor laser LD. Denoted at 102 is a first object which is a mask, for example. Denoted at 103 is a second object which is a wafer, for example. Denoted at 104 and 105 are first and second physical optic elements which are provided in a portion of the mask 102. Each of these physical optic elements 104 and 105 may comprise a diffraction grating or a zone plate, for example. Denoted at 108 is a light receiving means which may comprise a line sensor or PSD, for example, and which is operable to detect the position of the center of gravity of a received light. Signal processing circuit 109 functions to determine, by using signals from the light receiving means 108, the position of the center of gravity of the light incident upon the light receiving means 108, and also functions to detect by calculation the interval between the mask 2 and the wafer 3.

The light 101 (wavelength λ=830 nm in this example) from the semiconductor laser LD is perpendicularly incident at a point A on the surface of a first Fresnel zone plate provided in a portion of the mask 102. The light incident on the first Fresnel zone plate 104 is diffracted thereby, and diffraction light of a predetermined order or orders, being diffracted at an angle 81, is reflected at a point B (C) on the wafer 103 surface. Reference numeral 131 denotes such a reflection light from the wafer 103 when it is at a position P1 which is at a distance (interval) $d_0$ from the mask 102. Reference numeral 132 denotes such a reflection light from the wafer 103 when it is at a position P2 which is at a distance $d_G$ from the position P1.

The reflected light from the wafer 103 is incident at a point D (or E as the wafer 103 is at the position P2) on the surface of a second Fresnel zone plate 105 provided in a portion of the first object (mask) 102.

The second Fresnel zone plate 105 has an optical function by which the angle of emission of a diffraction light emanating therefrom changes in accordance with the position of incidence of light impinging on the second Fresnel zone plate, like a function of a condensing lens. The second Fresnel zone plate has a focal length $f_M$.

Diffraction light 161 (or 162 as the wafer 103 is at the position P2) of a predetermined order or orders, being diffracted from the second Fresnel zone plate 105, is directed onto the surface of the light receiving means 108. By using the position of the center of gravity of the received light 161 (or 162) on the surface of the light receiving means 108, the gap or interval between the mask 102 and the wafer 103 can be detected by calculation.

In this embodiment, the first Fresnel zone plate 104 has a function simply for deflecting a received light. However, it may have a light converging or diverging function.

The manner how to measure the interval will now be explained in detail. Where the distance from the focal point position of the Fresnel zone plate 105 to the light receiving means is denoted by $l_s$ and the amount of shift of light upon the light receiving means 108 as the wafer position is displaced from the position P1 to the position P2 is denoted by S, then the following relationship is derived:

$$S = DE \cdot (l_s/f_M)$$

where $$AD = 2d_0 \tan\theta 1,$$

$$AE = 2(d_0 + d_G)\tan\theta 1,$$

$$\therefore d_M = DE = AE - AD = 2d_G \tan\theta 1$$

It follows therefrom that:

$$S = [2(l_s/f_M) \cdot \tan\theta 1] d_G$$

The values $l_s$, $f_M$ and $\theta 1$ can be detected in preparation. Thus, by detecting the shift S of light upon the light receiving means, the distance $d_G$ can be determined in accordance with the above equation. Thus, it is possible to determine the interval between the mask and the wafer. In this occasion, where a large value is selected for the distance $l_s$, the magnitude of the shift S to the distance $d_G$ can be made large, such that only a minute amount of gap change can be converted into and detected as an enlarged amount of shift of light.

The position of incidence upon the light receiving means 108 of the light from the second Fresnel zone plate 105, as the wafer 103 is at a desired interval $d_0$, is used as a reference position as seen from the foregoing description. Such reference position can be easily determined in preparation. For example, a suitable means may be used to set a wafer exactly at a predetermined interval ($d_0$) from a mask, and light may be projected from the light source LD. Thus, such position on the light receiving means 108 at which the light from the second Fresnel zone plate 105 impinges may be determined as the reference position. As an example, for the setting of the wafer, a measuring apparatus "TM-230N" (trade name: manufactured by Canon Inc. Japan) may be conveniently used.

In this embodiment, like the FIG. 12 embodiment, the alignment mark is shaped into a hexagonal to assure that the side lobe of the diffraction light goes aside the light receiving means. Fraunhofer diffraction image pattern F and a signal light 161 obtainable in that occasion are shown in part (d) of FIG. 22. Unwanted diffraction light distribution as the projected light 101 irradiates the whole of the zone plate 104 and then the whole of the zone plate 105 is such as illustrated, and it is seen that the unwanted diffraction light is not incident on the signal detecting zone 108a of the light receiving means 108. In this embodiment, any Fraunhofer diffraction image formed by diffraction light of any order other than the zero-th order diffraction by the patterns 104 and 105 goes far away from the signal detecting zone 108a. Therefore, such component is not illustrated in the drawing. While a portion of the side lobe may reache the light receiving means 108, the signal detecting zone can be easily set to exclude that part of the light receiving means 108.

FIG. 23 is a schematic representation, explicating a major portion of an eleventh embodiment of the present invention. More specifically, part (a) of FIG. 23 is an x-z section, part (b) is a y-z section, part (c) is a plan view in the direction of z axis, and part (d) is an illustration showing the relationship between a light receiving means and diffraction light as seen in the plane containing the surface of the light receiving means. Like the FIG. 22 embodiment, this embodiment is concerned with a gap measuring method and apparatus. However, Fresnel zone plate 104 and 105 used in this embodiment each has a rectangular shape. Further, in order to avoid reception by a light receiving means 108 of a Fraunhofer diffraction image of zero-th order diffraction light from the Fresnel zone plates 104 and 105, the angle of emission of light from the Fresnel zone plate 105 as well as the position of the signal detecting zone 108a of the light receiving means, for receiving the light from the Fresnel zone plate 105, are adjusted in a specific manner as illustrated. This assures that, as in the FIG. 21 embodiment, the signal detecting zone 108a of the light receiving means 108 can be stepped aside from the side lobe of the Fraunhofer diffraction image F. This is best seen in part (d) of FIG. 23.

FIG. 24 is a schematic representation, explicating a major portion of a twelfth embodiment of the present invention, wherein part (a) of FIG. 24 is an x-z section, part (b) is a y-z section, part (c) is a plan view in the direction of z axis, and part (d) is an illustration showing the relationship between a light receiving means and diffraction light as seen in the plane containing the light receiving means. Like the FIG. 23 embodiment, this embodiment is concerned with an interval measuring method and apparatus. In this embodiment, however, the direction of advancement of the signal light 101 is adjusted so as to ensure that a Fraunhofer diffraction image of zero-th order diffraction light from Fresnel zone plate 104 and 105 do not enter the signal detecting zone 108a of the light receiving means 108. As seen from the drawing, the light receiving means having the signal detecting zone 108a is provided at a site which is in a direction perpendicular to a side of the Fresnel zone plate 104 or 105 parallel to the x direction. The light 101 is incident upon the Fresnel zone plate with an inclination with respect to a side along the x direction. This assures that the position of the Fraunhofer diffraction image F is deviated from the signal detecting zone 108a, as best seen in part (d) of FIG. 24.

FIG. 25 is a schematic representation, explicating a major portion of a thirteenth embodiment of the present invention, wherein part (a) is an x-z section, part (b) is a y-z section, part (c) is a plan view in the direction of z axis, and part (d) is an illustration showing the relationship between a light receiving means and diffraction light as seen in the plane containing the light receiving means. As compared with the FIG. 24 embodiment, in this embodiment the direction of advancement of an emanating light as well as the position of the signal detecting zone are adjusted additionally. More particularly, the optical arrangement is set so that both the projection components upon the mask 102 surface of the direction of incidence of light and the direction of emission of the light to the signal detecting zone are inclined at the same angle with respect to a side extending in the x direction. The relationship between a produced Fraunhofer diffraction image F and the signal detecting zone 108a in that case is such as illustrated in part (d) of FIG. 25.

Figure 26A:
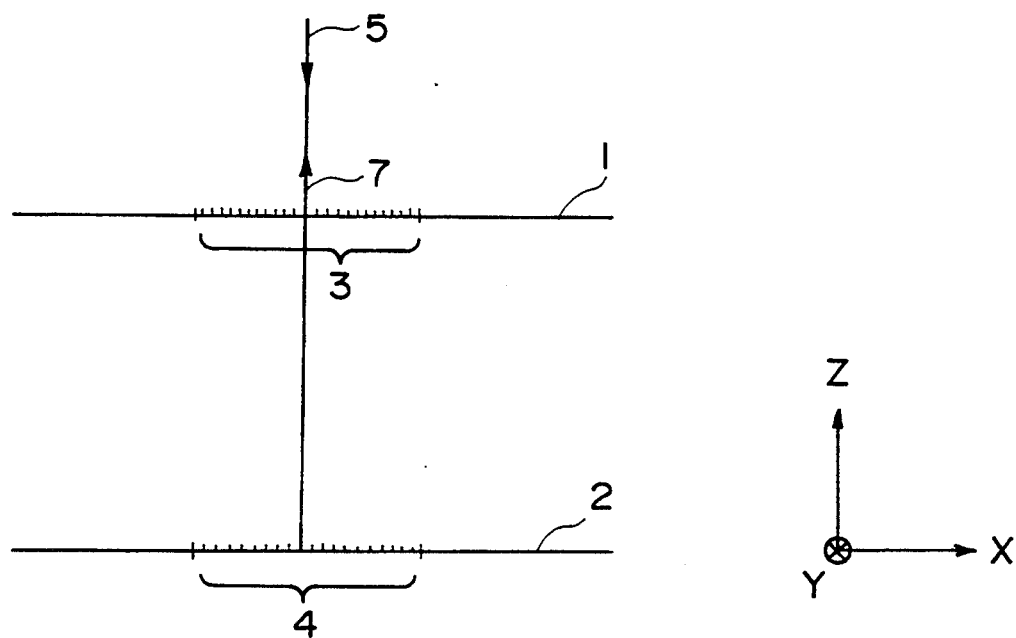
Figure 26B:
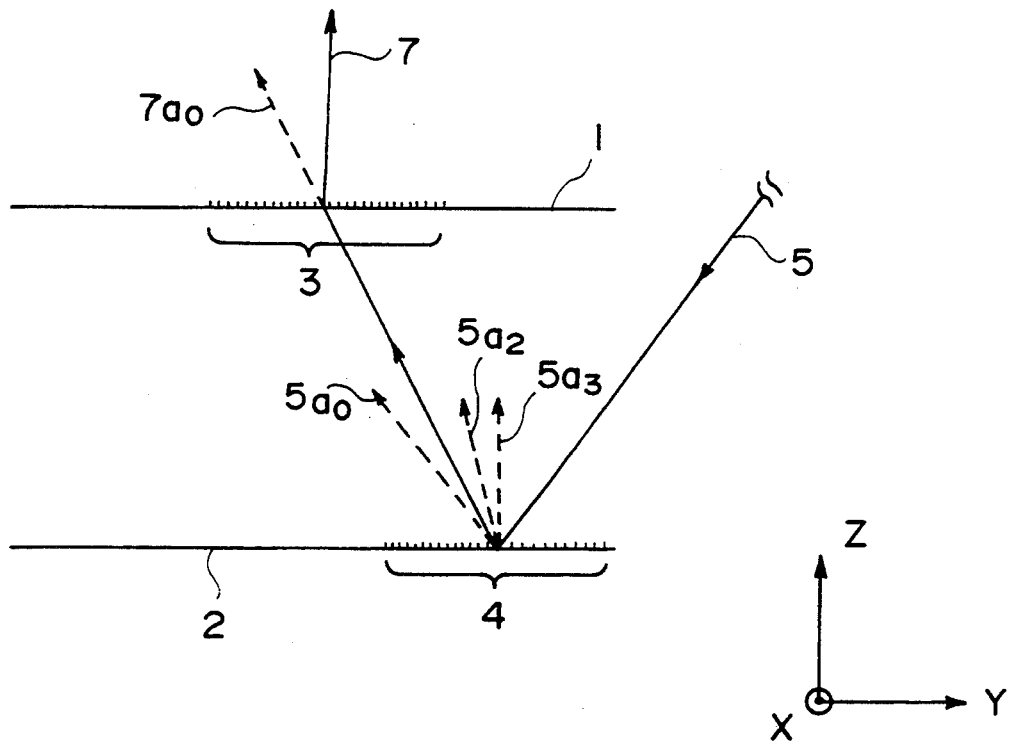

FIGS. 26A–26D are schematic representations, for explicating a major portion of a fourteenth embodiment of the present invention. More specifically, FIG. 26A is an x-z section, FIG. 26B is a y-z section, FIG. 26C is a plan view in the direction of z axis, and FIG. 26D is an illustration showing the relationship between a detector 9 and diffraction light as seen in the plane containing the detector 9 surface. Like the FIG. 8 embodiment, in this embodiment two physical optic elements 3 and 4 each is disposed with inclination with respect to a scribe line 21 or 22. In this embodiment, however, a projected light 5 first impinges on a physical optic element 4, and first order diffraction light emanating therefrom impinges on the other physical optic element 3 to produce an emanating diffraction light 7. Reference characters $5a_0$, $5a_2$ and $5a_3$ denote reflective diffraction lights of zero-th order, second order and third order at the physical optic element 4, respectively. Reference character $7a_0$ denotes nondiffracted transmission light at the physical optic element 3. Each of the physical optic elements 3 and 4 of rectangular shape has sides each being inclined at an angle 45 degrees with respect to the direction of a scribe line. As a result, there can be established a positional relationship between Fraunhofer diffraction images and the signal detecting zone 9a of the detector 9 surface such as illustrated in FIG. 26D, whereby it is possible to prevent the side lobe or lobes from entering the signal detecting zone 9a. In FIG. 26D, illustrated Fraunhofer diffraction images are, in an order from the below, one produced by second order diffraction light and one produced by third order diffraction light at the physical optic element 4, these diffraction images being depicted as unwanted diffraction lights closest to the detector 9 surface. As described, the concept of the present invention is applicable, with similar advantageous effects, to a system wherein light is projected first upon a diffraction grating on the wafer side.

Figure 27A:
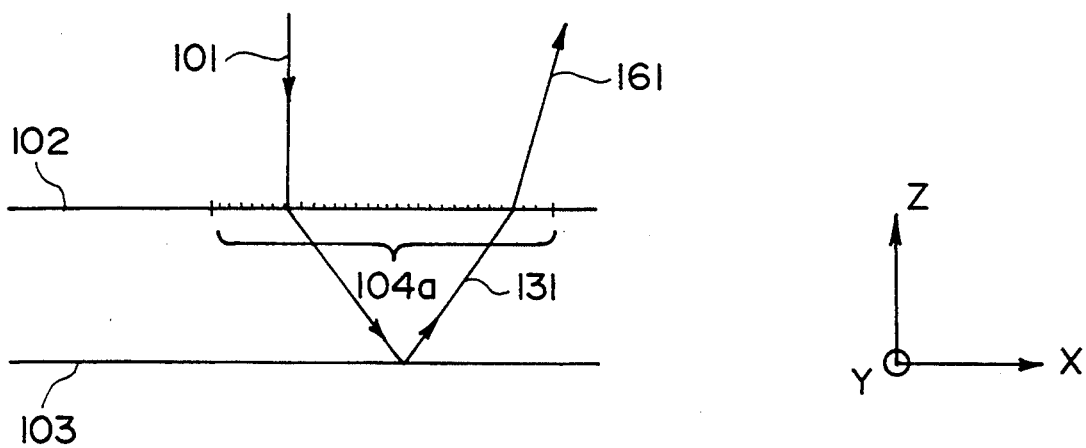
Figure 27B:
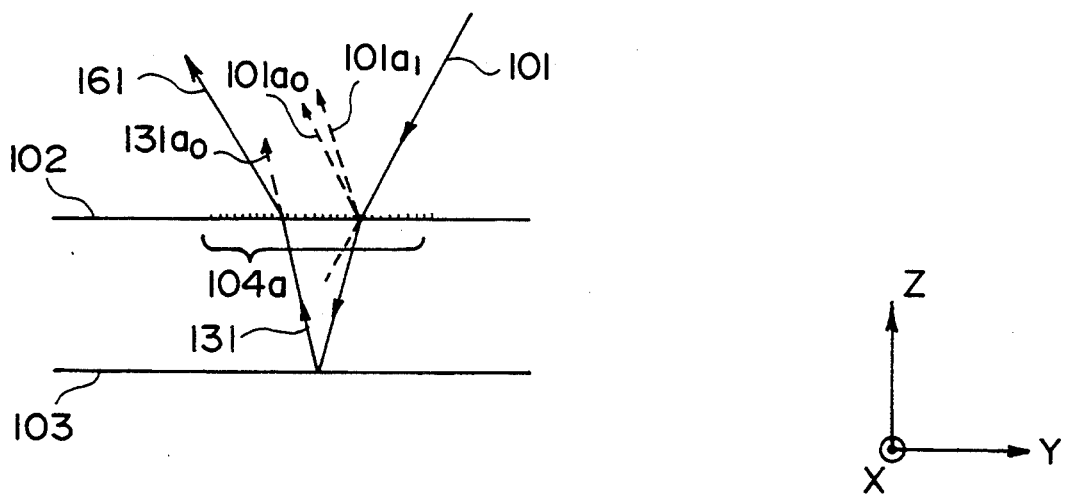

FIGS. 27A–27D are schematic representations, explicating a major portion of a fifteenth embodiment of the present invention, wherein FIG. 27A is an x-z section, FIG. 27B is a y-z section, FIG. 27C is a plan view in the direction of z axis, and FIG. 27D is an illustration showing the relationship between a light receiving means and diffraction light as seen in a plane containing the light receiving means. Like the FIG. 23 embodiment, this embodiment is concerned with an interval measuring method and apparatus. In this embodiment, however, a projected light 101 is diffracted by a diffraction grating 104a provided by straight line patterns of regular intervals. The diffracted light is reflected by a wafer 103 surface and, then, it is diffracted again by the same diffraction grating 104a toward a light receiving means 108. Such an emanating light 161 displaces upon the light receiving means 108 surface in accordance with a change in the gap between a mask 102 and the wafer 103. The gap measurement can be made by detecting the position of incidence of the light 161 upon the light receiving means 108. Reference characters $101a_0$ and $101a_1$ denote zero-th order reflective diffraction light and first order reflective diffraction light produced by the grating 104a as a result of reception of the projected light 101. Reference character $131a_1$ denotes non-diffracted transmission light (zero-th order transmissive diffraction light) produced by the grating 104a as a result of reception of light 131 reflected from the wafer 103. The grating 104a has an outer peripheral configuration of rectangular shape having sides extending in parallel to the x and y directions, respectively. The projected light 101 goes along a path which is included in the y-z plane. The light receiving means 108 has a signal detecting zone 108a which is disposed to receive the emanating light 161, emitted from the grating 104a in a direction which is not included in the y-z plane. With this arrangement, it is possible to avoid any side lobe from impinging on the signal detecting zone 108a, as best seen in FIG. 27D. As described, the present invention is applicable also to a system wherein only a single diffraction grating is used.

Figure 28A:
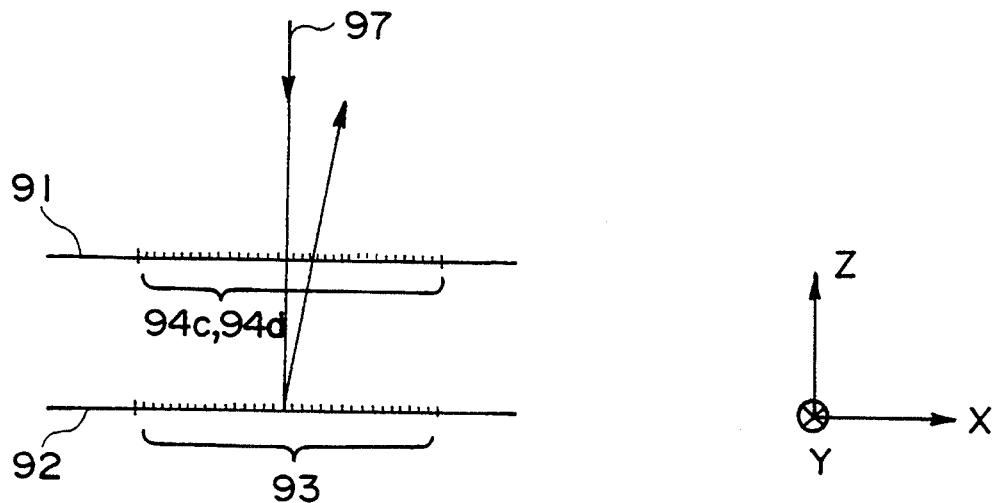
FIGS. 28A-28D are schematic representations, respectively, explicating a major portion of a sixteenth embodiment of the present invention.
Figure 28B:
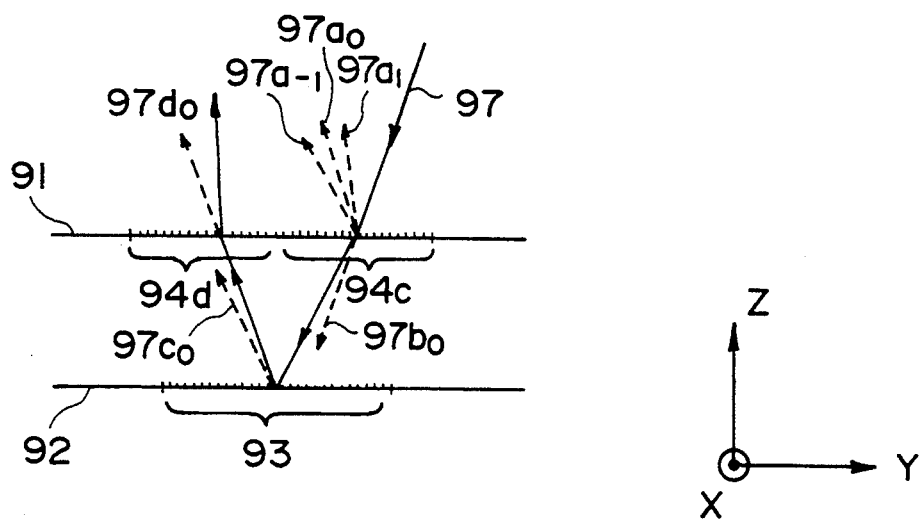
Figure 28C:
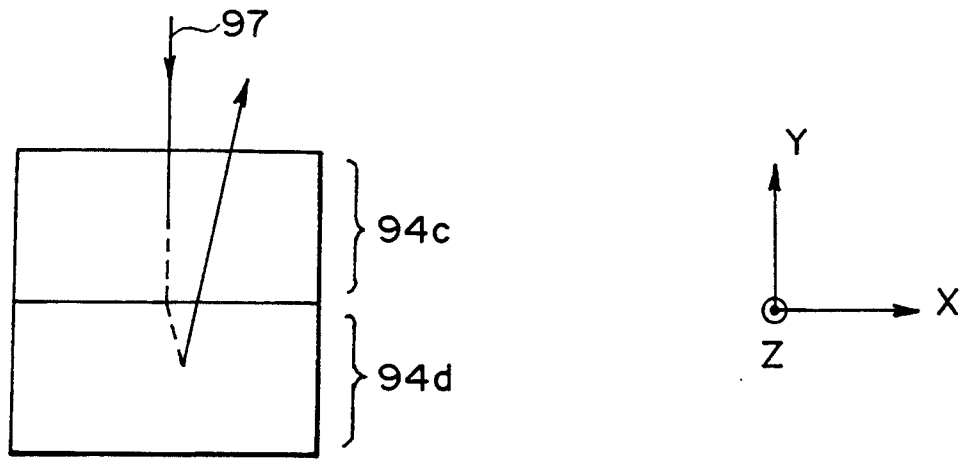
Figure 28D:
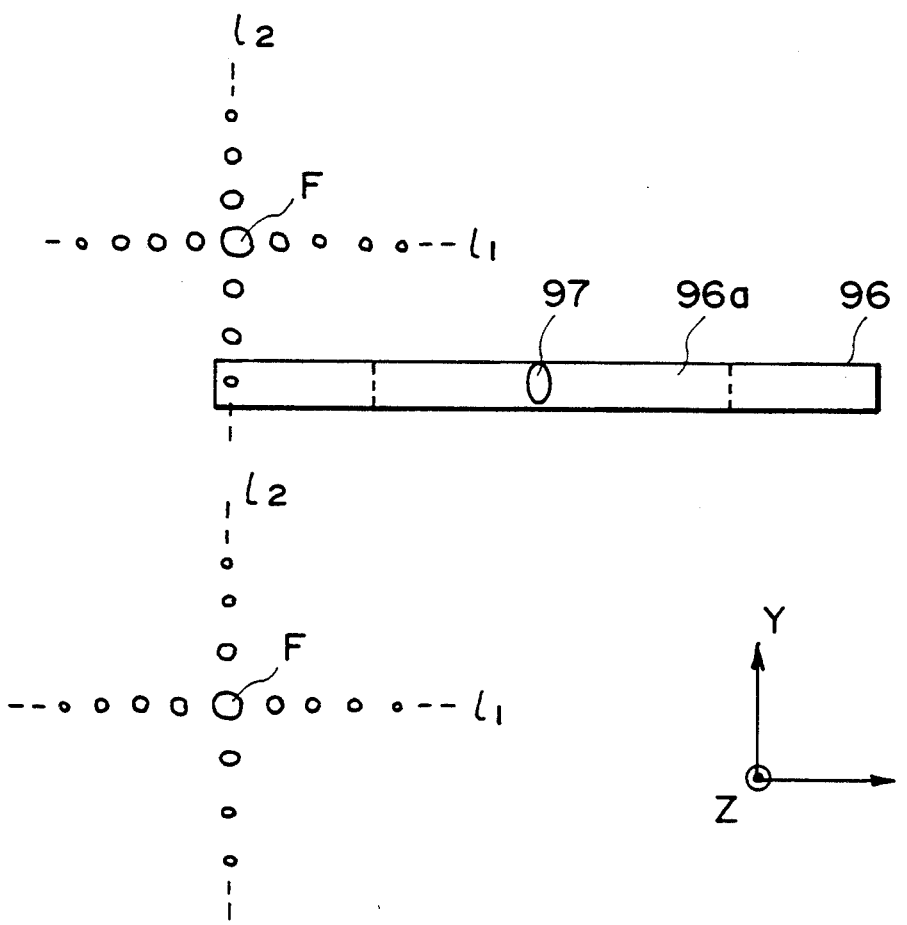

FIGS. 28A–28D are schematic representations, explicating a major portion of a sixteenth embodiment of the present invention, wherein FIG. 28A is an x-z section, FIG. 28B is a y-z section, FIG. 28C is a plan view in the direction of z axis, and FIG. 28D is an illustration showing the relationship between a sensor and diffraction light as seen in the plane containing the sensor surface. Like the FIG. 14 embodiment, this embodiment is concerned with a positional deviation detecting method and apparatus. In this embodiment, however, a mask 91 is provided with two grating lenses 94c and 94d. Alignment light 97 is projected upon the grating lens 94c, and first order diffraction light caused thereby goes as an alignment light 97 to a wafer 92 and it is diffracted again by a grating lens 93 provided in a portion of the wafer 92. First order diffraction light produced by the grating lens 93 is diffracted again by the grating lens 94d, and first order diffraction light caused at this time and emanating from the grating lens 94d is directed as an emanating alignment light to the sensor 96. The path of such an alignment light before the light impinges on the grating lens 93, is included in the y-z plane. However, by the grating lens 93, it is deflected in a direction which is not included in the y-z plane. Each of the grating lenses 94c and 94d has a rectangular shape having sides extending along the x and y directions, respectively. Further, the optical arrangement is set to provide an emanating alignment light as described. Also, signal detecting zone 94a of the sensor 96 is disposed to receive the emanating alignment light, as seen in FIG. 28D. By this, it is possible to avoid any side lobe of Fraunhofer diffraction images F of diffraction light from the grating lenses 94c and 94d, from entering the signal detecting zone 96a. In FIG. 28D, the illustrated Fraunhofer diffraction images are, in an order from the below, one produced by zero-th order diffraction light and one produced by first order diffraction light at the grating lenses 94c and 94d. As described, the present invention is applicable with similar advantageous effects, to such a system wherein three or more diffraction gratings are used or wherein light having been diffracted by three times is used for the position detection.

In the embodiments described hereinbefore, the inclined setting of straight sides of a mark, the inclined setting of direction of projection of light upon a mark and the inclined setting of the direction to a detecting means, all for preventing unwanted diffraction light from entering a signal detecting portion, may be suitably adopted singly or in combination in place of the disclosed forms.

Figure 29A:
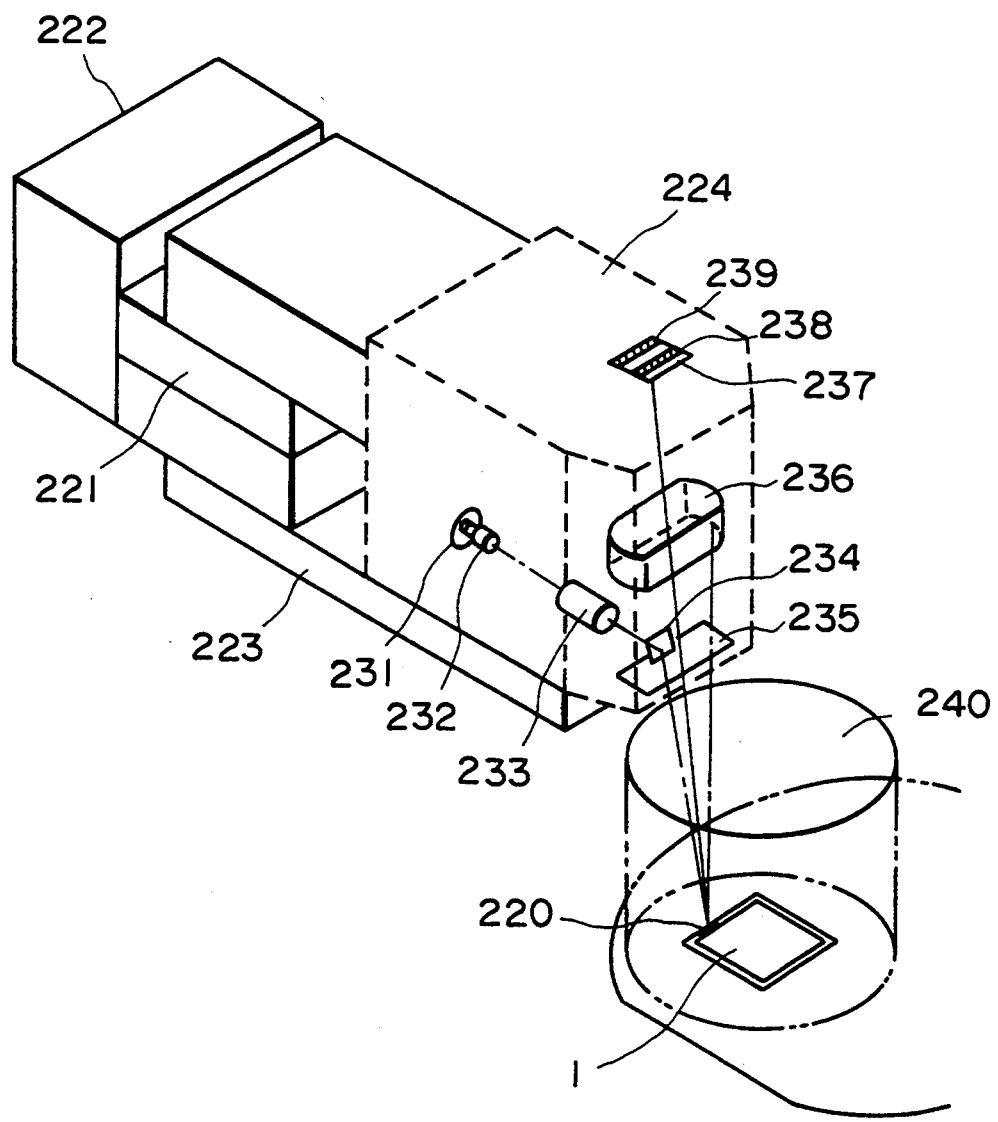
FIGS. 29A-29C are schematic representations, respectively, showing a seventeenth embodiment of the present invention.
Figure 29B:
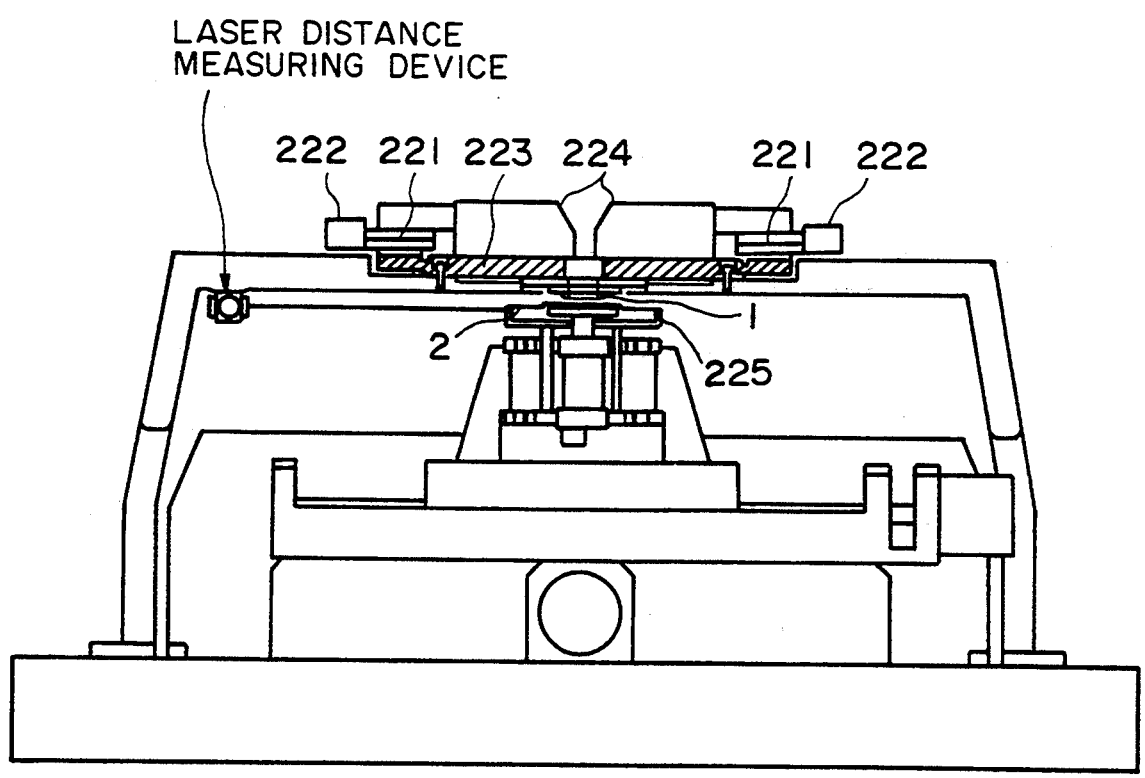
Figure 29C:
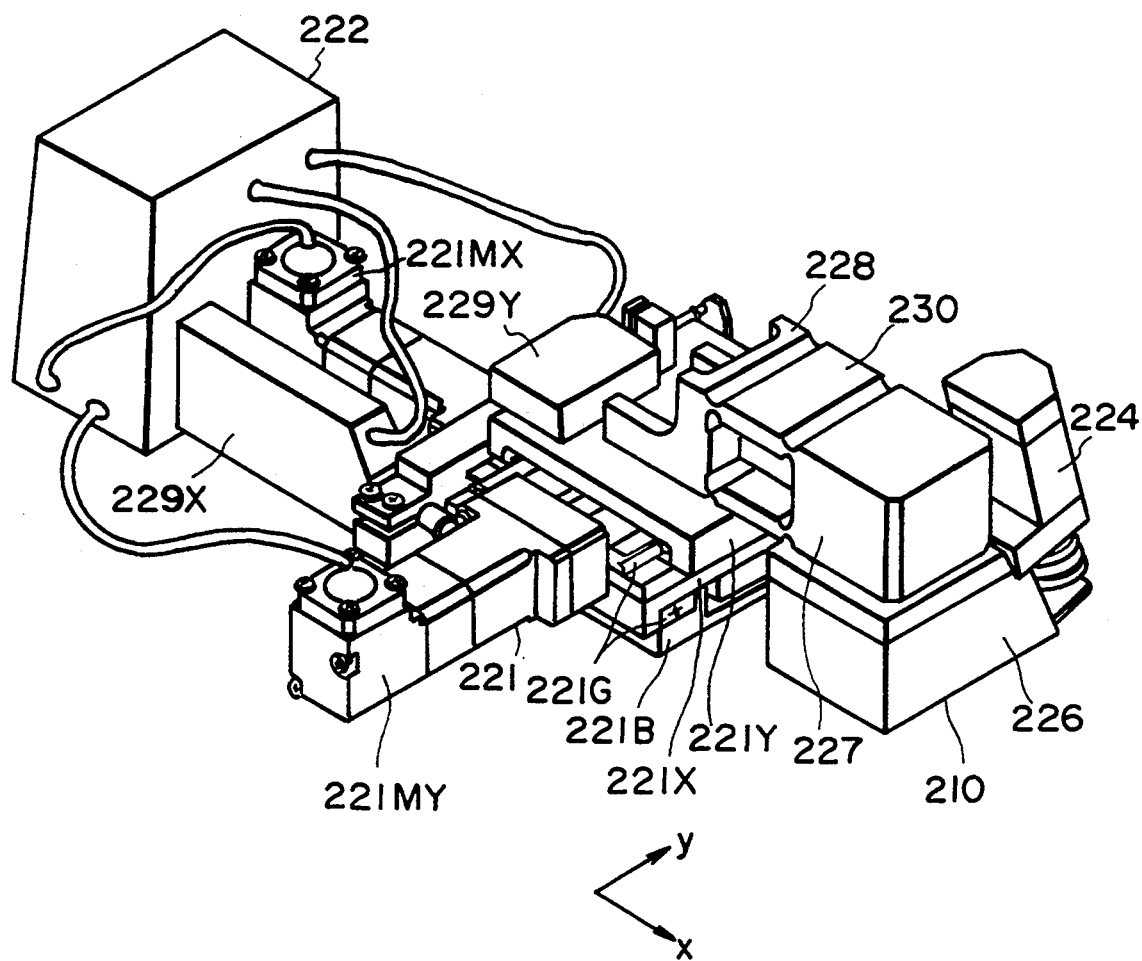
Figure 30A:
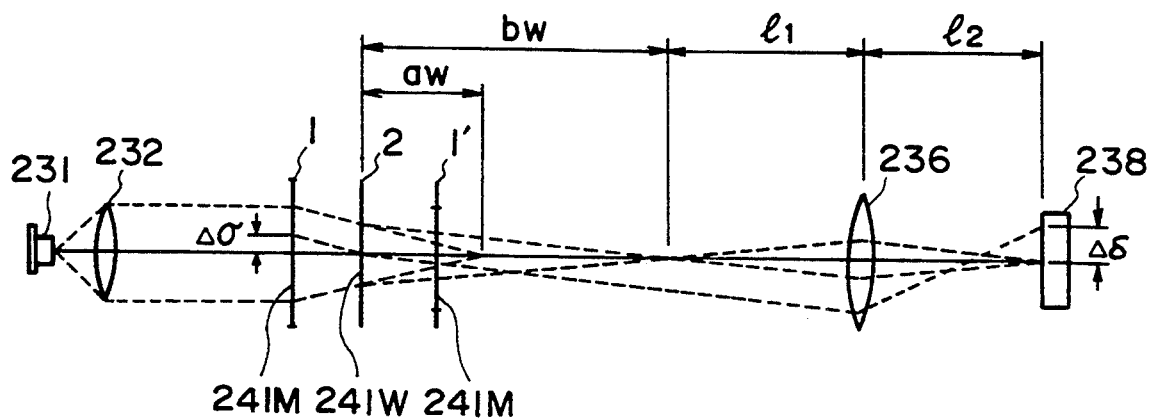
FIGS. 30A and 30B are schematic representations of a positional deviation detecting system and an interval measuring system, respectively, of the seventeenth embodiment.

FIGS. 29A–29C are schematic views of a seventeenth embodiment wherein the invention is applied to an exposure apparatus for manufacture of semiconductor devices. FIG. 30A shows in an unfolded view the optical paths illustrated in FIG. 29A.

In this embodiment, a light source 231 produces a wave such as an electromagnetic wave or acoustic wave, for example. Hereinafter, this is called a "light". The light is collimated by a collimator lens 232 into a parallel light and, after passing a projecting lens 233 and a half mirror 234, the parallel light impinges, in an inclined direction, a first physical optic element 241M which may comprise, for example, a grating lens (one of Fresnel zone plates), provided on a first object 1 (mask M, for example).

The first physical optic element 241M has a converging function and emits a reflection light in a direction (−Z direction) of a normal to the first object 1. The emitted light impinges on a second physical optic element 241W which may comprise a grating lens, provided on a second object 2 (wafer W, for example) spaced from a predetermined distance from the first physical optic element 241M. The second physical optic element 241W has a diverging function and emits a light toward an alignment head 224. The emitted light is converged by a condensing lens 236 on, a detection surface of a detector 238. Output signal of the detector 238 is processed to obtain positional deviation between the mask 1 and the wafer 2 in a plane parallel to the mask and the wafer.

The mask 1 and the wafer 2 are held with a gap, within a predetermined range, maintained therebetween.

In this embodiment, the wafer 2 is moved for the alignment. However, a mask chuck moving mechanism may be provided to move the mask 1 for this purpose.

Hereinafter, for convenience, the first physical optic element 241M will be referred to as a "grating lens 241M" for the mask, while the second physical optic element 241W will be referred to as a "grating lens 241W" for the wafer. Also, the first object will be referred to as a "mask", and the second object will be referred to as a "wafer".

In the present embodiment, as described, the wafer 2 is provided with an alignment pattern which is formed by a grating lens (one of Fresnel zone plates) having a predetermined focal length, and a light for alignment inputted with inclination to the mask 1 surface from the alignment head 224 is deflected in the direction (−Z direction) of the normal to the mask 1 surface and is focused at a predetermined position (e.g., Z=−187.0 microns).

In the present embodiment, the angle $\alpha$ of incidence of the light, inputted with inclination, on the mask 1 surface is preferably within a range of:

$$10 < \alpha < 80$$

The alignment pattern 241W on the wafer 2 comprises an off-axis type grating lens having a pattern which is asymmetric with respect to the Z axis. As an example, it is designed to provide a focal length of 217.0 microns, and is adapted so that the convergent (divergent) light transmissibly diffracted by the grating lens of the mask 1 is directed toward the alignment head.

Here, the alignment light is influenced by the lens function of the grating lens and is inputted to a photoreceptor 238 provided within the alignment head 224. In the first embodiment, the mask and the wafer are going to be aligned in respect to the direction of a scribe line in which the pattern is formed.

If in this structure the second object is laterally shifted (i.e. along the surface of the first or second object) by $\Delta\delta$ relatively to the first object, there occurs a change in the angle of emission of the emanating light, like a case where the coaxial relationship of lenses of an optical system is destroyed. The change in the angle of emission of the light causes corresponding shift of the center of gravity of a spot of the focused light on the detection surface 9. When the angle of emission is small and if the mask 1 and the wafer 2 are mutually deviated by an amount $\Delta\sigma$ in a direction parallel thereto, and where the distance from the wafer 2 to the point of convergence of the light reflected by the grating lens 241M of the mask 1 is denoted by aw while the distance to the point of convergence of the light passed through the grating lens 241W of the wafer 2 is denoted by bw, then, the displacement $\Delta\delta$ of the center of gravity of the light spot upon the detection surface 9 can be given by the following equation:

$$\Delta\delta = \Delta\sigma \times (bw/aw + 1) \quad (3)$$

Namely the displacement $\Delta\delta$ of the center of gravity is of an amount magnified at an enlarging magnification of "b/a+1".

If, as an example, a=0.5 mm, and b=50 mm, the deviation $\Delta\delta$ of the center of gravity is being magnified by 101 (one hundred and one) times larger, in accordance with equation (3).

It will be readily understood from equation (1) that the deviation $\Delta\delta$ of the center of gravity and the positional deviation $\Delta\sigma$ are in a proportional relationship. If the detector has a resolution of 0.1 micron, a position resolution of an order of 0.001 micron is obtainable with regard to the positional deviation $\Delta\sigma$.

More specifically, any positional deviation between the mask and the wafer can be detected in the following manner:

First, at the time of mask setting, a reference position is determined. For this reference position, the position of center of gravity of light on the sensor, as assumed when the mask and the wafer have no relative positional deviation, is selected. The determination of the reference position may be made on the basis of trial printing. Then, in the actual position detecting operation, any error in the position of the center of gravity of light from the reference position, in respect to the X-direction, in this embodiment, is measured. From the thus measured value and from the aforementioned proportional relationship, the relative positional deviation between the mask and the wafer can be determined.

In the present embodiment, the second object is moved in accordance with the positional deviation $\Delta\sigma$, obtainable by signal processing through an adjusting means (to be described later), whereby the first and second objects can be aligned with each other at high precision.

Here, the term "center of gravity of light" means such a point that, when in the cross-section of the light a position vector of each point in the section is multiplied by the light intensity of that point and the thus obtained products are integrated over the entire section, the integrated value has a "zero vector". As an alternative, the position of a peak point in the light intensity may be used as a representative.

Examples of a light source usable in this embodiment are: a light source such as, for example, an He-Ne laser, a semiconductor laser or otherwise that can provide light of high coherency; a light source such as, for example, a light emitting diode (LED), an Xe lamp (provided that a resist is insensitive to this), an Hg lamp or otherwise, that can provide light of low coherency.

Next, description will be made of measurement of the interval between the mask 1 and the wafer 2 in this embodiment and the subsequent alignment of them in a vertical direction, particularly with reference to a mask lens $A^2F$ method, by way of example.

Figure 31:
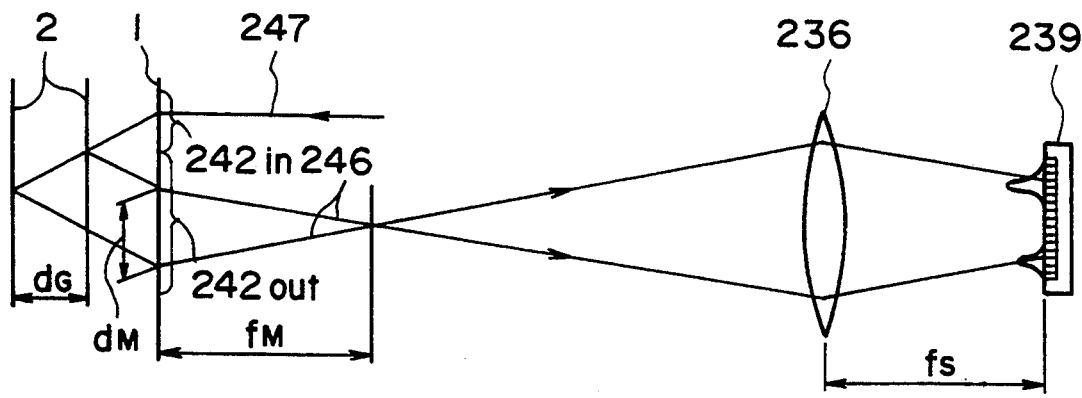
FIG. 31 is a schematic representation, illustrating the principle of interval measurement in accordance with the seventeenth embodiment.

The mask lens $A^2F$ method is a method wherein a grating or a grating lens for light reception and emission is prepared on a mask surface, and details of it are such as follows:

As shown in FIG. 31, light 247 incident on a first pattern $242_{in}$ on the first surface (mask) 1 goes to a second surface (wafer) 2 with a predetermined angle defined with respect to a normal to the second surface 2. The light is specularly reflected by the second surface 2 and goes through a second pattern $242_{out}$ on the first surface 1. Here, the position (on the second pattern $242_{out}$) of passage of the light therethrough changes in accordance with the spacing between the first and second objects 1 and 2 (for a change $d_g$ in the spacing, a positional deviation $d_M$).

While the second pattern $242_{out}$ serves to direct the emanating light 246 toward a light spot position detecting sensor 239 (for the interval measurement), in addition to this, it has a function like that of a lens by which the angle of deflection for the emanating light is changeable with the position of incidence of the light upon the second pattern $242_{out}$ (focal length $f_M$).

Figure 32A:
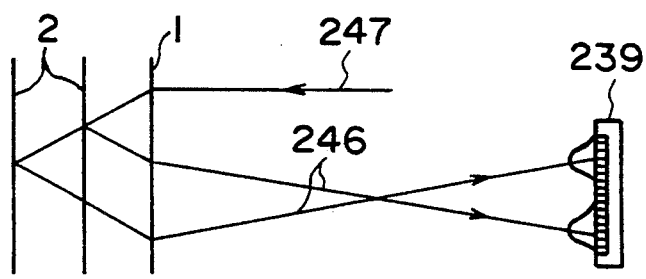
FIGS. 32A and 32B are schematic representation, illustrating other examples of interval measurement, in accordance with the seventeenth embodiment.
Figure 32B:
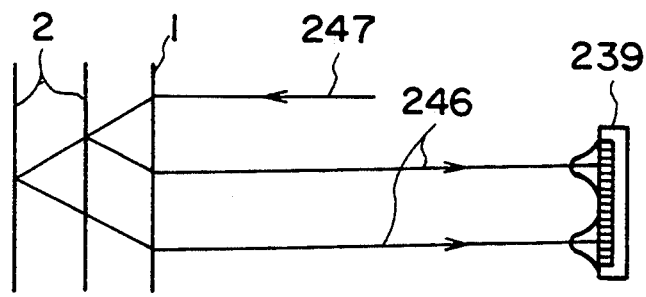

Namely, in principle, the detector 239 can detect the emitted light 246 in the manner as illustrated in FIG. 32A. However, as illustrated in FIG. 32B, the angle of deflection for the light may be constant.

In other words, if, for example, a one-dimensional light spot position detecting sensor is placed at an appropriate position, it is possible to detect a change in the position of the light and, therefore, the described method applies directly. If, however, a light receiving lens 236 is used such as shown in FIG. 31, the following merits result: That is, where light emanates somewhat divergently in the sense of physical optics and it tends to have an increasing beam diameter, it is possible to collect the light by the light receiving lens to form on the sensor 239 a sharp spot of high energy density. If the sensor 239 is set at the position of the focal point of the light receiving lens 236, having a focal length fs, then the system can detect only the angle of the light. Thus, the light receiving lens and the sensor can be combined in to an integral structure, and any positional deviation in a direction perpendicular to the optical axis of the lens does not affect the detection. However, even when it is not possible to set the sensor at the focal point position, for any reason, the structure is sufficiently practical provided that the effect of the positional deviation is in a small range that can be disregarded. Therefore, it is not necessary to limit the sensor position to the focal point position of the light receiving lens.

On the other hand, in FIG. 31 the amount of displacement S of the spot on the sensor surface, for a unit change in the spacing (interval) can be given by:

$$S=(f_s/f_M)\cdot d_M \quad (4)$$

Where the angle of the light emanating from the first pattern $242_{in}$, defined with respect to a normal to the second surface 2, is denoted by $\theta1$, then the displacement S of the spot resulting from a change $d_G$ in the interval, from a reference interval, can be expressed as follows:

$$S=2d_G\cdot(f_s/f_M)\tan\theta1 \quad (4')$$

The mask and the wafer can be set at the reference interval, by using a separate known type interval measuring means. Thus, when the mask and the wafer are at the reference interval, the position of the center of gravity of light upon the sensor surface is detected and memorized, in preparation. In the actual interval detecting operation to be made just before the exposure operation, for example, any error S in the position of the center of gravity of the light spot, from the reference position, is measured and the thus measured value is substituted into equation (4') to determine $d_G$. From the thus determined error with respect to the reference interval, the current interval between the mask and the wafer can be determined.

In accordance with the principle described hereinbefore, the absolute amount of the spacing between the mask and the wafer can be measured. Therefore, when a wafer is supplied after the mask setting and if the wafer is set at an interval 100 microns which is larger than a desired interval 30 microns to be set, it is possible to detect with high precision the value of mask-to-wafer gap of 100 microns such that, on the basis of a measured value, they can be set at the desired mask-to-wafer interval 30 microns only by a single operation. Accordingly, high-speed gap (spacing) setting is ensured.

The components of the present embodiment will now be explained in detail, with reference to FIGS. 29A–29C.

The light beam emanating from the alignment pickup head 224 (casing for accommodating therein a light source, sensor means and the like) is projected on a mark setting area 220 of each of the mask and the wafer 1 and 2, and the reflected or diffracted light goes back to the alignment pickup head 224. The alignment pickup head 224 is mounted to a stage 221, so that it can be moved two-dimensionally in accordance with the site of the alignment region. This movement is controlled by a stage controller 222. Here, the stage 221 is guided by a super-flat base plate 223, so as not to produce pitching and yawing. The stage controller 222 operates, at the time of initiation of the alignment and interval control, to actuate the stage 221 to move the head 224 to a position, memorized in preparation, for illumination and detection of evaluation marks 220 of the mask and the wafer. FIGS. 29B and 29C schematically show the stage 221 and a moving mechanism including components around the stage.

The moving mechanism will now be explained in greater detail. FIG. 29C shows details of the stage and the stage controller. The alignment pickup head 224 is attached to a clamper 227 which is provided to press, against a super-flat base plate 223 at a constant pressure, a super-flat surface 210 of a support 226. The pickup head 224 is mounted to the upper part of a main frame of the alignment device, through the super-flat base 223. The clamper 227 is coupled through a parallel leaf spring means 230 to a movable support 228 which is provided on a two-dimensionally movable stage 221. The stage 221 comprises a base 221b, an X-direction slider 221X, a Y-direction slider 221Y, a guide means 221G for guiding the X-direction and Y-direction sliders, and drive sources 221MX and 221MY provided on the base 221B, for moving the sliders 221X and 221Y in the X direction and Y direction, respectively. The operation of these drive sources MX and MY is controlled by a controller 222 so as to shift the head 224 in these directions, for positioning the same at a desired site. The amount of movement of each stage can be measured precisely by means of laser distance measuring devices 229X and 229Y, the data obtained by the measurement being inputted to the controller 222. In response, the controller 222 detects the current position of the head 224 and supplies an instruction signal to each of the drive sources MX and MY so that the head 224 is displaced to the desired site. In this manner, the position of the head 224 is controlled precisely. After the head is moved to the position for detection, measurement of any lateral deviation and interval detection are executed in the manner described hereinbefore. In accordance with the result of measurement and detection, the wafer stage 225 is moved in an appropriate direction or directions to correct the lateral deviation and the error in the interval, whereby the alignment and interval control are accomplished. If necessary, the above-described operation is repeated.

Figure 29D:
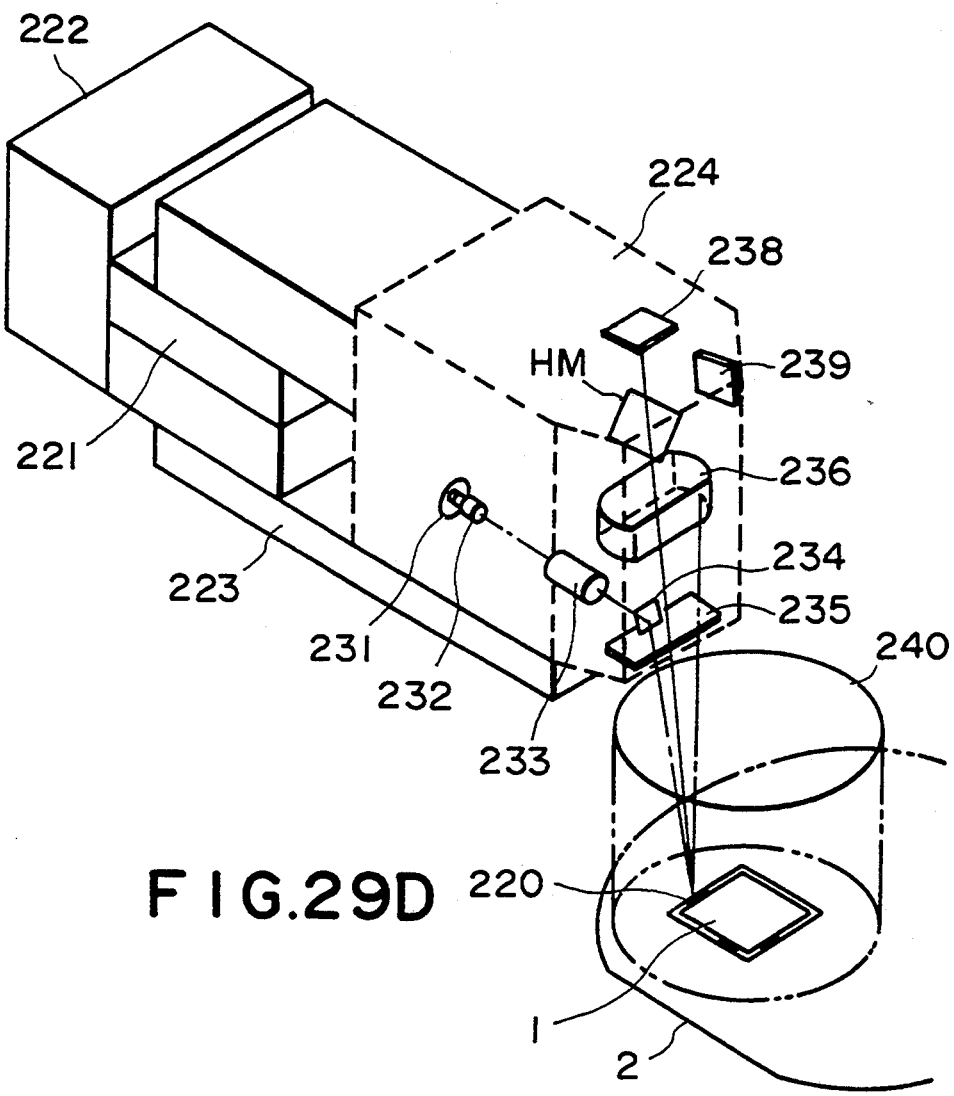
FIG. 29D shows a modified form of an optical system usable in the seventeenth embodiment.

The alignment pickup head 224 accommodates therein a lateral deviation detecting system, an interval detecting system, a light projecting and receiving system and the like. Light beam emitted by a light source 231 (more particularly, a semiconductor laser in this embodiment) is projected through a collimator lens 232, a projecting lens 233 and a projecting mirror 234, to an evaluating mark 220. The light beam emanating from the mark is directed by a detection lens 236 to the detection system and impinges on a light receiving element 238 for lateral deviation detection and a light receiving element 239 for interval detection, provided on the same plane of a base plate 237 surface, whereby respective signals are obtained. The alignment pickup head 224 is equipped with a light projecting and receiving window 235 to which a filter is attached to block any of the light from an exposure light source. The light receiving elements 238 and 239 may be provided on separate planes, such as illustrated in FIG. 29D, with the respective lights being guided by a half mirror HM. In the FIG. 29D example, a lens 236 is used in common for the positional deviation detecting light and the interval detecting light, such that each of these lights produces good intensity concentration (focusing) upon a corresponding sensor 238 or 239. Thus, with this structure, the whole optical system can be reduced in size.

Figure 33:
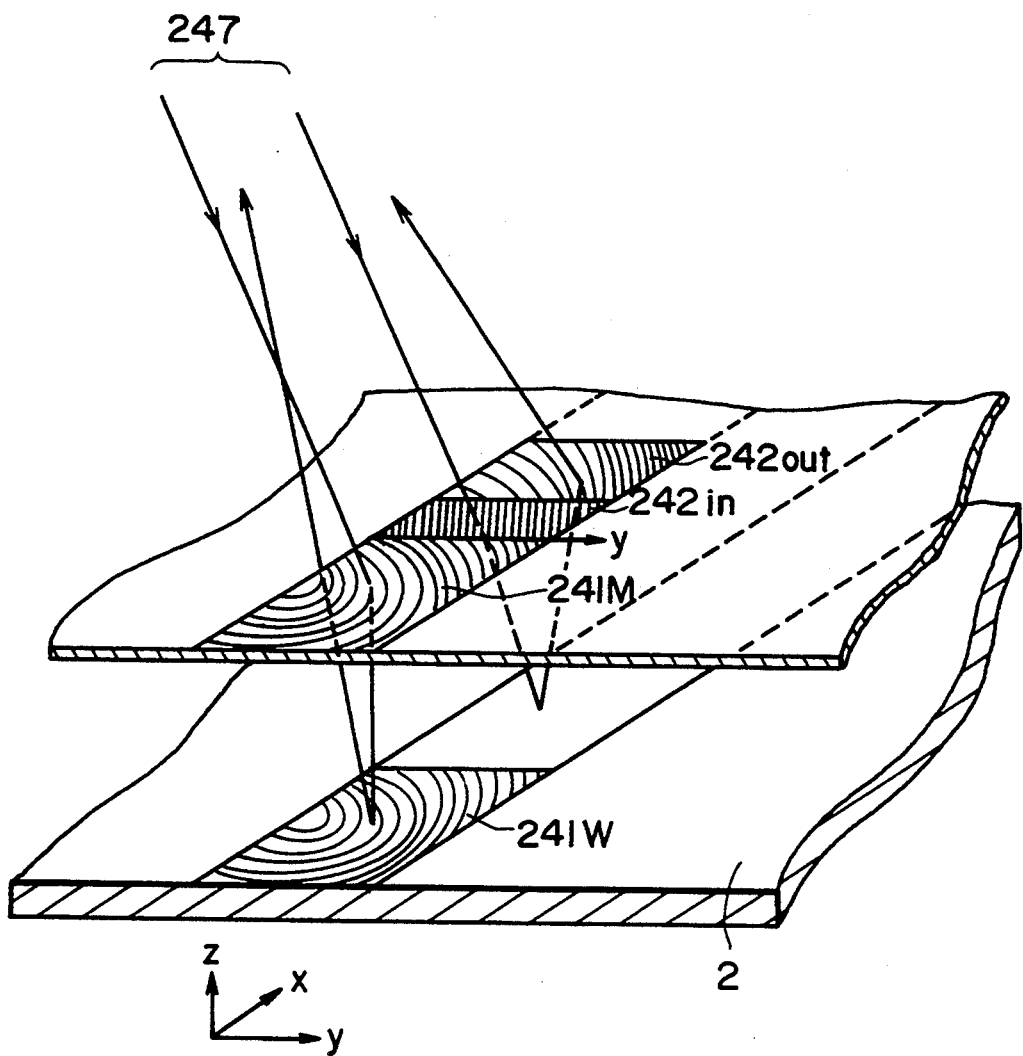
FIG. 33 is a perspective view, showing marks provided on a mask and a wafer, in accordance with the seventeenth embodiment.

As for the evaluation mark means, as illustrated in FIG. 33, the mask is provided with a mark 241M for the lateral deviation detection and marks $242_{in}$ and $242_{out}$ for the interval measurement, which marks are juxtaposed as illustrated. On the other hand, the wafer is provided with a mark 241W at a position corresponding to the mark 241M.

In the present embodiment, the device is designed so that the projected light 247 is in the form of a parallel light as it is incident on the evaluation mark, and is projected at the same time on the lateral deviation detecting mark 241M and the interval measuring mark $242_{in}$, both of which is at a light projection region.

In the lateral deviation detecting system, the mark 241M on the mask 1 surface has a converging function and, through the wafer mark 241W having a function for imaging the point of convergence at a position optically conjugate with the detection surface, any lateral deviation is magnified on the detection surface and is detected. The light receiving lens 236 provides a relay lens system for relaying the imaging point formed by the wafer mark 241W to the lateral deviation detecting light receiving element 238. FIG. 30A shows this system in respect to the lens power arrangement.

On the other hand, the interval measuring system uses a mask lens $A^2F$ method described hereinbefore. The incident parallel light goes through the receiving mark $242_{in}$ for the interval measurement, provided on the mask, and is diffracted and deflected by this mark. Then, the light is specularly reflected by the wafer 2 surface (specular reflection surface) to a particular area on the emitting mark $242_{out}$ on the mask, which area corresponds to the mask-to-wafer interval. Then, it goes out the mask surface at an angle corresponding to the interval, and is directed to the interval measuring light receiving element. The position of incidence of the light upon this light receiving element 239 is changeable in accordance with equation (4).

Figure 30B:
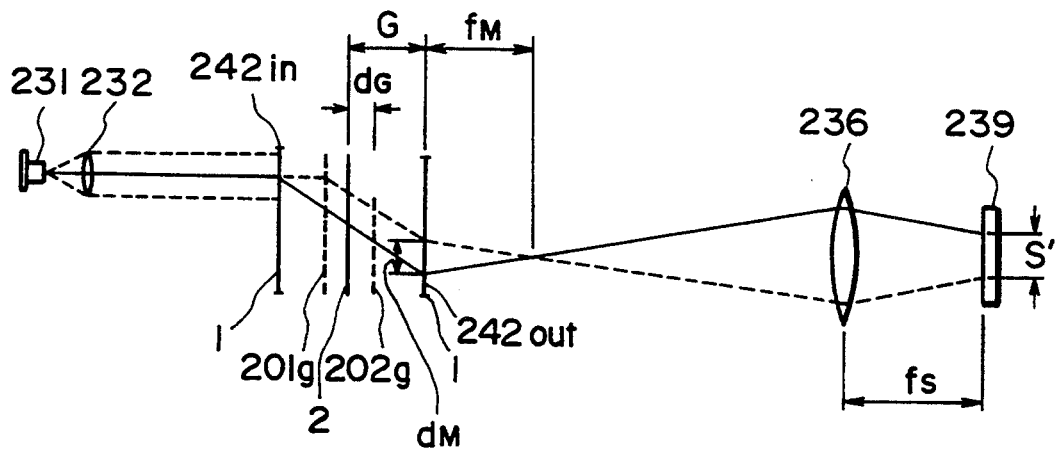

FIG. 30B shows this interval measuring system in respect to the lens power arrangement, like the case of the lateral deviation detecting system.

In the present embodiment, the lens 236 is used in common as a condensing lens 236 shown in FIG. 30B and as a relay lens 236 shown in FIG. 30A. Here, by making the effective distance $l_2$ from the lens 236 to the sensor 238 surface in FIG. 30A equal to the effective distance fs to the sensor 239 surface in FIG. 30B, it is possible to set the sensors 238 and 239 on the same base plate 237.

Figure 29E:
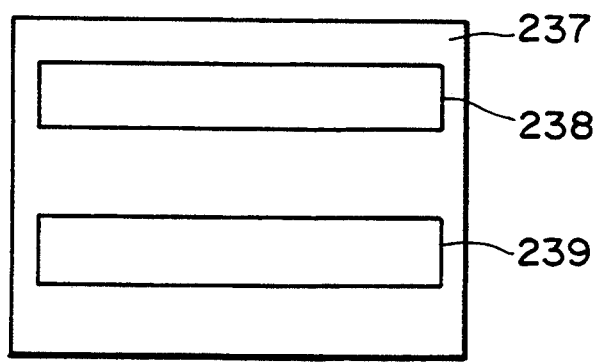
FIG. 29E is a schematic view of a light receiving means used in the seventeenth embodiment.

As illustrated in FIG. 29E, the sensors 238 and 239 are formed on the base plate 237 so that they are juxtaposed to be parallel to the X direction. If, on the other hand, the distance from the wafer 2 surface to the lens 236 is denoted by l, the distance l may be set to satisfy the following relations:

$$l = bw + l_1$$

$$1/l_1 = 1/fs = 1/l_2 = 2/fs$$

It follows that:

$$l = bw + fs/2 \tag{5}$$

If the distance l is initially determined, in this embodiment, then the value bw as determined by the focal lengths of the grating lenses 241M and 241W may be set to satisfy equation (5). Also, in this connection, the value aw may be set so that the amount of positional deviation between the mask 1 and the wafer 2 is magnified in accordance with equation (3). In the present embodiment, the sensors 238 and 239 are prepared simultaneously by the printing treatment made to the same base plate.

As an alternative, the sensor 238 for the signal light in the lateral deviation detecting system and the sensor 239 for the signal light in the interval measuring system may be disposed on the same base plate formed with a spherical surface of a radius R corresponding to the aberration of the detection lens 236. In that occasion, although a light projecting optical system and a light receiving optical system within an alignment pickup head may have a similar structure as of the first embodiment, disposition of the sensors 238 and 239 in this manner is effective to avoid any error in the measurement of the position of the center of gravity of light on a sensor, resulting from deformation of the point image, due to curvature of field or distortion of the detection lens 236.

Figure 34A:
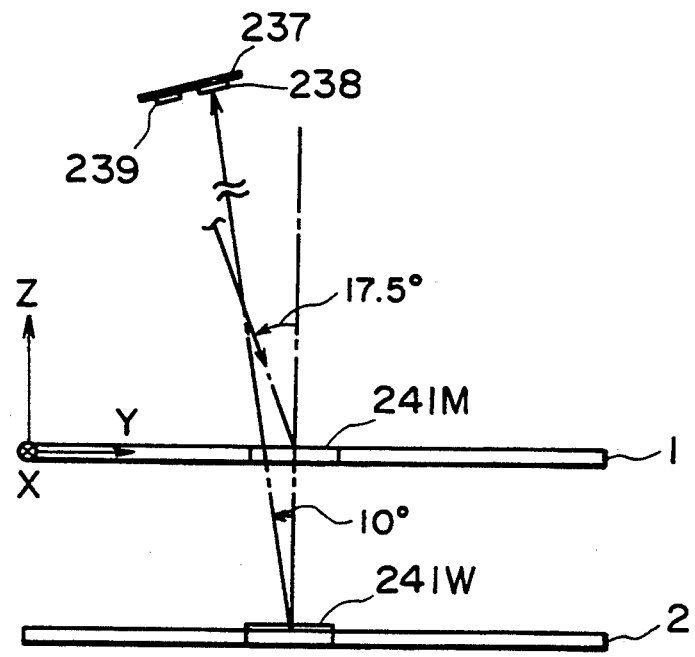
FIGS. 34A and 34B are schematic representations, illustrating the projection on a Y-Z plane of a positional deviation measuring light and an interval measuring light, in the seventeenth embodiment.
Figure 34B:
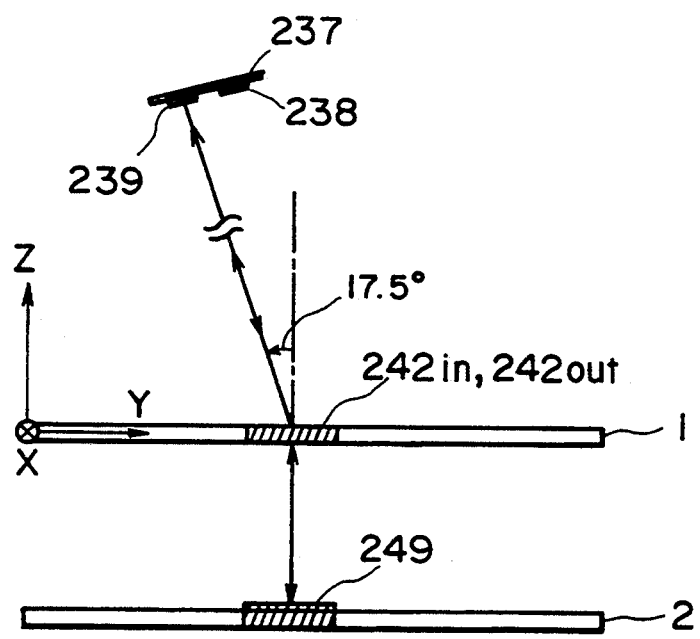

FIGS. 34A and 34B each shows an optical path as being projected on the Y-Z plane in FIG. 33. FIG. 34A depicts the optical path for the light for lateral positional deviation measurement, while FIG. 34B depicts the optical path for the light for interval measurement. The light emanating from an unshown light source (semiconductor laser having a wavelength of 830 nm) is incidence with inclination on the mask 1 at an angle of 17.5 degrees. Thereafter, under the influence of the physical optic element 241M on the mask 1, the positional deviation measuring light goes in a direction substantially parallel to a normal to the wafer 2 surface (or parallel to a normal to the mask surface). On the other hand, the interval measuring light is deflected at a predetermined angle in the X direction, with respect to a normal to the wafer 2 surface.

After being influenced by the reflectively diffracting and reflecting functions of the physical optic elements 241W on the wafer 2, these lights are separated along different optical paths having different emission angles, and they go out the wafer surface and impinge on the sensors 238 and 239, respectively. The physical optic elements 241M and 241W each is provided with a grating lens element having a predetermined focal length. Each mark has a size of 50 microns × 180 microns and is formed on a scribe line (or a region corresponding to this) adjacent a zone in which a semiconductor circuit pattern is to be printed.

Next, the diffracting function of the physical optic elements 241M, 241W and 242 of the mask 1 and the wafer 2, applied to the lateral positional deviation measuring light and the interval measuring light, will be explained.

The light projected with inclination on the mask 1 is influenced by the transmissive diffraction function of the grating lenses 241M and 242, such that there are produced various lights of different diffraction orders such as, for example, zero-th order, positive and negative first orders and positive and negative second orders. In this embodiment, positive first order transmissive diffraction light is used, for example. As regards the function of the grating lens, it has a positive lens function (converging function) where the order is positive, and it provides a concave lens function (light diverging function) where the order is negative.

The pattern of the grating lens 241M is designed so that the positive first order transmission light goes along an optical path which is parallel to the normal to the mask surface. On the other hand, the grating $242_{in}$ serves as a deflecting element, for deflecting the light in the X direction. In this embodiment, the lateral positional deviation measuring light is influenced by negative first order reflective diffraction function of the grating lens 41W on the wafer 2 (i.e. it is influenced by a concave lens function).

On the other hand, the interval measuring light is reflected at zero-th order by a blank (patternless) area on the wafer 2 and, as for the lateral positional deviation measuring light, a light passing at zero-th order the grating lens 241M of the mask 1 is used. In this manner, the lateral positional deviation measuring light after it is emitted from the light source is diffracted at positive first order (by convex lens function) by the grating lens 241M of the mask and again is diffracted at negative first order (concave lens function) by the grating lens 241W of the wafer and finally it is acted on by zero-th diffraction function when it passes again the mask.

The interval measuring light, after it is reflected at zero-th order by the specular reflection surface of the wafer, is diffracted again by the grating lens $242_{out}$ of the mask, whereby it is transformed into negative first order diffraction light.

In this embodiment, an absolute value of the diffraction order is limited to not more than 1. However, the present invention when it is embodied is not limited to this. Light having diffraction order of an absolute value not less than 2 may of course be used.

Next, taking the detector 238 as an example, description will be made of the manner of reducing, through an adjusting means, a decrease in detection precision where unwanted light is incident on a light receiving surface.

As an example, the detector 238 comprises a one-dimensional sensor (CCD linear sensor) of charge coupled type, based on photoelectric conversion, having picture elements of a number 2048 and a picture element size of 13×13 (micron) Electric charges produced by photoelectric conversion and then accumulated are transferred from the picture elements to a CCD shift register and, after passing a charge detecting portion, they are outputted to an output amplifier comprising a source follower. Thereafter, the light intensity corresponding to each picture element of the detector 238 is memorized into a waveform memory in the form of an electric signal and, after analog-to-digital conversion, data is transferred to a microcomputer. In the microcomputer, the transferred data corresponding to the light intensity at each picture element of the detector 238, having "256 tone", can be processed in the following manner:

(1) A first method is such that:

(1-1) The position So of the picture element which is at a point corresponding to the light intensity peak value of the data supplied to the microcomputer, is detected.

(1-2) The part of the data that concerns a zone, covering the opposite sides of the position So, having a width of picture elements of a number n, is multiplied by a weight coefficient of 1, whereas the remaining part of the data is multiplied by a weight coefficient 0.

(1-3) By using the data obtainable with execution of step (1-2), the position of the center of gravity of light is determined and then the position of such picture element that corresponds to the determined position is detected. The algorithm is such that: The data at (+m)-th picture element on the sensor as counted with respect to a reference picture element thereof is multiplied by a weight m, together with its sign, and after the moment of each picture element as well as the total thereof are calculated, the resultant is divided by the sum of the data of all the picture elements, corresponding to the total light quantity in the region. The real number data obtainable by this division is multiplied by the size of the picture element in the positional deviation detecting direction, and a resultant represents the position of the center of gravity of light.

Figure 35:
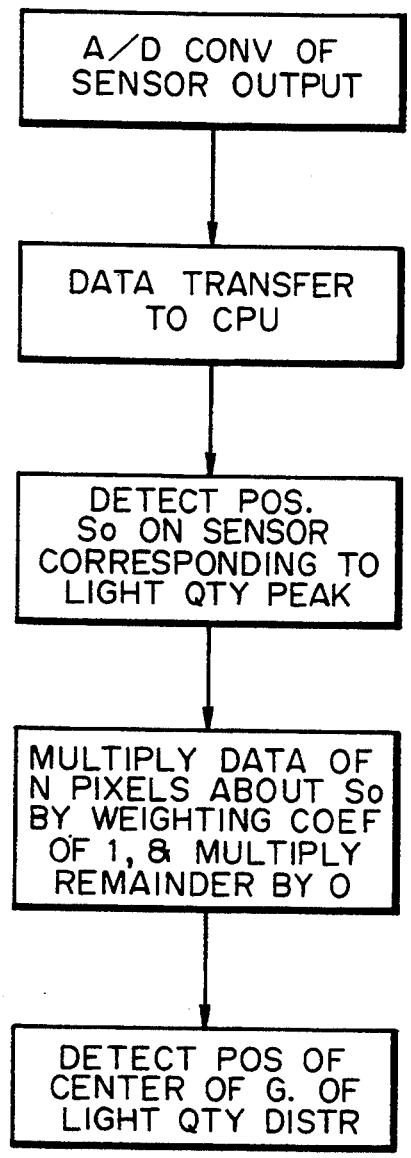
FIG. 35 is a flow chart showing a first example of data processing, to be made in the seventeenth embodiment.

The flow chart of FIG. 35 shows the procedure described above.

It can be said that in this example a rectangular wind function of a size corresponding to the width of picture elements of a number n, about the peak position in intensity of light on the photoreceptor 238, is applied to each picture element data. As regards the width n for the picture elements, usually it may be determined by calculating, in preparation, the diameter of a light spot on the sensor which is determined by the size of the alignment mark and the power arrangement of the optical system as a whole, including the alignment mark.

(2) As a second method, the optical system may have a similar structure as of the seventeenth embodiment (FIG. 29A), and the signal from the detector 238 may be processed in the following manner:

(2-1) The position So of the picture element that corresponds to a peak value in the light quantity of all the picture elements of the detector 238, is detected.

(2-2) The positions of those picture elements which include a point that satisfies $1/\alpha$ ($\alpha > 0$) of the peak value of the light intensity, are extracted. If three or more picture elements apply, those which are at the outermost positions from the picture element So are selected. That is, two picture elements such as (+m)-th and (−n)-th picture elements as counted from the picture element So, are selected.

(2-3) The part of the data concerning those picture element which are in a range from the (+m)-th picture element to the (−n)-th picture element, about the picture elements So, as determined by step (2-2), is multiplied by a weight coefficient of 1, whereas the remaining part is multiplied by a weight coefficient of zero.

(2-4) By executing a procedure similar to that made at step (1-3) according to the first method, the position of the center of gravity of light is determined.

In this example, like the first example, a rectangular window (particularly in respect to the width and position thereof) is determined on the basis of the light intensity distribution of the signal light on the detector 238.

(3) A third method is that the optical system is structured in the same ray as of the seventeenth embodiment (FIG. 29A) and the signal from the detector 238 is processed in the following manner:

(3-1) The position So of the picture element that corresponds to a peak value of the intensity of light received by the picture elements of the detector 238, is detected.

(3-2) The part of the data concerning those picture elements corresponding to a distance x about the picture element So, is multiplied by a weight coefficient which can be given by the following equation:

$$W(x) = [2J_1(kax)/kax]^2$$

wherein $J_1$ with parenthesis is a first type Bessel function of first order, and $$k = 2\pi/\lambda b$$

wherein $\lambda$ is the wavelength of light, and b is the distance from the alignment mark to the detector 8. Also, a denotes the aperture size of the alignment mark.

(3-3) By executing a procedure similar to the procedure (1-3) of the first method, the position of the center of gravity of light is determined.

As described with reference to this example, the weight coefficient for the picture elements may be a predetermined function corresponding to the position of the picture element on the sensor.

For example, rather than a rectangular window function as can be depicted in the form of a rectangle with the axis of abscissa representing the position and with the axis of ordinate representing the coefficient, a trapezoidal window function, a triangular window function, a Gaussian distribution function, a zinc $Sinc^2$ function may be used. The parameter which defines the width of such a function may be determined on the basis of the diameter of the light beam on the detector 238, if it is predetected. Alternatively, it may be determined from the light quantity distribution on the detector 238, in accordance with the procedure described with reference to the second method.

Figure 36A:
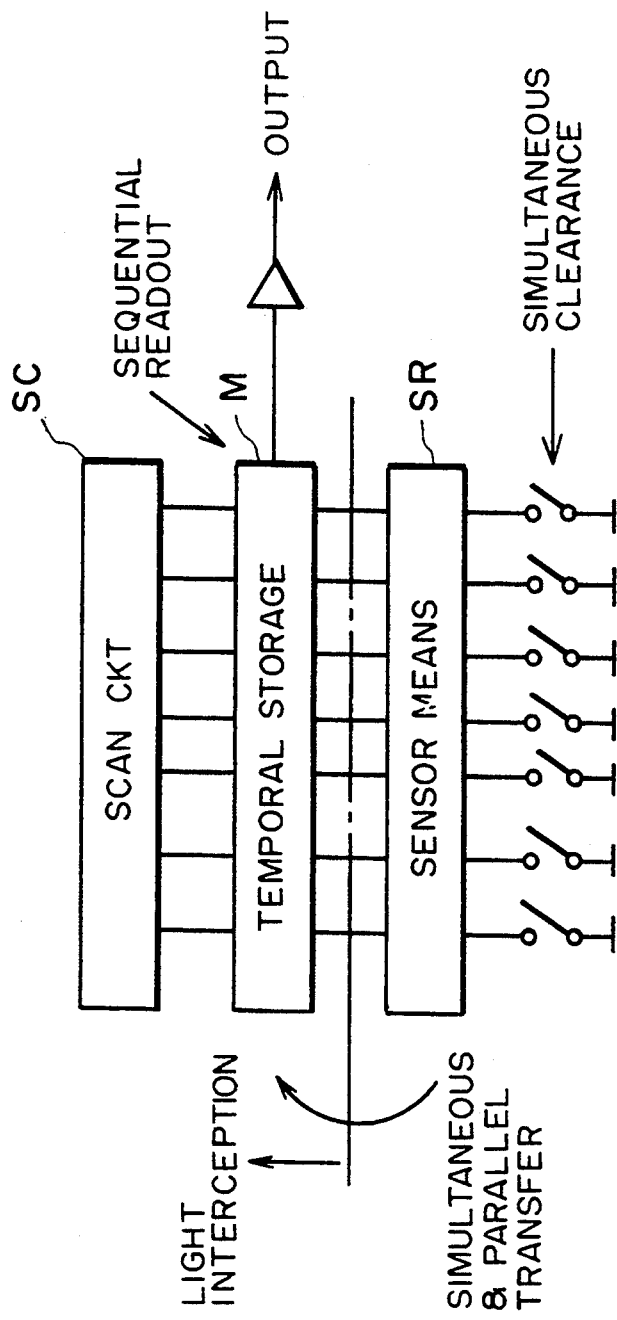
FIGS. 36A and 36B are schematic and diagrammatic representations, for explicating another example of data processing to be made in the seventeenth embodiment.
Figure 36B:
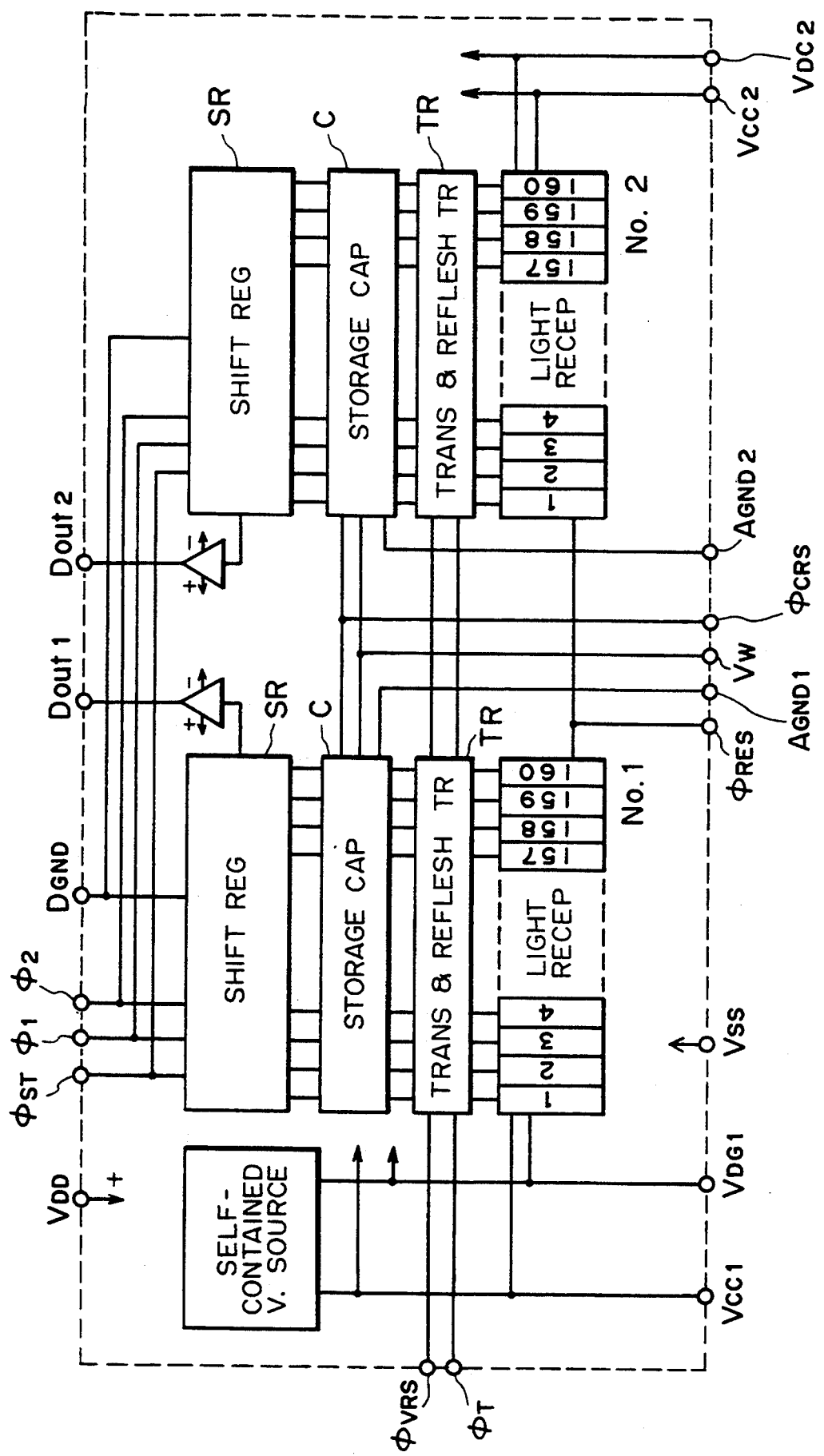

(4) A fourth method uses a sensor having switching means for each picture element, such as shown in FIGS. 36A and 36B.

As an example, in the alignment optical system shown in the seventeenth embodiment (FIG. 29A), the detector may comprise two line sensors 238 and 239 which are adapted to receive a positional deviation signal light and an interval signal light, respectively.

FIG. 36A is a schematic representation, illustrating the structure and operation of the sensor, wherein denoted at SR is sensor means, at m is a temporal storage and at SC is a scanning circuit. FIG. 36B illustrates details of the structure of the sensor means. Positional deviation signal receiving sensor (sensor No. 1) and interval signal light receiving sensor (sensor No. 2) operate at the same timing. These line sensor are scanned in the same direction and produce outputs at the same time. The "ON/OFF control" of the output of each picture element is made by a transfer refresh transistor TR shown in FIG. 36B. Also, the "ON/OFF control" of the output of each picture element signal by the transistor TR can be preset by using a signal $\phi_{VRS}$ as supplied from the microprocessor.

In this example, at the time of mask-to-wafer gap setting, the transistors TR associated with the picture elements of the light receiving portion of the line sensor No. 1 are set to "OFF state", in preparation, by means of the microprocessor. On the other hand, the transistors TR corresponding to the picture elements of the light receiving portion of the line sensor No. 2 are set to "ON state". The outputs of the picture elements of the line sensor No. 2, receiving the interval signal light, are transferred through a storage capacitance C and a shift register SR to the microprocessor. In response, the microprocessor determines the central position, the width and the like of a rectangular window function to be set in respect to (the picture elements) the line sensor 2 in accordance with the procedure described with reference to the first example or second example. Based on this, the microcomputer supplies the "ON/OFF information" of each transistor TR, in the form of a signal $\phi_{VRS}$. The thus obtained signal from the line sensor No. 2 is processed by the algorithm according to the mask A$^2$F method, described hereinbefore, and the interval setting is done.

Next, for detection of relative lateral deviation (positional error) between the mask and the wafer as well as the corrective control therefor, the transistors TR for the line sensor No. 1 are set to "ON state", while the transistors TR for the line sensor No. 2 are set to "OFF state". Like the interval setting, the light quantity distribution data of the positional deviation signal light from the line sensor No. 1 is transferred to the microprocessor. In accordance with the procedure described with reference to the first or second method, the microprocessor determines the central position, the width and the like of a rectangular window function to be set on the line sensor No. 1. Based on this, the "ON/OFF information" of the transistors is supplied in the form of a signal $\phi_{VRS}$, whereby the switches are opened/closed. By using the thus obtained signal from the line sensor No. 1 and in accordance with the algorithm of the procedure (1-3) of the first method, the position of the center of gravity of the light intensity distribution of the positional deviation signal light, on the sensor, is determined.

(5) A fifth method is that: the alignment optical system and mechanical system are structured such as described with reference to the seventeenth embodiment (FIGS. 29A-29C), and the microcomputer processes the data, transferred thereto, corresponding to the light intensities at the picture elements of the detector 238 of "256 tone", in the following manner:

(5-1) The position So of the picture element which is at a point corresponding to the light intensity peak value of the data supplied to the microcomputer, is detected.

(5-2) The part of the data that concerns a zone, covering the opposite sides of the position So, having a width of picture elements of a number n, is multiplied by a weight coefficient of 1, whereas the remaining part of the data is multiplied by a weight coefficient 0.

(5-3) By using the data obtainable with execution of step (5-2), the position of the center of gravity of light is determined and then the position of such picture element that corresponds to the determined position is detected. The algorithm is such as shown in FIG. 35 that: The data at (+m)-th picture element on the sensor as counted with respect to a reference picture element thereof is multiplied by a weight m, together with its sign, and after the moment of each picture element as well as the total thereof are calculated, the resultant is divided by the sum of the data of all the picture elements, corresponding to the total light quantity in the region. The real number data obtainable by this division is multiplied by the size of the picture element in the positional deviation detecting direction, and a resultant represents the position of the center of gravity of light.

It can be said that in this example a rectangular wind function of a size corresponding to the width of picture elements of a number n, about the peak position in intensity of light on the photoreceptor 238, is applied to each picture element data. As regards the width n for the picture elements, like the first example, usually it may be determined by calculating, in preparation, the diameter of a light spot on the sensor which is determined by the size of the alignment mark and the power arrangement of the optical system as a whole, including the alignment mark. Alternatively, it may be made in accordance with the procedure of the second example, such as follows, to obtain the gravity center position of the positional deviation signal light. That is:

(5-1') The position So of the picture element that corresponds to the gravity center of the light of all the picture elements of the detector 238, is detected.

(5-2') The positions of those picture elements which include a point that satisfies $1/\alpha$ ($\alpha>0$) of the peak value of the light intensity, are extracted. If three or more picture elements apply, those which are at the outermost positions from the picture element So are selected. That is, two picture elements such as (+m)-th and (−n)-th picture elements as counted from the picture element So, are selected.

(5-3') The part of the data concerning those picture element which are in a range from the (+m)-th picture element to the (−n)-th picture element, about the picture elements So as determined by step (5-2') is multiplied by a weight coefficient of 1, whereas the remaining part is multiplied by a weight coefficient of zero.

(5-4') By executing a procedure similar to that made at step (1-3) according to the first method, the position of the center of gravity of light is determined.

The weight coefficient is not limited to "0" or "1", as in the above-described procedures (5-2) and (5-2'). A weight function which is in the form of a function about the picture element So, as in the third method, may be used.

(6) A sixth method is that: the alignment optical system is structured like the optical system shown in the first embodiment, and the output of the detector 238 is processed in the following manner.

(6-1) The position So of the picture element that corresponds to the light intensity peak value or to the position of the center of gravity of light, of the data supplied to the microprocessor is detected.

Figure 37A:
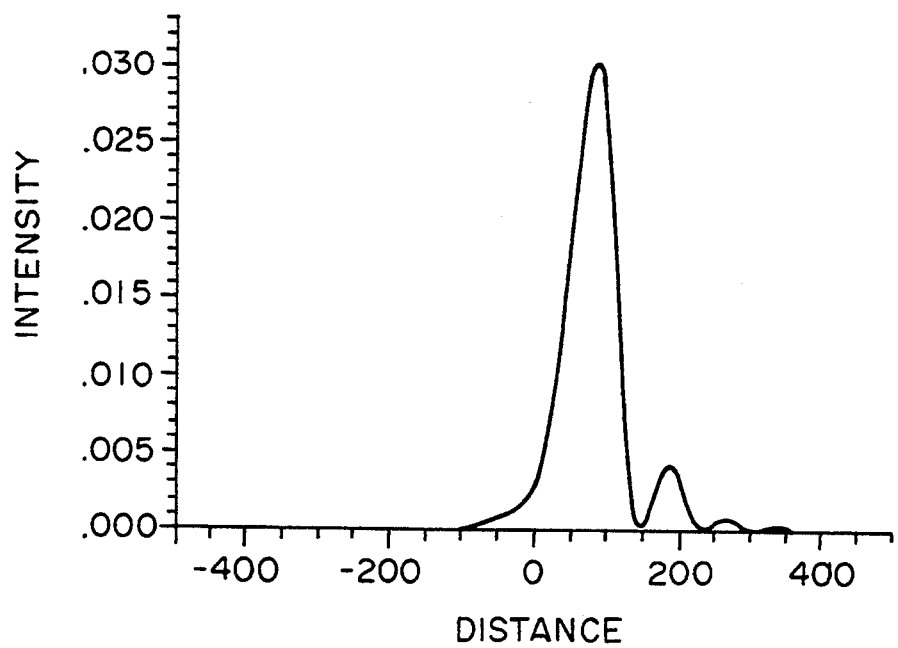
FIGS. 37A and 37B are graphs, each representing a weight coefficient distribution according to another example of data processing to be made in the seventeenth embodiment.
Figure 37B:
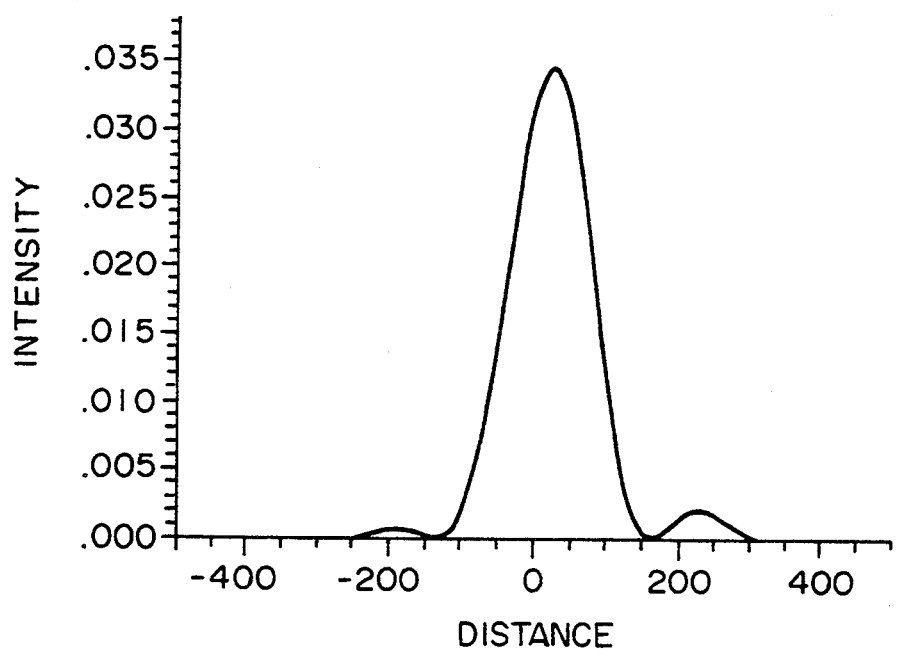

(6-2) The output data of each picture element is multiplied by a weight coefficient corresponding to the distance from So, which is in the form of a function such as illustrated in FIGS. 37A and 37B.

(6-3) From the data obtained at step (6-2) and by executing a procedure like the procedure (1-3) of the first method, the position of the center of gravity of light is determined.

In this example, as described, the light intensity distribution data of the signal light is multiplied, in accordance with the position of each picture element, by the weight function of an asymmetric distribution such as shown in FIGS. 37A and 37B. The form of the weight coefficient distribution function, to be used for the multiplication, is determined definitely by the amount and direction of the positional deviation, for example.

For the measurement of a positional deviation based on measurement of the position of the center of gravity of light which displaces on a sensor at a predetermined positional deviation enlarging magnification, determined by the power arrangement of a lens element (grating lens) provided on an object to be aligned, as in the first embodiment, it is known that the intensity distribution of the light on the sensor has an asymmetric shape due to aberrations of the grating lens system corresponding to the positional deviation (such as coma, astigmatism, distortion, wave-optic aberration peculiar to the grating lens, and the like). However, with regard to the function form of the above-described asymmetric function, the light intensity distribution data obtainable from simulation or experiments may be processed in preparation by smoothing, for example, and it may be multiplied, if necessary, by a rectangular window function as described with reference to the first and second methods, and the thus obtained data may be used.

The light intensity distribution data shown in each of FIGS. 37A and 37B is the result of simulation corresponding an output data from an accumulation type photoelectric converting CCD sensor, having picture elements of a number 600 and a picture element size of 13×13 (micron), where the positional deviation is of an amount 8 microns (FIG. 37A) and 1 micron (FIG. 37B). Where the function form of the illustrated light intensity distribution data is to be used as a distribution function for the weight coefficient, the position of such point that corresponds to the light intensity peak value of the data as supplied to the microprocessor from the detector 238 or, alternatively, a first order approximation value of the positional deviation from the position of the center of gravity of the light may be detected. In accordance with the deviation of the approximated position, distribution data of the weight coefficient as predetected is appropriately translationally shifted in a lateral direction so that the positions of the light intensity peak points of the two data coincide with each other, and the multiplication may be made thereafter.

(7) A seventh method is that: the alignment optical system and the mechanical system are structured such as described with reference to the seventeenth embodiment (FIGS. 29A–29C), and the detecting means for receiving the positional deviation signal light and the interval signal light comprises a single, one-dimensional sensor such as a CCD line sensor, for example.

The marks provided on the first and second objects, to be aligned with each other, for the alignment purpose and for the interval setting purpose, are designed to have measurement ranges of 0–±15 microns and 20–90 microns, respectively. Also, they are set so that, in the respective measurement ranges, the light is displaceable on the sensor within an extent such as shown in FIG. 38.

Where the extent of displacement of the light on the sensor is predetermined, as in this example, for the interval setting the outputs of the picture elements in the positional deviation signal light receiving region are multiplied by a weight coefficient of "0", while the outputs of the remaining picture elements are multiplied by a weight coefficient of "1". Thereafter, the procedure of any one of the first to sixth methods described hereinbefore, is performed. For the measurement of the positional deviation to be made after completion of the interval setting, the outputs of the picture elements in the interval signal light receiving region are multiplied by a weight coefficient of "0", while the outputs of the remaining picture elements are multiplied by a weight coefficient "1" and thereafter, similar procedure is performed.

As an alternative, if the arrangement is such that time series data corresponding to the outputs of the picture elements of the sensor is produced in sequence, in an order from the picture element 1 to the picture element 1024 shown in FIG. 38, once the time $t_0$ of start of the data output from the sensor is determined, then the time $t_1$ of the start of output of a corresponding picture element within the displaceable range of the signal light as well as the time $t_2$ of the termination of the output can be determined. Therefore, the structure may be made so that by the hardware the data is transferred to the microprocessor in the time period range of $t_1-t_2$.

(8) An eighth method is such that: the alignment optical system and the mechanical system are structured such as the seventeenth embodiment (FIGS. 29A–29C), and the detecting means for receiving the positional deviation signal light and the interval signal light comprises a single, two-dimensional sensor such as a CCD area sensor, for example.

The marks for the alignment and for the interval setting are designed and disposed so that, within a predetermined measurement range, each light produces a light intensity distribution range on the two-dimensional sensor, such as shown in FIG. 39.

Where the extent of displacement of the light on the sensor is predetermined, as described, like the seventh method, for the interval setting the outputs of the picture elements in the positional deviation signal light receiving region are multiplied by a weight coefficient of "0", while the outputs of the other picture elements are multiplied by a coefficient of "1". Thereafter, the procedure of any one of the first to sixth methods is made. For measurement of the positional deviation, to be made after completion of the interval setting, the outputs of the picture elements in the interval signal light receiving region are multiplied by a weight coefficient of "0" while the outputs of the other picture elements are multiplied by a weight coefficient of "1". Then, a similar procedure is made.

Figure 40A:
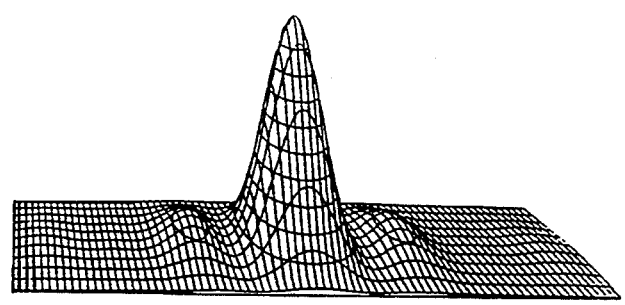
FIGS. 40A and 40B each shows a weight coefficient distribution according to the FIG. 39 example.
Figure 40B:
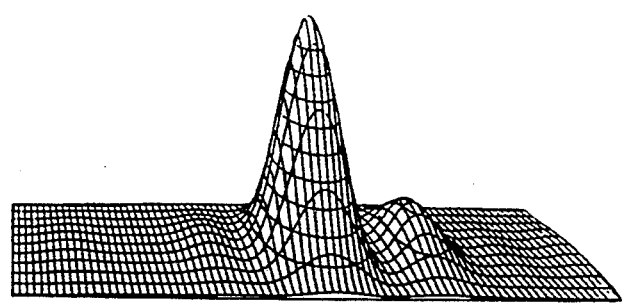

Subsequently, at each stage of alignment or interval setting, the data from those picture elements of the two-dimensional sensor, which are in a predetermined range, are multiplied by a weight coefficient distribution function such as shown in FIG. 40A or 40B. In the illustrated examples, the height of the curved surface represents the magnitude of the weight coefficient at that position.

For the measurement of a positional deviation based on measurement of the position of the center of gravity of light which displaces on a sensor at a predetermined positional deviation enlarging magnification, determined by the power arrangement of a lens element (grating lens) provided on an object to be aligned, as in the first embodiment, it is known that the intensity distribution of the light on the sensor has an asymmetric shape due to aberrations of the grating lens system corresponding to the positional deviation (such as coma, astigmatism, distortion, wave-optic aberration peculiar to the grating lens, and the like). However, with regard to the function form of the above-described asymmetric function, the light intensity distribution data obtainable from simulation or experiments may be processed in preparation by smoothing, for example, and it may be multiplied, if necessary, by a rectangular window function as described with reference to the first and second methods, and the thus obtained data may be used.

The light intensity distribution data shown in each of FIGS. 37A and 37B is the result of simulation corresponding an output data from an accumulation type photoelectric converting CCD sensor, having picture elements of a number 600 and a picture element size of 13×13 (micron), where the positional deviation is of an amount 8 microns (FIG. 37A) and 1 micron (FIG. 37B). Where the function form of the illustrated light intensity distribution data is to be used as a distribution function for the weight coefficient, the position of such point that corresponds to the light intensity peak value of the data as supplied to the microprocessor from the detector 238 or, alternatively, a first order approximation value of the positional deviation from the position of the center of gravity of the light may be detected. In accordance with the deviation of the approximated position, distribution data of the weight coefficient as predetected is appropriately translationally shifted in a lateral direction so that the positions of the light intensity peak points of the two data coincide with each other, and the multiplication may be made thereafter.

Further, with regard to the processing of the signal from the two-dimensional sensor, it is a possible alternative that, of all the light intensity distribution data corresponding to the lines in the X direction shown in FIG. 39, those line data including a relatively small amount of unwanted light such as scattered light, are extracted and, in regard to each line data, the position of the center of gravity of light is detected in accordance with the algorithm described with reference to the first method, for example. Then, the averaging of those data of the gravity centers, the averaging with weight coefficient to the predetermined lines, the square averaging or otherwise, is performed to determine the position of the center of gravity of light on the sensor.

Figure 41:
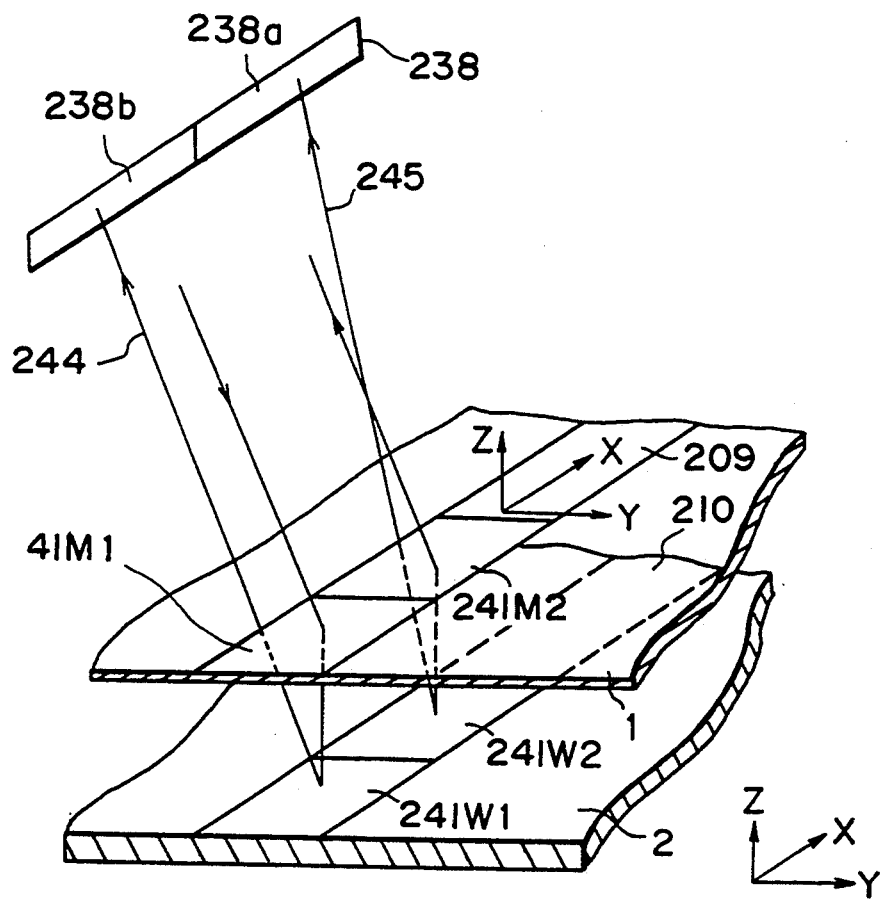
FIG. 41 is a schematic representation of a major part of an eighteenth embodiment of the present invention.

FIG. 41 is a schematic representation of the major part of a eighteenth embodiment of the present invention. Like numerals as of the foregoing embodiment are assigned to similar or corresponding elements. Alignment marks 241M1 and 241W1 are provided on a mask 1 and a wafer 2, respectively, for obtaining first signal light. Alignment marks 241M2 and 241W2 are provided on the mask 1 and the wafer 2, respectively, in juxtaposition with the alignment marks 241M1 and 241W1, respectively, for obtaining second signal light. Each of these alignment marks 241M1, 241W1, 241M2 and 241W2 comprises a grating lens such as, for example, a one-dimensional or two-dimensional Fresnel zone plate, and is provided on a scribe line 9 or 10 defined on the mask 1 surface or the wafer 2 surface. Numeral 244 denotes the first signal light (alignment light), and numeral 245 denotes the second signal light. The light denoted at 244 and 245 emanates from a light source (not shown) provided in an alignment head (not shown), and is collimated into a predetermined beam diameter.

Sensor 238 comprises a photoelectric converting element having a first detecting portion 238a and a second detecting portion 238b. The sensor 238 is formed by a one-dimensional CCD sensor, for example, and receives the alignment light 244 and 245.

In the present embodiment, the alignment light 244 and 245 is incident on the alignment marks 241M1 and 241M2 of the mask at a predetermined angle and is transmissibly diffracted by these marks. Then, the light is reflectively diffracted by the alignment marks 241W1 and 241W2 on the wafer 2 and impinge on the sensor 238. By this sensor 238, the position of the center of gravity of the inputted alignment light is detected and, by using output signals of the sensor 238, the mask 1 and the wafer 2 are aligned with each other.

The sensor 238 receives plural signal lights such as illustrated in FIG. 38. The sensor output signals are processed substantially in the same manner as having been described with reference to the eighth method, with the exception that plural positional deviation signal lights are inputted to the same sensor.

Description will now be made of the alignment marks 241M1, 241M2, 241W1 and 241W2.

The alignment marks 241M1, 241M2, 241W1 and 241W2 are provided by Fresnel zone plates (or grating lenses) having different focal lengths. For practical use, each mark has a size of 50–300 microns, in the lengthwise direction of the scribe line and 20–100 microns in the widthwise direction (Y direction) of the scribe line.

In this embodiment, both of the alignment lights 244 and 245 are incident on the mask 1 at an angle of incidence of about 17.5 degrees, with the projection upon the mask 1 surface being perpendicular to the scribe line direction (X direction).

The alignment lights 244 and 245 incident on the mask 1 with the predetermined angle are influenced by the lens functions of the grating lenses 241M1 and 241M2, such that each is transformed into a convergent or divergent light which is emitted from the mask 1 so that its chief ray has a predetermined angle with respect to the normal to the mask 1.

The alignment lights 244 and 245 having been transmissibly diffracted at first order by the alignment marks 241M1 and 241M2, are focused at a point of distance 184.43 microns vertically below the wafer 2 surface and a point of distance 186.57 microns vertically above the wafer 2 surface, respectively. The alignment marks 241M1 and 241M2, in this case, have focal lengths of 214.43 microns and −156.57 microns, respectively. Also, the mask 1 and the wafer 2 are spaced by a distance 30 microns.

The light (first signal light) having been transmissibly diffracted by the alignment mark 241M1 is influenced by a concave lens function of the alignment mark 241W1 on the wafer 2, and is collected on the sensor 238 surface (first detecting portion). On this sensor 238 surface, at this time, the light is incident with any relative positional deviation (i.e. any misalignment of the axes) of the alignment marks 241M1 and 241W1 being magnified, with a result of corresponding shift of the position of the center of gravity of the incident light. The principle of this is the same as that of the foregoing embodiment.

The present embodiment is so set that, when the mask 1 and the wafer 2 have no relative positional deviation (i.e. when the alignment marks 241M1 and 241W2 on the mask 1 and the wafer 2 just provide a coaxial system), the chief ray of the alignment light emitting from the wafer 2 has an angle of emission of 13 degrees, and the projection of the emitted light on the wafer 2 surface extends with an angle of −5 degrees with respect to the widthwise direction (Y direction) of the scribe line and, additionally, the emitted light is focused on the sensor 238 surface which is disposed at a predetermined position, for example, at a height of 18.657 mm from the wafer 2 surface.

On the other hand, the light (second signal light) transmissibly diffracted by the alignment mark 241M2 is influenced by the alignment mark 241W2 and is emitted so that lateral deviation of an imaging point is shifted in a direction different from that of the first signal light and that the projection of the emitted light on the wafer 2 surface extends with an angle +5 degrees with respect to the widthwise direction of the scribe line and, additionally, the emitted light is collected at a point on the sensor 238 surface (second detecting portion).

With the described lens parameters of the alignment marks, for a relative positional deviation between the first and second objects 1 and 2 the gravity centers of the two signal lights on the detecting portions can displace by an amount one hundred (100) times larger than the amount of the relative positional deviation and, additionally, they displace in opposite directions. Namely, deviation enlarging magnifications "$\beta_1 = -100$" and "$\beta_2 = +100$" are obtained. Therefore, the spacing between the gravity centers of these lights can change by an amount two-hundred (200) times larger than the amount of the relative positional deviation between the two objects. In the present embodiment, by using the sensor 238, any error in the spacing between the gravity centers of the two lights with respect to a predetermined reference interval (which is the interval between the gravity centers of the two lights as assumed when the two objects have no relative positional deviation), is detected. Then, on the basis of the proportional relationship between (i) the amount of change in the spacing between the gravity centers of the lights and (ii) the amount of relative positional deviation between the two objects, which is predetected, the relative positional deviation between the first and second objects is measured. In this case, the sensor output signals may be processed in accordance with the eighth method described hereinbefore, and the first detecting portion 238a and the second detecting portion 238b are used to detect the gravity centers of the two lights, respectively.

The arrangement of the present embodiment wherein two signal lights can displace in the opposite directions, provides an advantage that, if the precision of setting the interval δ between the first and second objects 1 and 2 is not so high, the deviation enlarging magnifications $\beta_1$ and $\beta_2$ for calculation of the positional deviation are in a mutually compensating relationship in two optical paths. If, for example, the interval δ between the first and second objects 1 and 2 has increased from 30 microns to 33 microns, the magnification $\beta_1$ changes from $-100$ to $-101.670$ and the magnification $\beta_2$ changes from $+100$ to $+98.433$. As a result, the overall magnification "$|\beta_1| + |\beta_2|$" used for the calculation of the positional deviation changes from 200 to 200.103. Accordingly, in terms of proportion the change can be reduced to a magnification change of 0.0517%. This means that the changes in the respective signals by 1.67% and 1.57% can be suppressed to about 1/30. Therefore, when the invention is applied to such a system wherein the interval setting is difficult, the arrangement of the present embodiment provides an advantageous effect of directly enlarging the detection range or increasing the detection accuracy.

An additional advantageous effect is that, if the second object 2 comprises a reflection surface, any error due to the inclination of the same can be compensated for, in principle.

If, in this embodiment, the wafer 2 surface is inclined within an X-Z plane (FIG. 39) by an amount 1 mrad, there occurs on the sensor 238 a displacement of about 37.3 microns of the center of gravity of the first signal light. On the other hand, since the second signal light 245 is symmetric with the signal light 244 with respect to a normal to the mask surface and they go along the optical paths of the same length, on the sensor 238 there occurs displacement of the center of gravity of the second signal light 245 as exactly the same as the first signal light. Thus, by processing in the sensor system the signals from the sensors (detecting portions) so as to detect and output a difference between those signals representing the positions of the effective gravity centers, the output signal from the sensor system does not change even if the wafer surface is inclined within the X-Z plane.

If, on the other hand, the wafer is inclined within a Y-Z plane, both of the two signal lights 244 and 245 cause shift of the gravity centers in the widthwise direction perpendicular to the lengthwise direction of the sensor. However, this widthwise direction is perpendicular to the direction along which the center of gravity of light displaces with a positional deviation to be detected on the sensor. Therefore, without the two lights, any alignment error can be avoided in effect.

Further, when the position of an alignment head accommodating therein an alignment light source, a light projecting lens system, sensors and the like, changes relatively to the mask-wafer system, there occurs a change in a one-to-one relationship. For example, if the head is displaced by 5 microns in the Y direction relatively to the mask, on the sensor 238 there occurs displacement of the effective gravity center of the signal light by 5 microns and, simultaneously, on the sensor 238 there occurs displacement of the center of gravity of the reference light by exactly the same amount of 5 microns.

Therefore, no change occurs in the final output of the sensor system, namely, in the differential signal representing the difference between the outputs concerning the gravity center positions of the first and signal lights.

It will be readily understood that any change in the position in respect to the X-axis direction does not result in an essential alignment error, even when both of the two lights are used.

In order to provide deviation enlarging magnification of opposite signs, in this embodiment the power arrangement of the alignment marks is so set that the system for the signal light 244 provides a convex-concave lens system while the system for the signal light 245 provides a concave-convex lens system. However, the system for the signal light 245 may comprise a convex-concave system. This is suitable when the invention is applied to such a system wherein the spacing 6 between the first and second objects are relatively large.

Although the foregoing embodiments have been described with reference to cases wherein various signal processing methods for processing signals from the sensor, are applied to a positional deviation measuring system of the type wherein the position of the center of gravity of light, diffracted in sequence by physical optic elements each having a lens function and being displaceable on the sensor with a predetermined magnification, in accordance with the amount of positional deviation is detected, the applicability of the present invention is not limited to the positional deviation measuring system of the described type. The invention is applicable also to any other type of positional deviation measuring system, such as conventional measuring system shown in FIG. 1, for example.

Figure 42:
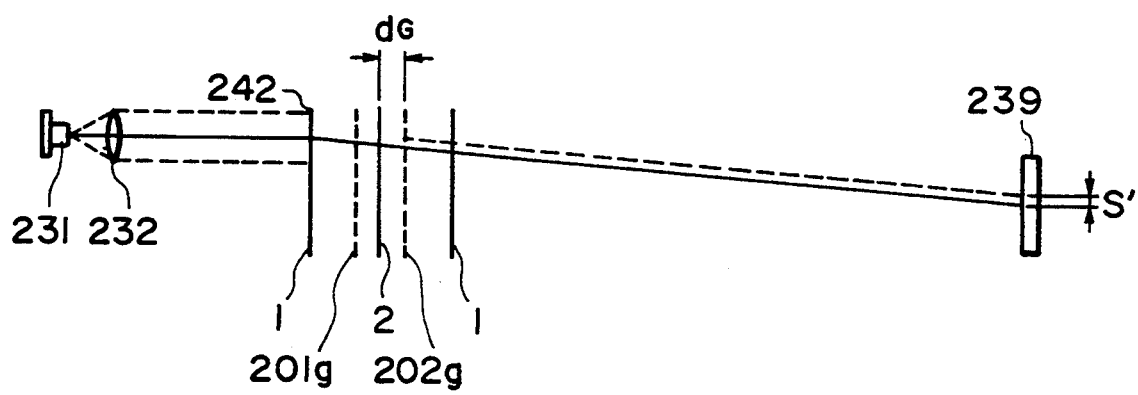
FIG. 42 is a schematic representation of another example of optical arrangement of an interval measuring system.

The interval detecting system shown in FIG. 30B may be replaced by an optical system such as illustrated in FIG. 42. In the interval detecting system shown in FIG. 42, light emanating from a light source 231 and collimated by a lens 232 into a parallel light impinges on a physical optic element 242 on a mask, having a lens function. By this element, the light is diffracted and is transformed into a convergent light. The light emanating from the physical optic element (grating lens) 242 is reflected by the surface of a wafer and passes again the mask 1. At this time, the light does not go through a region of the mask in which the physical optic element 242 is formed, such that without being influenced by the diffracting function, it reaches a sensor 239. In this example, no detection lens such as at 36 is disposed in the path of the interval measuring light, and the light reflected by the wafer 2 surface and passing through the mask 1 directly impinges on the sensor 239. The position of incidence of the light on the sensor 239 is changeable with the mask-to-wafer interval and, by detecting the position of incidence, the interval therebetween is detected.

The detecting means is not limited to a solid image pickup element such as CCD, but any other means such as, for example, a photoelectric conversion type image pickup tube (e.g., vidicon, plumyicon or SIT tube), a position sensor (PSD) or otherwise may be used.

Next, a further embodiment of the present invention will be explained.

Initially, as a comparison example, the following case will be explained wherein the position resulting from averaging the positions of individual points in respect to light intensity (i.e. the position of the center of gravity of light) is taken as a representative.

The position of the center of gravity of light, i.e. vector $\vec{M}$, can be expressed by the following equation:

$$\vec{M} = \left( \sum_i Si \cdot ai \right) / \sum_i Si \qquad (6)$$

Wherein i is natural number, Si is the light intensity at the i-th position, and ai is the position vector at the i-th position.

Where this method is applied to the detection of interval and positional deviation of the above-described light spot detection type wherein the light intensity signal is locally concentrated, the light intensity signal concentration occurs around the position of the gravity center and, as the distance from the position of the gravity center increases, the light intensity signal becomes weak. As compared therewith, if noise appears at every part of the sensor, at substantially the same probability and with substantially the same magnitude, in a limited range close to the position of the gravity center the noise produced thereat causes only a small amount of shift of the position $\vec{M}$ of the gravity center of light, because the magnitude of the original signal is large and thus the signal-to-noise ratio is sufficiently high and because the amount of contribution of the noise at the right-hand side of equation (3) is sufficiently small. However, the noise can be produced at every part of the sensor, substantially at uniform possibility. Therefore, the rate of production of noise is higher in a wide range of low level signal region, far away from the gravity center position, than in the limited range adjacent the gravity center position. Additionally, since the signal level in this region is low, any noise produced in that region makes the signal-to-noise ratio quite low. Therefore, a large change occurs in the righthand side of equation (3), and the amount of change in the gravity center position $\vec{M}$ of the light due to such noise is large. Accordingly, where the gravity center position is taken as a representative position for the spot of focused light and if the positional deviation or interval is detected on the basis of any deviation from this representative position, the produced noise easily causes a detection error.

In the present embodiment, in consideration of the above, the light intensity signal concentrated locally is amplified at a rate higher than that for the signal in a wide range of low level signal region, and with regard to these signals the following processing is made to determine the representative position. As a consequence, the representative position does not easily change with the noise in the low level region.

The representative position (vector) $\vec{M}'$ in that case can be expressed as follows:

$$M' = \sum_i Ai\,(Si)^{\alpha i}\, ai / \sum_i Ai\,(Si)^{\alpha i} \qquad (7)$$

wherein Ai amd αi are specific coefficients at the i-th position.

The coefficients Ai and αi are set so as to amplify at a higher rate the signal Si in the signal concentrated part, but so as not to amplify at a high rate the signal in the low level signal region or, alternatively, so as to reduce the same. To allow this, Ai may be equal to 1 and i may be equal to 2 (i.e. square amplification of the signal Si). Here, the calculation according to equation (7) is called the "detection of the gravity center position of squared light intensity". A particular example wherein the setting is such as described above will be explained below.

Figure 43:
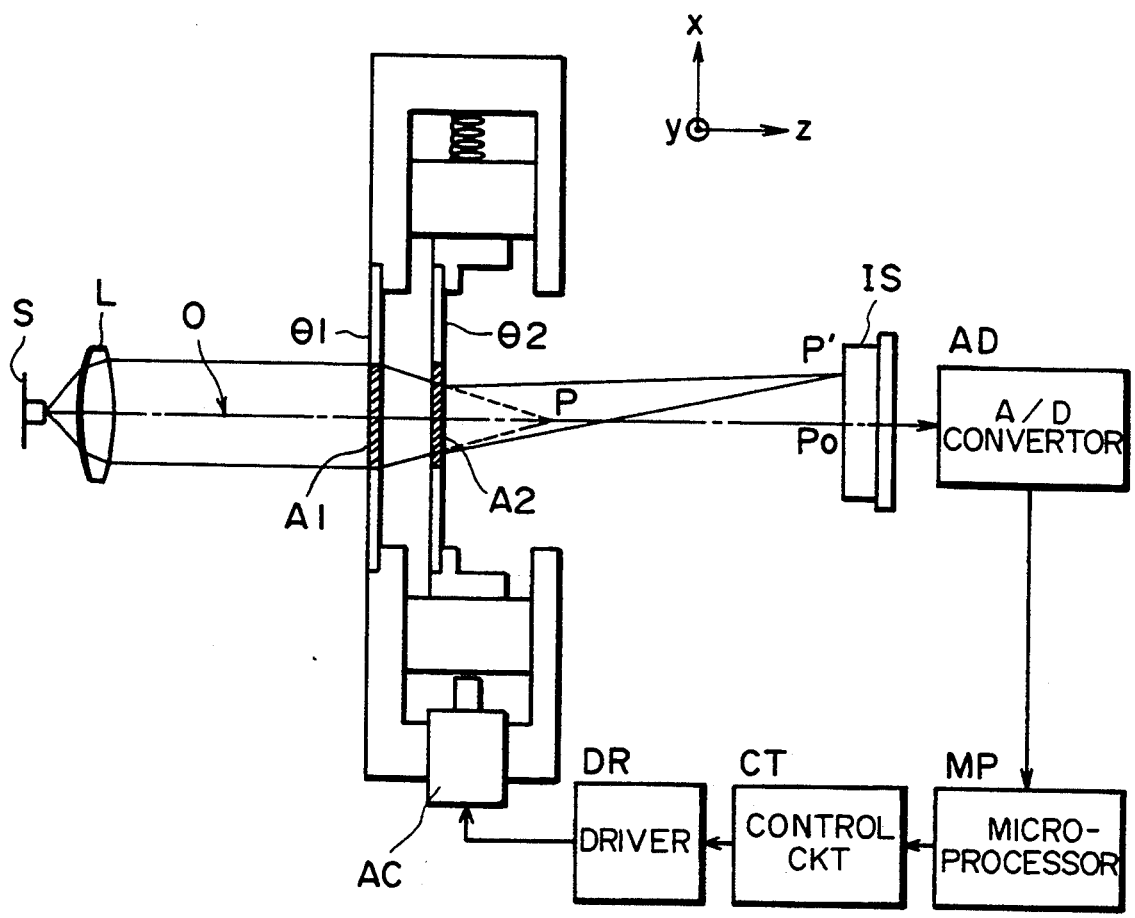
FIG. 43 is a schematic and diagrammatic view of a major part of a nineteenth embodiment of the present invention.
Figure 44:
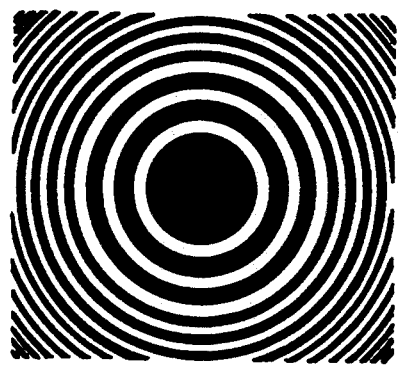
FIG. 44 shows an example of the pattern of a Fresnel zone plate.

FIG. 43 shows an embodiment wherein the invention is applied to an alignment system. Denoted at S is a laser source (light source) which produces light of good directivity. Denoted at L is a lens for collimating a laser beam from the source. The collimated laser beam impinges on a physical optic element A1 which is an alignment mark provided on an object Q1 (e.g., mask) to be aligned. The physical optic element A1 comprises a Fresnel zone plate, for example, having a lens function for concentrating the received light. Physical optic element A2 which is an alignment mark similar to the element A1, provided on an object Q2 (e.g., wafer) to be aligned, comprises a Fresnel zone plate, for example, having a lens function for concentrating, at a point on an image sensor IS, the incident light having been converged by the physical optic element A1 to be focused at a point P. When the objects Q1 and Q2 have no relative positional deviation, the physical optic elements A1 and A2 serve to focus the light at the center $P_0$ of the image sensor IS. If the object Q2 is deviated in a vertical direction as viewed in the drawing, these physical optic elements serve to focus the light at a point P' on the sensor IS, which is shifted in the same direction of the positional deviation and by an amount equal to the amount of positional deviation between the objects Q1 and Q2 as multiplied by $\beta$. Accordingly, by detecting the amount and direction of the deviation of the point P' of focused light through the image sensor IP, the positional deviation between the objects Q1 and Q2 can be detected. By way of example, each of the physical optic elements A1 and A2 can be provided by a Fresnel zone plate such as shown in FIG. 44. In this Figure, the painted areas depict the light-intercepting grating portions. Such Fresnel zone plate has the following configuration:

First, the mark A1 for the mask Q1 is designed so that when a parallel light of a predetermined beam diameter is incident thereupon at a predetermined angle, the light is collected at a predetermined position. Usually, the pattern of a Fresnel zone plate may be that of an interference fringe which can be formed on a lens surface in an occasion where mutually coherent light sources are disposed at a light source position (object point) and the position of an image point.

Assumingly, a coordinate system is defined on the surface of the first object Q1, wherein the origin is at the middle of the Fresnel zone plate A1, the x axis lies in the positional deviation detecting direction (vertical direction in the drawing), the y axis lies in a direction which is on the surface of the object Q1 and which is perpendicular to the x axis, and the z axis lies in the direction of a normal to the surface of the object Q1. Equations regarding a group of curves lines of such a grating lens by which a parallel light, having been incident thereon with an angle $\delta$ with respect to the normal to the object Q1 and with the projection being perpendicular to the x-axis direction, is imaged after being transmissibly diffracted by the mark of the object Q1, at the position of a converging point P $(x_1, y_1, z_1)$, can be expressed in the following manner, with the position of each grating being denoted by x, y:

$$y\sin\alpha + P_1(x,y) - P_2 = m\lambda/2 \quad (8)$$

$$P_1(x) = \sqrt{(x - x_1)^2 + (y - y_1)^2 + z_1^2}$$

$$P_2 = \sqrt{x_1^2 + y_1^2 + z_1^2}$$

wherein $\lambda$ is the wavelength of the light and m is an integral number.

Assuming now that a chief ray is such a ray being incident with an angle $\alpha$ and passing through the origin on the surface of the object Q1 and then impinging upon the convergent point P $(x_1, y_1, z_1)$, then the right side of equation (8) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the object Q1 and then impinges on the point $(x_1, y_1, z_1)$.

On the other hand, a Fresnel zone plate A2 to be provided on the object Q2 is designed so as to collect, at a predetermined position (on the sensor IS surface), a spherical wave emanating from a predetermined point light source. Where the gap between the first and second objects Q1 and Q2 is denoted by g, then such a point light source is at the position of the imaging point defined by the Fresnel zone Q1, which can be expressed by:

$(x_1, y_1, z_1-g)$

Assuming now that the objects Q1 and Q2 are to be aligned with respect to the x-axis direction and that, upon completion of alignment, the light is focused at a point $P_0 (x_2, Y_2, z_2)$ on the sensor IS surface, then equations regarding a group of curved lines of gratings of a Fresnel zone plate A2 to be provided on the object Q2, can be expressed, in the coordinate system defined hereinbefore, as follows:

$$\sqrt{(x - x_2)^2 + (y - y_2)^2 + z_2^2} - \quad (9)$$

$$\sqrt{(x - x_1)^2 + (y - y_1)^2 + (z_1 - g)^2} =$$

$$\sqrt{x_2^2 + y_2^2 + z_2^2} - \sqrt{x_1^2 + y_1^2 + z_1^2} + m\lambda/2$$

Equation (9) is such an equation that satisfied a condition under which, assuming that the object Q2 is at "$z = -g$" and that the chief ray is such a ray that passes the origin on the object Q1 surface and a point $(0, 0-g)$ on the object Q2 surface and additionally a point $P_0 (x_2, Y_2, z_2)$ on the sensor IS surface, the difference in length between the path of the chief ray and the path of a ray passing the grating $(x, y, -g)$ on the object Q2 surface becomes equal to a multiple, by an integral number, of a half wavelength.

Referring back to FIG. 17, the light focused on the image sensor IS is photoelectrically converted and then is transformed by an analog-to-digital converter AD into a digital signal. Then, through a microprocessor MP, the above-described representative point of the light focused on the sensor IS is detected. In other words, the light intensity detection signals of the picture elements of the image sensor IS are squared and, with regard to the thus obtained signals (i.e. with regard to the squared light intensities) the calculation according to equation (7) is made to determine a representative point.

Control system CT operates to response to the information from the microprocessor MP and instructs through a driver DR the operation amount of the actuator AC so as to move the object Q2 by a suitable amount.

The operation will be explained in detail.

If the optical axis of the physical optic element A2 on the object Q2, to be aligned, is deviated by an amount $\delta$ from the optical axis 0 defined by the physical optic element A1 (which is coincident with the optical axis of the lens L), while retaining a parallel relationship therebetween, the position of the convergent point P' on the image sensor IS is displaced from the position $P_0$ by $\beta \cdot \delta$. The light intensity detection signal regarding the spot on the image sensor has a form which is provided by an inherent spot shape profile of the convergent point P as combined with:

(1) High-order Fraunhofer diffraction image due to the aperture shape of the physical optic elements A1 and A2;

(2) Scattered light and speckle light from the objects 1 and 2; and (3) Electric noise.

With regard to variation component, variable with time, of the electric noise (3), it is possible to remove this by averaging, with time, the data obtained within a certain time and by using the resultant as the detection data. With regard to the stationary component of the electric noise, stationary with time, it is possible to remove the same by predetecting such component and by providing an offset to the output signals for collection of the same.

Figure 45:
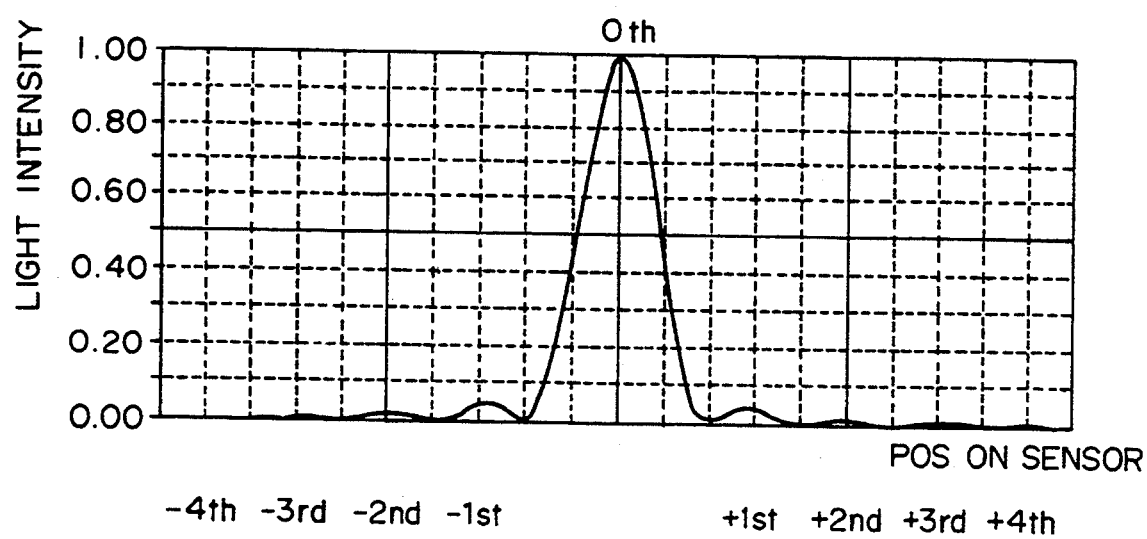
FIG. 45 is a graph showing intensity distribution of Fraunhofer diffraction light.

Further, on the sensor IS, there are produced high-order Fraunhofer diffraction images of the aperture of the physical optic element, about the zero-th order light spot, such as illustrated in FIG. 45. The effect of this will now be explained. Since the size of the image sensor IS is finite, Fraunhofer diffraction images of orders higher than a predetermined order do not lie on the sensor IS. However, if the objects Q1 and Q2, to be aligned, are relatively deviated while retaining a parallel relationship, the spot on the sensor IS is shifted from its original position with a result that the higher-order diffraction image component comes to the sensor IS surface, or such high order component having lying on the sensor IS goes out of the sensor IS surface. Therefore, if the individual positions are averaged in regard to the light intensity throughout the sensor IS surface, it is possible that the detected reference position of the height contains an error.

Figure 46:
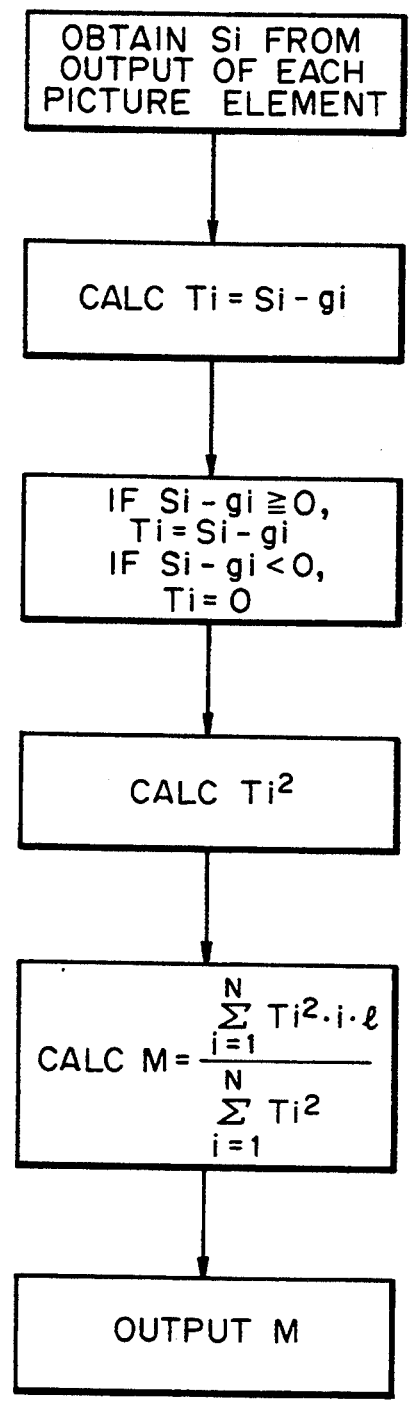
FIG. 46 is a flow chart showing the sequence of signal processing in accordance with the third embodiment of the present invention.

The process for removing an error, more particularly, an error due to the effect of such Fraunhofer diffraction image, is illustrated in the flow chart of FIG. 46. It is to be noted here that the process of FIG. 46 is that to be made for an image sensor IS which comprises a linear image sensor having its picture elements arrayed only in the positional deviation detecting direction (x direction). In the drawing, denoted at N is the total number of the picture elements, at i is the number of each picture element as counted from an end, at l is the pitch of the picture elements of the sensor, at Si is the average light intensity at the i-th picture element, and at gi is the scattered light noise component at the i-th picture element. From the signals of the individual picture elements, an average Si of the light intensity in a certain time period is obtained and, by using Si, the reference position M is determined in accordance with the following equation:

$$M = \left(\sum_{i}^{N} Ti^2 \cdot i \cdot l\right) / \sum_{i}^{N} Ti^2 \qquad (10)$$

wherein $$Ti = Si - gi \quad Si - gi \geq 0$$

$$Ti = 0 \quad Si - gi < 0$$

Here, gi can be determined by memorizing in a memory the sensor output data corresponding to the scattered light component when only the object Q1 is present and similar data when only the object Q2 is present and then by detecting the some of the two data. The resultant provides the scattered light data. In this case, if gi is a constant value (an average value of the total scattered light noise components), as a whole it enhances the signal-to-noise ratio and, therefore, it has an effect of noise component removal. Also, for every picture element, gi is equal to zero, only the Fraunhofer diffraction image is formed on the sensor.

Figure 47:
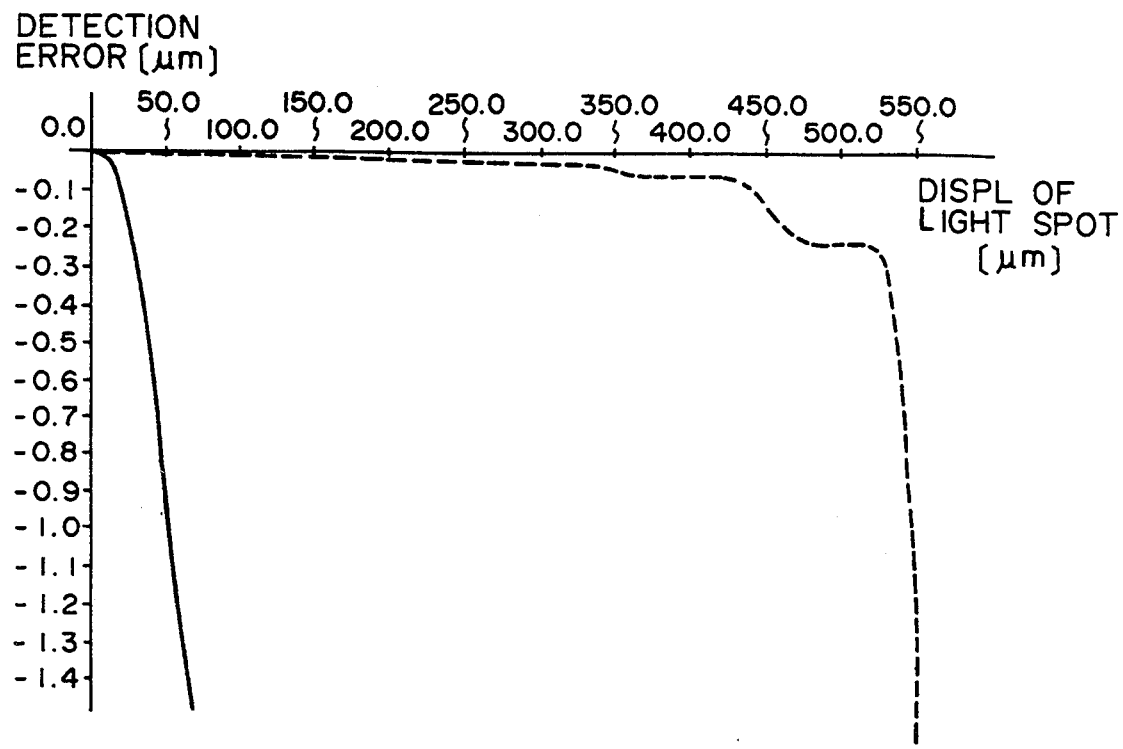
FIG. 47 is a graph showing the relationship between displacement of a light spot and a detection error.

FIG. 47 is a graph showing the results of simulation made of an assumption that the spot shape is the function of $sinC^2$ of $200\mu$ and that detection of a representative point is made by using a linear image sensor having a pitch of 30 microns $\times$ 40. In this graph, the positional deviation $\beta \cdot \delta$ of the light spot on the sensor is depicted in the axis of abscissa, and the errors caused in the detection of the representative point in accordance with the squaring calculation of the present embodiment (broken line) and the errors causes by ordinary gravity center detection (solid line), both with respect to a reference displacement $\beta \cdot \delta$, are illustrated. It is seen in FIG. 47 that the error in the detection of the spot displacement comes not more than 0.1 micron when deviation of the spot displacement is 20 microns in the case of the gravity center detecting method whereas it is 440 microns (about twenty times larger) in the case of detection according to the squaring calculation. From this, it is confirmed that the device of the present embodiment assures high-precision detection of the positional relationship, over a wide range.

If the image sensor IS comprises a two-dimensional image sensor, the square calculation may be made with $Ai=1$, $\alpha i=2$ in equation (7). It will be understood that $\alpha i$ is not limited to "2", but it may be equal to n which is an arbitrary constant. Namely, substantially the same advantageous effects are obtainable by detecting the position of the gravity center of n-multiple value of the light intensity.

Figure 48:
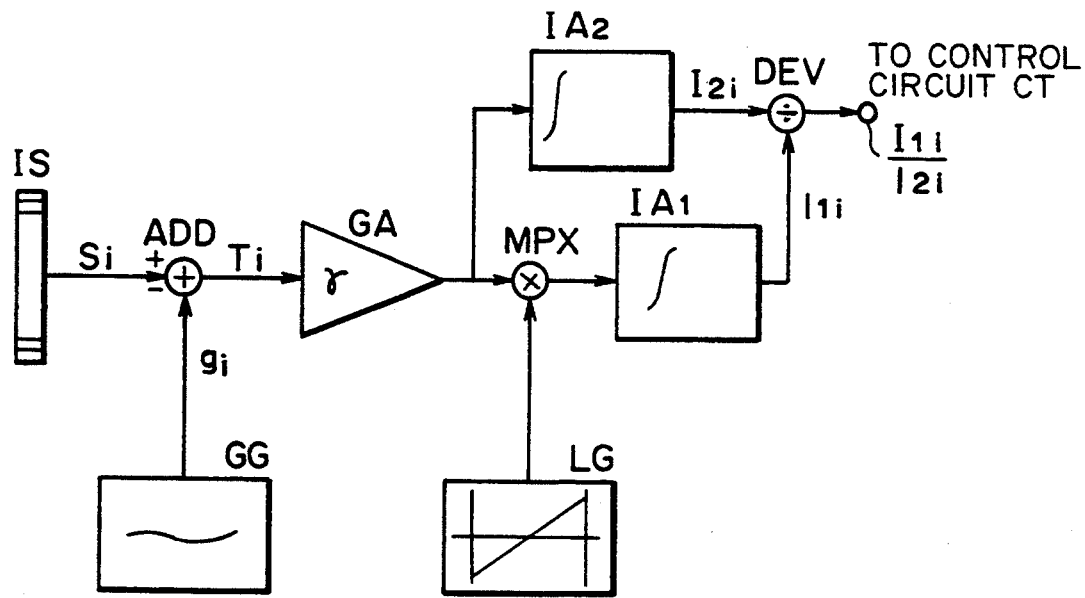
FIG. 48 is a schematic and diagrammatic view of a major part of a twentyth embodiment of the present invention.

FIG. 48 shows a further embodiment of the present invention. In this embodiment, the structure of the FIG. 43 embodiment is modified in respect to the image sensor IS, the analog-to-digital converter AD and the microprocessor MP. The remaining part of the present embodiment is similar to that of the FIG. 43 embodiment, and are not illustrated in FIG. 48.

In FIG. 48, denoted at GG is a gi-wave generator; at ADD is an adder; at GA is a gamma amplifier; at $IA_1$ and $IA_2$ are integrators; at MPX is a multiplier; at LG is a saw-tooth wave generator: and DEV is a divider.

As compared with the FIG. 43 embodiment which executes digital signal processing, the present embodiment executes the analog signal processing.

In FIG. 48, the light focused on the image sensor IS is photoelectrically converted, whereby a sensor output Si (analog signal) is produced. The output Si of the image sensor IS is not subjected to the analog-to-digital conversion but, by means of the other ADD, it is directly subjected to the subtraction with the analog signal gi of the scattered light noise component corresponding to the picture element number i of the image sensor as outputted from the gi wave generator GG, whereby it is transformed into an analog signal Ti ($=Si-gi$). Then, signal Ti is squared, for example, by the gamma amplifier GA, and is amplified by an output signal of the saw-tooth wave generator LG corresponding to the picture element number of the image sensor. Additionally, it is integrated by the integrator $IA_1$ ($I_{1i}$), integrating in a timed relationship with the scan of the image sensor IS. Simultaneously therewith, the output of the gamma amplifier is integrated ($I_{2i}$) by the integrator $IA_2$. The outputs of these integrators are applied to the divider DEV, whereby $I_{1i}/I_{2i}$ is calculated. The output of the divider DEV representing the average position as obtained by averaging the positions of the individual points in respect to the squared light intensity, is supplied to the control circuit CT.

While the operation is different in accordance with the difference between the digital processing and the analog processing, the major part thereof is the same as that of the FIG. 43 embodiment. Therefore, description thereof will be omitted here.

It is to be noted that the applicability of the present invention is not limited to an alignment mechanism in a semiconductor device manufacturing apparatus. For example, the invention is applicable to the alignment in the hologram element setting, at the time of exposure reproduction of hologram, alignment in multi-color printing machine, the alignment in a bonding process of semiconductor chips, alignment process in an inspecting device for a print board and circuit, alignment at the adjustment of optical components or optical measuring system, interval measurement and so on.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting a relative positional relationship between first and second objects, said device comprising:
   light source means for projecting light to illuminate the first and second objects;
   photodetecting means for detecting an intensity distribution of light from one of the first and second objects illuminated by said light source means, said photodetecting means having a light receiving surface and comprising means for producing a signal corresponding to the light intensity at each point on said light receiving surface; and
   position detecting means for detecting the relative position of the first and second objects, on the basis of the signals produced by said photodetecting means, wherein said position detecting means comprises means for adjusting signals corresponding to different points on said light receiving surface of said photodetecting means, by using different weight coefficients, and means for detecting the relative position of the first and second objects on the basis of the adjusted signals.

2. A device for detecting a relative positional relationship between first and second objects, said device comprising:
   light source means for projecting light to illuminate the first and second objects;
   photodetecting means for detecting an intensity distribution of light from one of the first and second objects illuminated by said light source means, said photodetecting means having a light receiving surface; and
   position detecting means for detecting the relative position of the first and second objects on the basis of a signal from said photodetecting means, wherein said position detecting means comprises means for first detecting the position of a center of gravity of a distribution obtained by multiplying the light intensity at each point on said light receiving surface by a coefficient corresponding to the light intensity at that point, and means for then detecting the relative position of the first and second objects on the basis of the detected position of the center of gravity.

3. A method of detecting a gravity center position of an intensity distribution of a radiation beam, comprising the steps of:
   producing a plurality of data each related to the intensity distribution of the radiation beam;
   calculating the n-th power of each data value, wherein n is a number not less than two; and
   processing the results of said calculating step to determine the gravity center position of the intensity distribution of the radiation beam.

4. In a method of detecting a position of an object wherein a radiation beam from the object is projected on a plane and the position of the object is detected on the basis of a gravity center position of an intensity distribution of the radiation beam on that plane, the improvement comprising the steps of:
   producing a plurality of data each related to the intensity distribution of the radiation beam;
   calculating the n-th power of each data value, wherein n is a number not less than two; and
   processing the results of said calculating step to determine the gravity center position of the intensity distribution of the radiation beam.

5. In a semiconductor device manufacturing method wherein the position of a wafer is detected and, after alignment of the water based on the detection, a circuit pattern is printed on the water, the improvement comprising the steps of:
   projecting a detection beam to the water;
   producing a plurality of data each related to an intensity distribution, on a predetermined plane, of the detection beam reflected by the water;
   calculating the n-th power of each data value, wherein n is a number not less than two;
   processing the results of said calculating step to determine the gravity center position of the intensity distribution of the detection beams; and
   determining the position of the water on the basis of the determined gravity center position.

6. A method according to claim 5, further comprising, for the alignment, adjusting the relative position of the wafer relative to a mask having an original of the circuit pattern, on the basis the determined position of the water.

7. A method of detecting a gravity center position of an intensity distribution of a radiation beam, comprising the steps of:
   producing a plurality of data each related to the intensity distribution of the radiation beam;
   extracting particular ones of the plurality of data, while using a predetermined portion of the intensity distribution as a reference; and
   processing the extracted particular ones of the plurality of data to determine a gravity center position in a limited zone of the intensity distribution.

8. A method according to claim 7, wherein the portion of the intensity distribution used as a reference comprises a peak of the intensity distribution.

9. A method according to claim 7, wherein the portion of the intensity distribution used as a reference comprises the gravity center position of the intensity distribution.

10. A method according to claim 7, wherein said extracting step comprises multiplying the particular ones of the plurality of data by one and multiplying the remaining ones by zero.

11. A method of determining a gravity center position of a radiation beam, comprising the steps of:
   producing a plurality of data each related to the intensity distribution of the radiation beam;
   processing the plurality of data by using a function representing a weight coefficient by which each of the plurality of data is to be multiplied; and determining the gravity center position of the radiation beam, on the basis of particular ones of the processed plurality of data.

12. A method according to claim 11, wherein said processing step comprises extracting particular ones of the plurality of data by using a predetermined portion of the intensity distribution as a reference.

13. A method according to claim 12, wherein the portion of the intensity distribution used as a reference comprises a peak of the intensity distribution.

14. A method according to claim 12, wherein the portion of the intensity distribution used as a reference comprises the gravity center position of the intensity distribution.

15. A method according to claim 12, wherein the function used in said processing step comprises a rectangular window function.

16. A method according to claim 12, wherein the function used in said processing step comprises a triangular window function.

17. A method according to claim 12, wherein the function used in said processing step comprises a trapezoidal window function.

18. In a method of detecting a position of an object wherein a radiation beam from the object is projected on a predetermined plane and wherein the position of the object is determined on the basis of a gravity center position, on the predetermined plane, of an intensity distribution of the radiation beam, the improvement comprising the steps of:
    producing a plurality of data each related to the intensity distribution of the radiation beam;
    extracting particular ones of the plurality of data, while using a predetermined portion of the intensity distribution as a reference; and
    processing the particular ones of the plurality of data extracted in said extracting step to determine a gravity center position in a limited zone of the intensity distribution.

19. In a method of detecting a position of an object, wherein a radiation beam from the object is projected on a predetermined plane and the position of the object is determined on the basis of a gravity center position, on the predetermined plane, of an intensity distribution of the radiation beam, the improvement comprising the steps of:
    producing a plurality of data each related to the intensity distribution of the radiation beam;
    processing the plurality of data by using a function representing a weight coefficient by which each of the plurality of data is to be multiplied; and
    determining the gravity center position of the radiation beam, on the basis of particular ones of the processed plurality of data.

20. In a semiconductor device manufacturing method, wherein a position of a wafer is detected and, after alignment of the wafer based on the detection, a circuit pattern is printed on the wafer, the improvement comprising the steps of:
    projecting a detection beam to the wafer;
    producing a plurality of data each related to an intensity distribution, on a plane, of the detection beam reflected by the wafer;
    processing the plurality of data by using a function representing a weight coefficient by which each of the plurality of data is to be multiplied;
    determining the gravity center position of the detection beam, on the basis of particular ones of the processed plurality of data; and
    determining the position of the wafer on the basis of the determined gravity center position.

21. In a semiconductor device manufacturing method, wherein a position of a wafer is detected and, after alignment of the wafer, a circuit pattern of the water is printed on the wafer, the improvement comprising the steps of:
    projecting a detection beam to the wafer;
    producing a plurality of data each related to an intensity distribution, on a plane, of the detection beam reflected by the wafer;
    extracting particular ones of the plurality of data, while using a predetermined portion of the intensity distribution as a reference:
    processing the extracted particular ones of the plurality of data to determine a gravity center position in a limited zone of the intensity distribution; and
    determining the position of the wafer on the basis of the determined gravity center position.

22. A method of detecting a gravity center position of an intensity distribution of a radiation beam, comprising the steps of:
    producing a plurality of data each related to the intensity distribution of the radiation beam;
    extracting particular ones of the plurality of data; and
    processing the extracted particular ones of the plurality of data to determine a gravity center position in a limited zone of the intensity distribution.

23. In a method of detecting a position of an object wherein a radiation beam from the object is projected on a predetermined plane and wherein the position of the object is determined on the basis of a gravity center position, on the predetermined plane, of an intensity distribution of the radiation beam, the improvement comprising the steps of:
    producing a plurality of data each related to the intensity distribution of the radiation beam;
    extracting particular ones of the plurality of data; and
    processing the particular ones of the plurality of data extracted in said extracting step to determine a gravity center position in a limited zone of the intensity distribution.

24. In a semiconductor device manufacturing method, wherein a position of a wafer is detected and, after alignment of the water, a circuit pattern of the wafer is printed on the wafer, the improvement comprising the steps of:
    projecting a detection beam to the wafer;
    producing a plurality of data each related to an intensity distribution, on a plane, of the detection beam reflected by the wafer;
    extracting particular ones of the plurality of data;
    processing the extracted particular ones of the plurality of data to determine a gravity center position in a limited zone of the intensity distribution; and
    determining the position of the wafer on the basis of the determined gravity center position.

* * * * *

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

On title page, item [56];

UNDER "U.S. PATENT DOCUMENTS":

"4,780,617 10/1988 Unatate et al." should read
--4,780,617 10/1988 Umatate et al.--; and
"4,894,790 1/1990 Yotsuga et al.-- should read
--4,894,790 1/1990 Yotsuya et al.--.

IN THE ABSTRACT:

Line 3, "light" (first occurrence) should read
--a light--;
Line 4, "photodetecting" should read
--a photodetecting--;
Line 6, "source system," should read --source,--; and
Line 9, "position" should read --a position--.

IN THE DRAWINGS:

In Fig. 36B, "REFLESH" (both occurrences) should read --REFRESH--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 1:

Line 25, "position" should read --a position--;
    Line 36, "in" should read --with--;
    Line 41, "higher" should read --a higher--; and
    Line 63, "a" (first occurrence) should be deleted.

COLUMN 2:

Line 49, "Namely, a" should read --Namely, when a--;
    Line 53, "used" should be deleted; and
    Line 54, "grating." should read --grating used.--.

COLUMN 3:

Line 25, "a" should be deleted;
    Line 37, "the above of" should read --above--; and
    Line 58, "used sensor" should read --sensor used--.

COLUMN 4:

Line 67, "shows" should read --show--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 5:

Line 4, "optical" should read --an optical--;
Line 11, "intensity" should read --an intensity--;
Line 19, "twentyth" should read --twentieth--;
Line 25, "a" should be deleted;
Line 30, "Signal" should read --A signal--; and
Line 67, "Po" should read --$\mathcal{P}_0$--.

COLUMN 6:

Line 2, "P$_{-1}$" should read --$\mathcal{P}_{-1}$--;
Line 18, "distribution" should read --a distribution--;
Line 20, "side" should read --a side--;
Line 24, "particular" should read --a particular--;
Line 37, "line 1$i$" should read --line $i$--;
Line 40, "at" should be deleted;
Line 41, "projected is" should read --projected line is--; and
Line 50, "FIG. 5," should read --FIGS. 5A and 5B--.

COLUMN 7:

Line 10, "it" should be deleted;
Line 21, "( is unit" should read --($Z$ is unit--;
Line 47, "FIG. 6" should read --FIGS. 6A and 6B--; and
Line 60, "higher" should read --a higher--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 8:

Line 64, "displaces" should read --displace--;
Line 65, "relatively" should read --relative--; and
Line 67, "In" should read --On--.

COLUMN 9:

Line 9, "is" should read --are--;
Line 35, "within" should read --with--.

COLUMN 10:

Line 13, "a" (2nd occurrence) should read --an--;
Line 48, "plane" should read --the plane--;
Line 61, "by reflected" should read --by being reflected--; and
Line 62, "high" should read --a high--.

COLUMN 11:

Line 8, "in" should read --with--;
Line 17, "plane which include" should read --a plane which includes--;
Line 22, "extending" should read --extending on--;
Line 49, "of" should read --of a--; and
Line 50, "descried" should read --described--.

UNITED STATES PATENT AND TRADEMARK OFFICE
CERTIFICATE OF CORRECTION

PATENT NO. : 5,340,992   Page 5 of 15
DATED : August 23, 1994
INVENTOR(S) : Masakazu MATSUGU, et al.

It is certified that error appears in the above-indentified patent and that said Letters Patent is hereby corrected as shown below:

COLUMN 12:

Line 5, "shows" should read --show--;
    Line 7, "the" should be deleted; and
    Line 25, "in" should read --on--.

COLUMN 13:

Line 33, "distance" should read --distance of--.

COLUMN 14:

Line 11, "is" should read --are--;
    Line 16, "in" should read --on--;
    Line 17, "where" should read --when--;
    Line 32, "$Y_1$," should read --$y_1$,--;
    Line 49, "$Y_1$," should read --$y_1$,--; and
    Line 56, "$Y_1$," should read --$y_1$,--.

COLUMN 15:

Line 27, "nunsher," should read --number,--; and
    Line 53, "electron" should read --an electron--.

COLUMN 16:

Line 9, "shift" should read --a shift--;
    Line 10, "effective" should read --an effective--; and
    Line 22, "is" should read --are--.

UNITED STATES PATENT AND TRADEMARK OFFICE
CERTIFICATE OF CORRECTION

PATENT NO. : 5,340,992  
DATED : August 23, 1994  
INVENTOR(S) : Masakazu MATSUGU, et al.

It is certified that error appears in the above-indentified patent and that said Letters Patent is hereby corrected as shown below:

COLUMN 17:

Line 7, "degree" should read --degrees--; and  
    Line 47, "center" should read --the center--.

COLUMN 18:

Line 10, "center" should read --the center--;  
    Line 27, "pass" should read --passes--; and  
    Line 39, "in" should read --with-- and "center" should read --the center--.

COLUMN 19:

Line 47, "a" should be deleted;  
    Line 48, "a" should be deleted;  
    Line 49, "a" should be deleted; and  
    Line 67, "shift" should read --a shift--.

COLUMN 20:

Line 14, "z-axis," should read --the z-axis,--;  
    Line 20, "degree," should read --degrees,; and  
    Line 43, "the" should be deleted.

UNITED STATES PATENT AND TRADEMARK OFFICE
CERTIFICATE OF CORRECTION

PATENT NO. : 5,340,992

DATED : August 23, 1994

INVENTOR(S) : Masakazu MATSUGU, et al.

It is certified that error appears in the above-indentified patent and that said Letters Patent is hereby corrected as shown below:

COLUMN 21:

Line 32, "In" should read --On--;
    Line 34, "broken" should read --a broken--;
    Line 49, "illustrated." should read --illustrated one.--; and
    Line 50, "is" should read --are--.

COLUMN 22:

Line 22, "the" should be deleted;
    Line 50, "FIG. 22 is a schematic representation," should read --FIGS. 22(a) through 22(d) are schematic representations--; and
    Line 57, "FIG. 22" should read --these figures--.

Figures 23A, 23B, 23C, 23D:
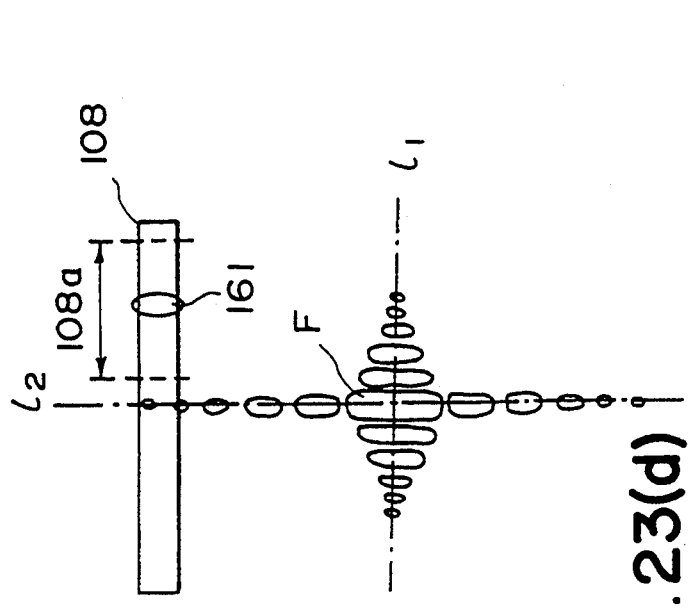
FIG. 23A-23D are explanatory views of a major portion of an eleventh embodiment of the present invention.

COLUMN 24:

Line 4, "In" should read --On--;
    Line 13, "Such" should read --Such a--;
    Line 17, "such" should read --such a--;
    Line 28, "in" should read --on--;
    Line 40, "re-" should be deleted;
    Line 41, "ache" should read --reach--;
    Line 45, "FIG. 23 is a schematic representation," should read --FIGS. 23(a) through 23(d) are schematic representations--;
    Line 53, "FIG. 22" should read --FIGS. 22(a) through 22(d)--; and
    Line 55, "plate 104" should read --plates 104--.

UNITED STATES PATENT AND TRADEMARK OFFICE
CERTIFICATE OF CORRECTION

PATENT NO. : 5,340,992

DATED : August 23, 1994

INVENTOR(S) : Masakazu MATSUGU, et al.

It is certified that error appears in the above-indentified patent and that said Letters Patent is hereby corrected as shown below:

COLUMN 25:

Line 1, "FIG. 24 is a schematic representation," should read --FIGS. 24(a) through 24(d) are schematic representations--;
Line 8, "FIG. 23" should read --FIGS. 23(a) through 23(d)--;
Line 25, "FIG. 25 is a schematic representation," should read --FIGS. 25(a) through 25(d) are schematic representations--;
Line 32, "FIG. 24" should read --FIGS. 24(a) through 24(d)--; and
Line 66, "angle" should read --angle of--.

COLUMN 26:

Line 5, "the" should be deleted;
Line 18, "FIG. 27D is an illustration" should read --FIGS. $27D_1$ and $27D_2$ are--; and
Line 59, "z axis," should read --the z axis,--.

COLUMN 27:

Line 21, "the" should be deleted;
Line 64, "on," should read --on--; and
Line 65, "Output" should read --An output--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 28:

Line 27, "10<a<80" should read --10<α<80--;
    Line 34, "transmissibly" should read --transmissively--;
    Line 40, "in" should read --with--;
    Line 44, "relatively" should read --relative--; and
    Line 48, "causes" should read --causes a--.

COLUMN 29:

Line 14, "center" should read --the center--; and
    Line 20, "in" should read --with--.

COLUMN 30:

Line 24, "in to" should read --into--; and
    Line 67, "interval 30" should read --interval of 30--.

COLUMN 31:

Line 3, "val 30" should read --val of 30--; and
    Line 68, "Light" should read --A light--.

COLUMN 32:

Line 35, "is" should read --are--;
    Line 46, "in" should read --with--; and
    Line 61, "in" should read --with--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 33:

Line 33, "In" should read --On--;
    Line 36, "as of" should read --as that of--; and
    Line 50, "incidence" should read --incident--.

COLUMN 35:

Line 19, "such" should read --such a--;
    Line 35, "wind" should read --window--;
    Line 46, "as of" should read --as that of--; and
    Line 61, "element" should read --elements--.

COLUMN 36:

Line 2, "in" should read --with--;
    Line 7, "ray as of" should read --way as that of--; and
    Line 64, "sensor" should read --sensors--.

COLUMN 37:

Line 17, "in" should read --with--; and
    Line 65, "such" should read --such a--.

COLUMN 38:

Line 37, "element" should read --elements--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 39:

Line 34, "such" should read --such a--.

COLUMN 40:

Line 12, "start" should read --a start--; and
Following line 31, the following should be inserted:
¶ Figures 38 and 39 show the shift range of deviation signal light $237_1$ and the shift range of gap signal light (deviation signal light) $237_2$.--.

COLUMN 41:

Line 8, "an" (1st occurrence) should read --to--;
Line 15, "such" should read --such a--;
Line 33, "in" should read --with--; and
Line 42, "a" should read --an--.

COLUMN 42:

Line 2, "transmissibly" should read --transmissively--;
Line 36, "missibly" should read --missively--;
Line 45, "tance 30" should read --tance of 30--;
Line 46, "transmissibly" should read --transmissively--; and
Line 54, "of" (first occurrence) should read --of a--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 43:

Line 4, "transmissibly" should read --transmissively--.

COLUMN 44:

Line 22, "cause" should read --cause a--;
    Line 32, "relatively" should read --relative--;
    Line 35, "relatively" should read --relative--;
    Line 46, "in" should read --with--; and
    Line 62, "sensor," should read --sensor--.

COLUMN 45:

Line 4, "as" should read --as a--;
    Line 31, "plumyicon" should read --plumvicon--;
    Line 37, "in" should read --with--; and
    Line 48, "is natural" should read --is a natural--.

COLUMN 46:

Line 1, "at" should read --at a--;
    Line 2, "noise" should read --a noise--; and
    Line 5, "cent" should read --cent to--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 47:

Line 9, "Such" should read --Such a--;
Line 16, "in" should read --on--;
Line 17, "where" should read --when--; and
Line 32, "tranmissibly" should read --transmissively--.

COLUMN 48:

Line 6, "$Y_2$," should read --$y_2$,--;
Line 20, "satisfied" should read --satisfies--;
Line 42, "response" should read --respond--; and
Line 66, "to" should read --to a--.

COLUMN 49:

Line 4, "such" should read --such a--;
Line 18, "such" should read --such a-- and "having" should be deleted;
Line 20, "in" should read --with--;
Line 25, "such" should read --such a--;
Line 56, "some" should read --sum--; and
Line 64, "of" should read --of a--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

COLUMN 50:

Line 5, "causes" should read --caused--;
Line 23, "value" should read --values--;
Line 27, "in" should read --with--;
Line 31, "are" should read --is--; and
Line 62, "in" should read --with--.

COLUMN 51:

Line 6, "of" should read --of a-- and "in" should read --in a--;
Line 8, "alignment" should read --an alignment--;
Line 9, "at" should read --for--; and
Line 10, "optical" should read --an optical--.

COLUMN 52:

Line 21, "water" should read --wafer--;
Line 22, "water," should read --wafer,--;
Line 24, "water;" should read --wafer;--;
Line 27, "water;" should read --wafer;--;
Line 33, "water" should read --wafer--;
Line 38, "basis the" should read --basis of the--; and
Line 39, "water." should read --wafer.--.

UNITED STATES PATENT AND TRADEMARK OFFICE
CERTIFICATE OF CORRECTION

PATENT NO. : 5,340,992
DATED : August 23, 1994
INVENTOR(S) : Masakazu MATSUGU, et al.

It is certified that error appears in the above-indentified patent and that said Letters Patent is hereby corrected as shown below:

<u>COLUMN 54</u>:

Line 11, "of the" (second occurrence) should be deleted;
Line 12, "water" should be deleted;
Line 20, "reference:" should read --reference;--; and
Line 51, "water," should read --wafer,--.

Signed and Sealed this

Twenty-fifth Day of April, 1995

Attest:

BRUCE LEHMAN

Attesting Officer     Commissioner of Patents and Trademarks